United States Patent
Hwang et al.

(10) Patent No.: US 10,804,363 B2
(45) Date of Patent: Oct. 13, 2020

(54) THREE-DIMENSIONAL SEMICONDUCTOR MEMORY DEVICE AND METHOD OF FABRICATING THE SAME

(71) Applicant: Samsung Electronics Co., Ltd., Suwon-si, Gyeonggi-do (KR)

(72) Inventors: Sung-Min Hwang, Hwaseong-si (KR); Joon-Sung Lim, Seongnam-si (KR); Jiyoung Kim, Hwaseong-si (KR); Jiwon Kim, Seoul (KR); Woosung Yang, Gwangmyeong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/445,815

(22) Filed: Jun. 19, 2019

(65) Prior Publication Data

US 2020/0144380 A1    May 7, 2020

(30) Foreign Application Priority Data

Nov. 2, 2018 (KR) .......................... 10-2018-0133773

(51) Int. Cl.
| | |
|---|---|
| *H01L 29/417* | (2006.01) |
| *H01L 27/11582* | (2017.01) |
| *H01L 27/11556* | (2017.01) |

(52) U.S. Cl.
CPC .. *H01L 29/41741* (2013.01); *H01L 27/11556* (2013.01); *H01L 27/11582* (2013.01)

(58) Field of Classification Search
CPC ......... H01L 29/41741; H01L 27/11556; H01L 27/11582

USPC ......................................................... 257/314
See application file for complete search history.

(56) References Cited

U.S. PATENT DOCUMENTS

| | | | |
|---|---|---|---|
| 7,539,056 B2 | 5/2009 | Katsumata et al. | |
| 8,581,323 B2 | 11/2013 | Uenaka et al. | |
| 8,592,912 B2 | 11/2013 | Hwang et al. | |
| 8,704,288 B2 | 4/2014 | Lee et al. | |
| 8,928,149 B2 | 1/2015 | Chen | |
| 9,171,859 B2 | 10/2015 | Oh et al. | |
| 9,224,751 B2 | 12/2015 | Hyun et al. | |
| 9,230,904 B2 | 1/2016 | Eun et al. | |
| 9,524,903 B2 | 12/2016 | Lee | |
| 9,583,504 B2 * | 2/2017 | Higuchi | ........... H01L 27/11582 |
| 9,865,540 B2 | 1/2018 | Kim et al. | |
| 9,911,753 B2 | 3/2018 | Kitamura et al. | |

(Continued)

*Primary Examiner* — Tu-Tu V Ho
(74) *Attorney, Agent, or Firm* — Harness, Dickey & Pierce, P.L.C.

(57) ABSTRACT

Disclosed are three-dimensional semiconductor memory devices and methods of fabricating the same. The three-dimensional semiconductor memory device comprises a substrate that includes a cell array region and a connection region, an electrode structure that includes a plurality of electrodes and a plurality of dielectric layers alternately stacked on the substrate and has a stepwise structure on the connection region, an etch stop pattern that covers the stepwise structure of the electrode structure. The electrode structure and the etch stop pattern extend in a first direction when viewed in plan. The electrode structure has a first width in a second direction intersecting the first direction. The etch stop pattern has a second width in the second direction. The second width is less than the first direction.

20 Claims, 63 Drawing Sheets

(56) References Cited

U.S. PATENT DOCUMENTS

2015/0214103 A1 7/2015 Matsuda
2017/0294384 A1 10/2017 Chen
2017/0338240 A1 11/2017 Nogami et al.

* cited by examiner

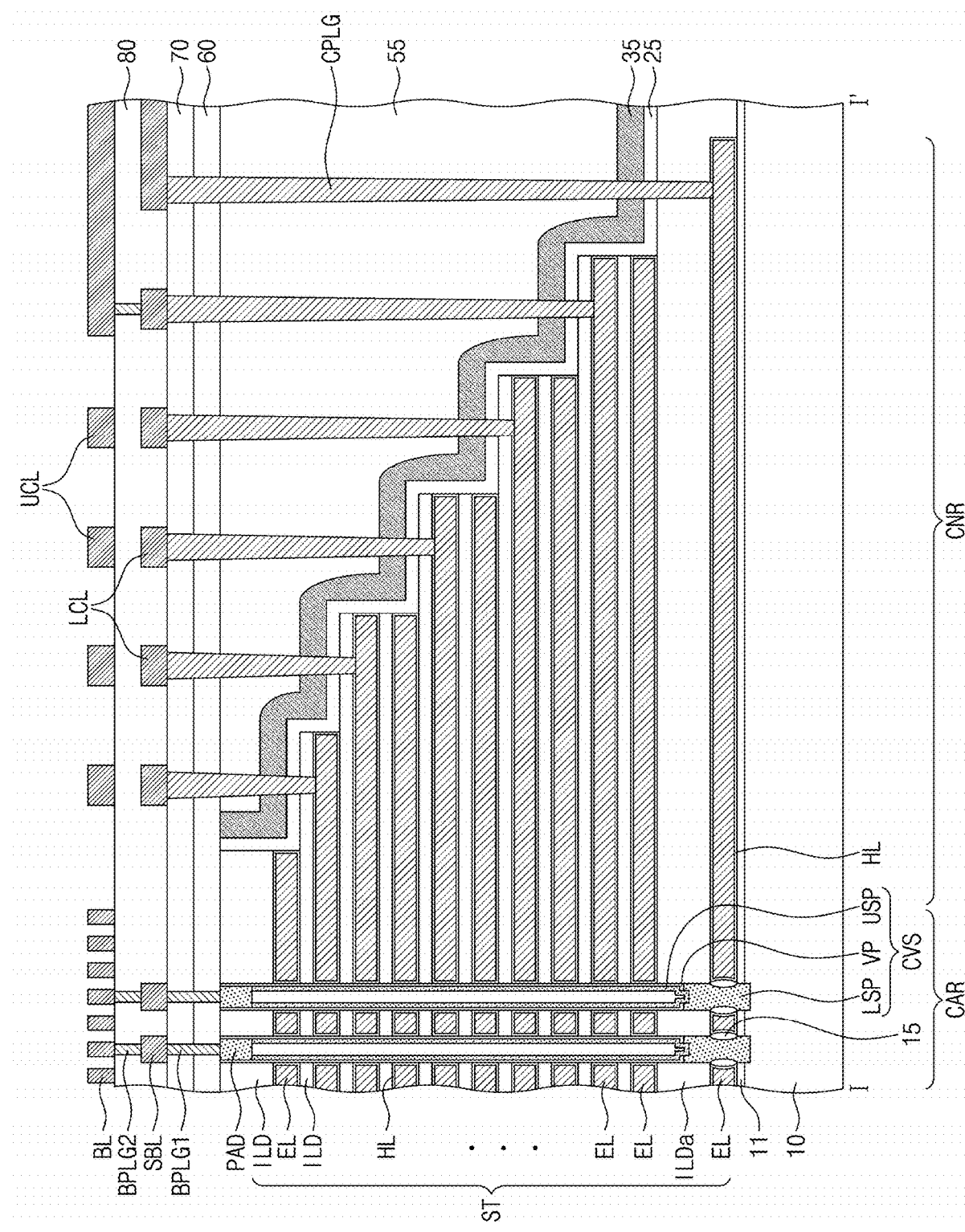

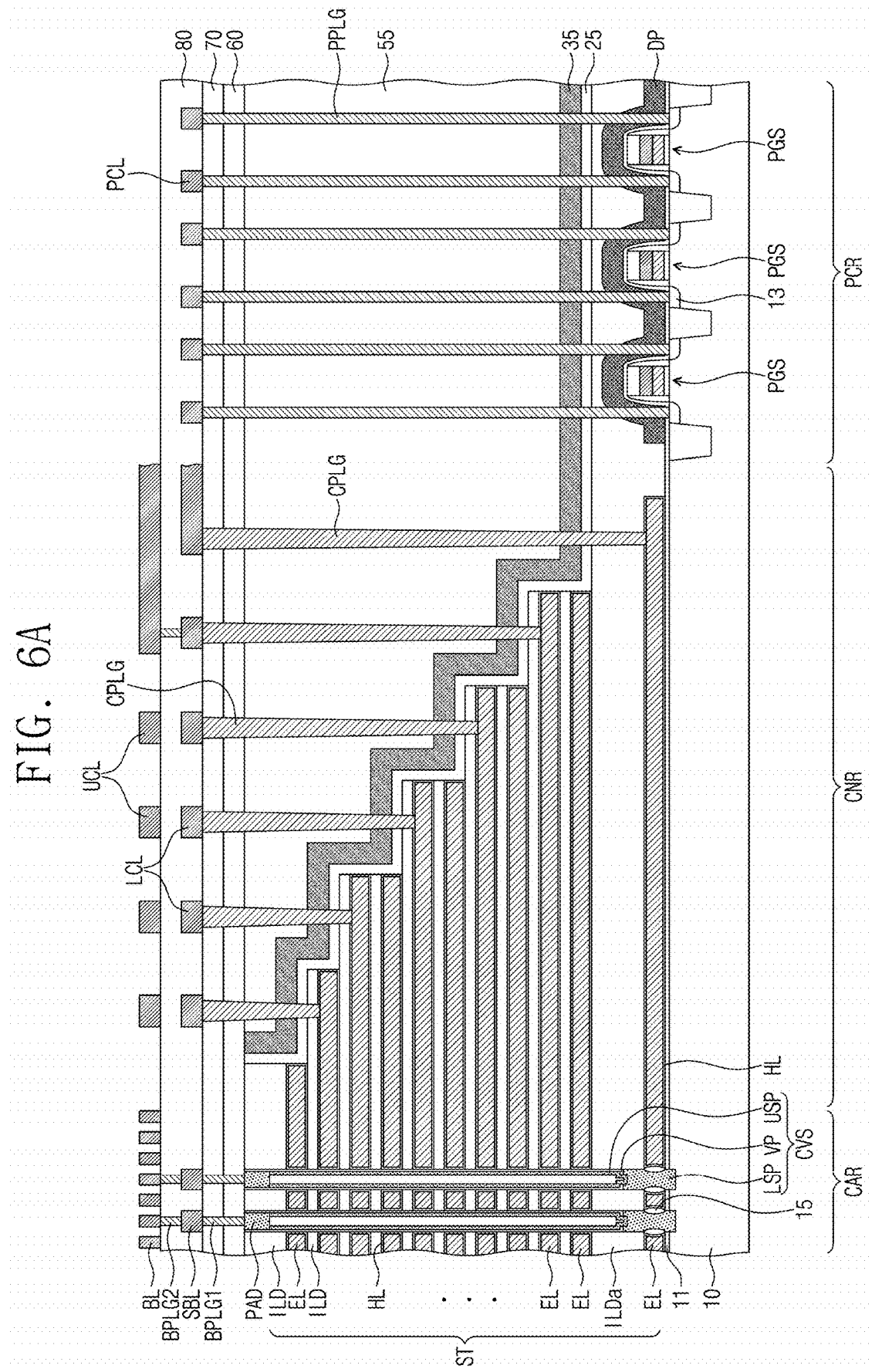

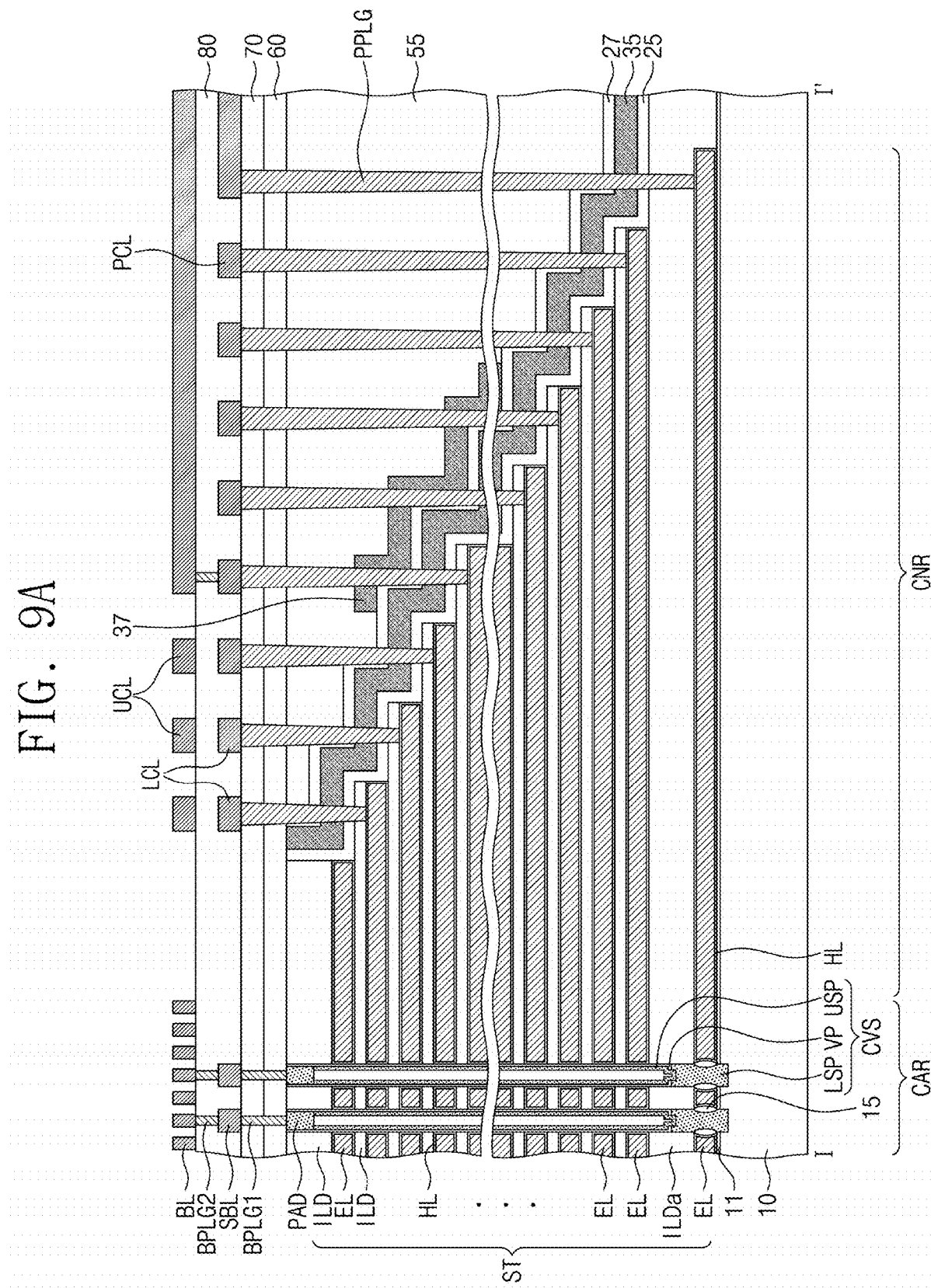

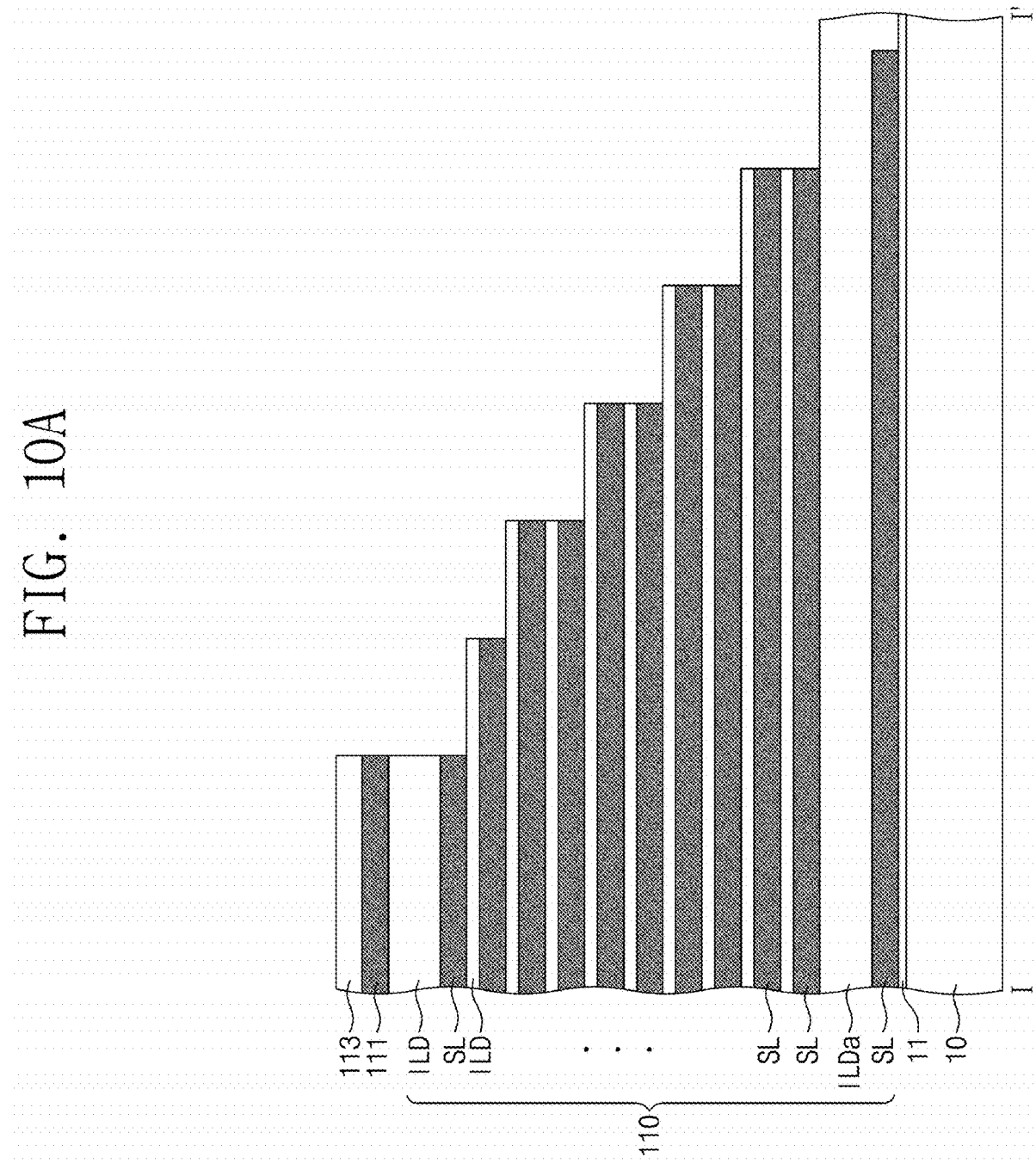

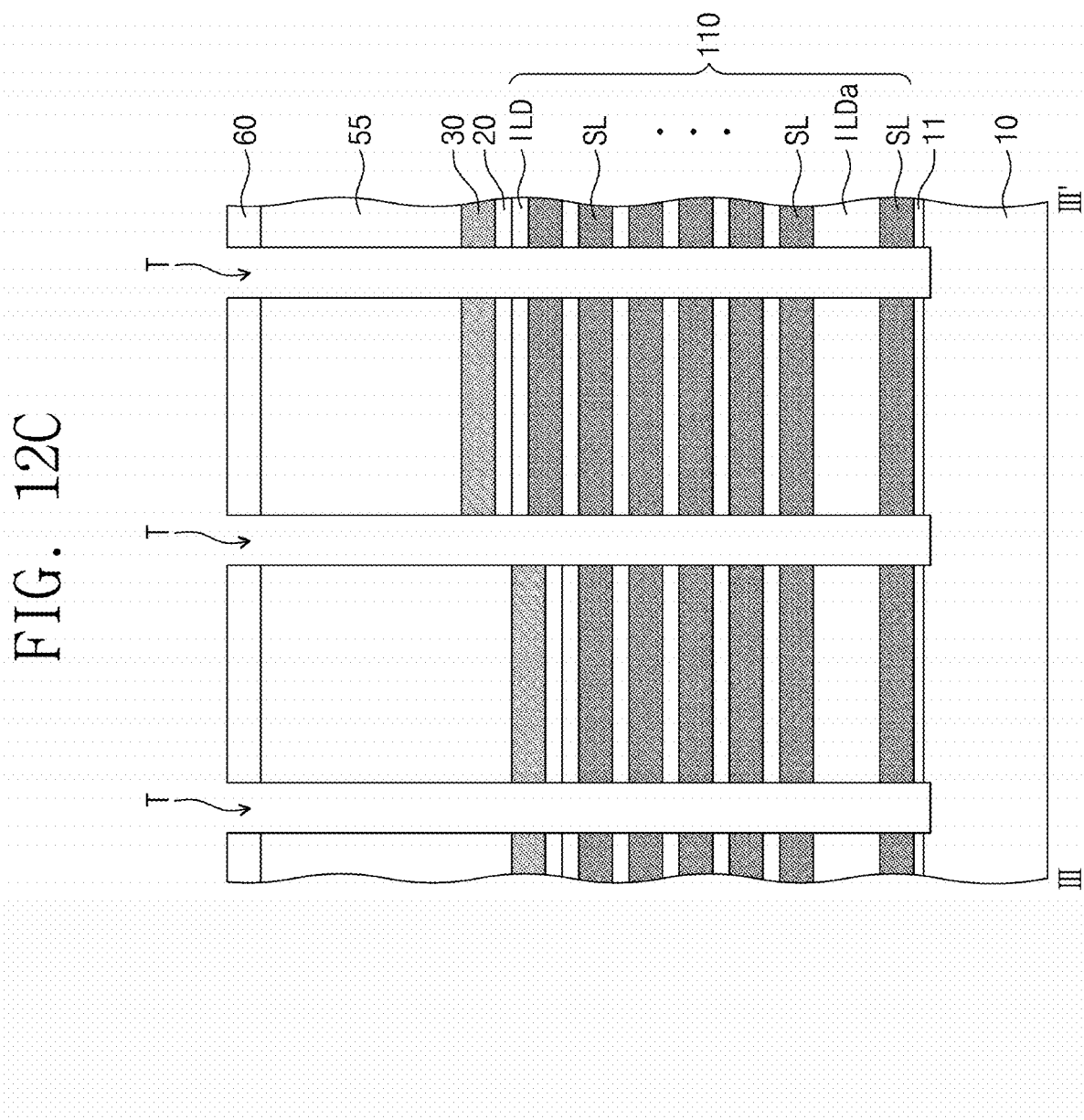

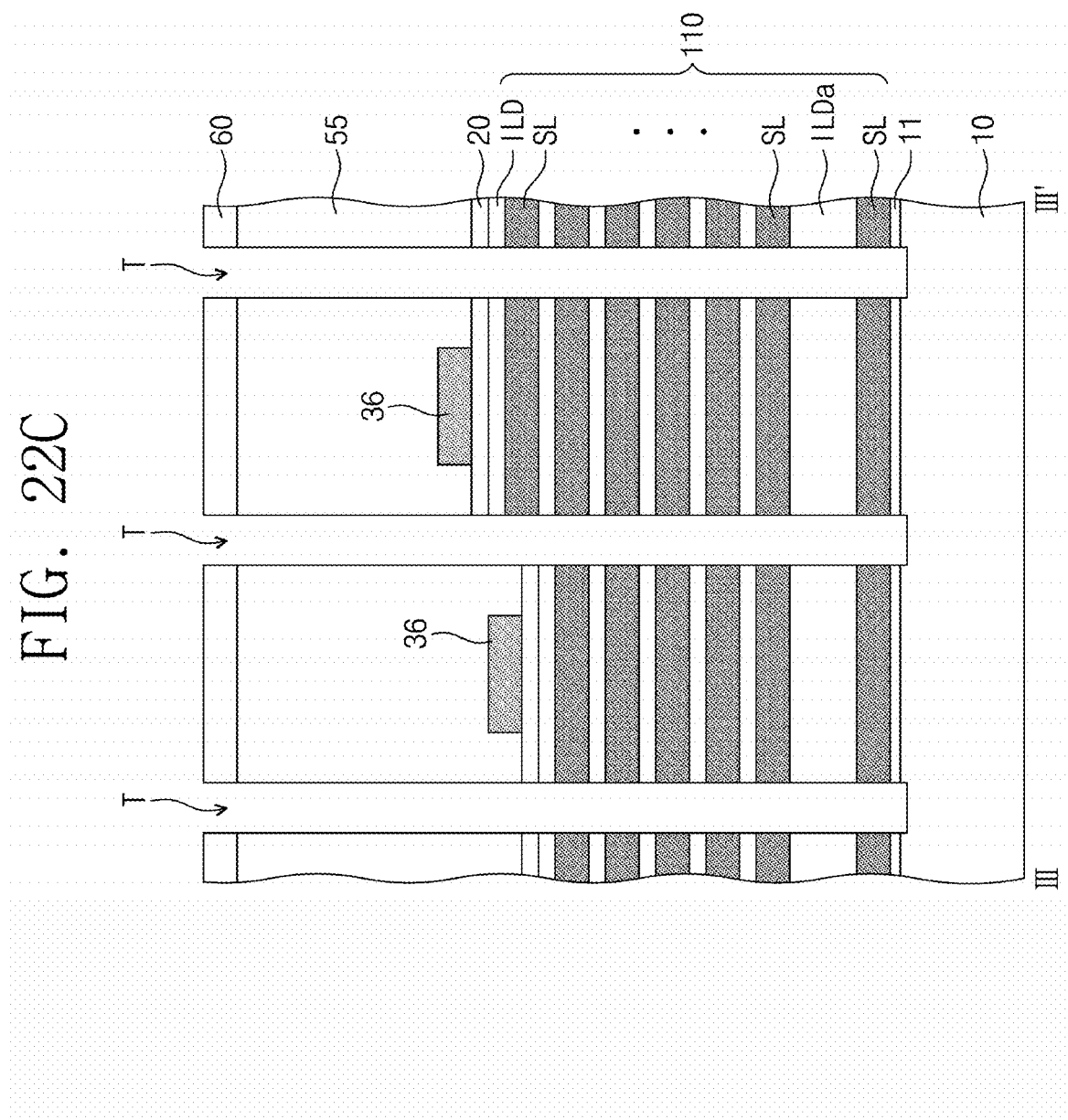

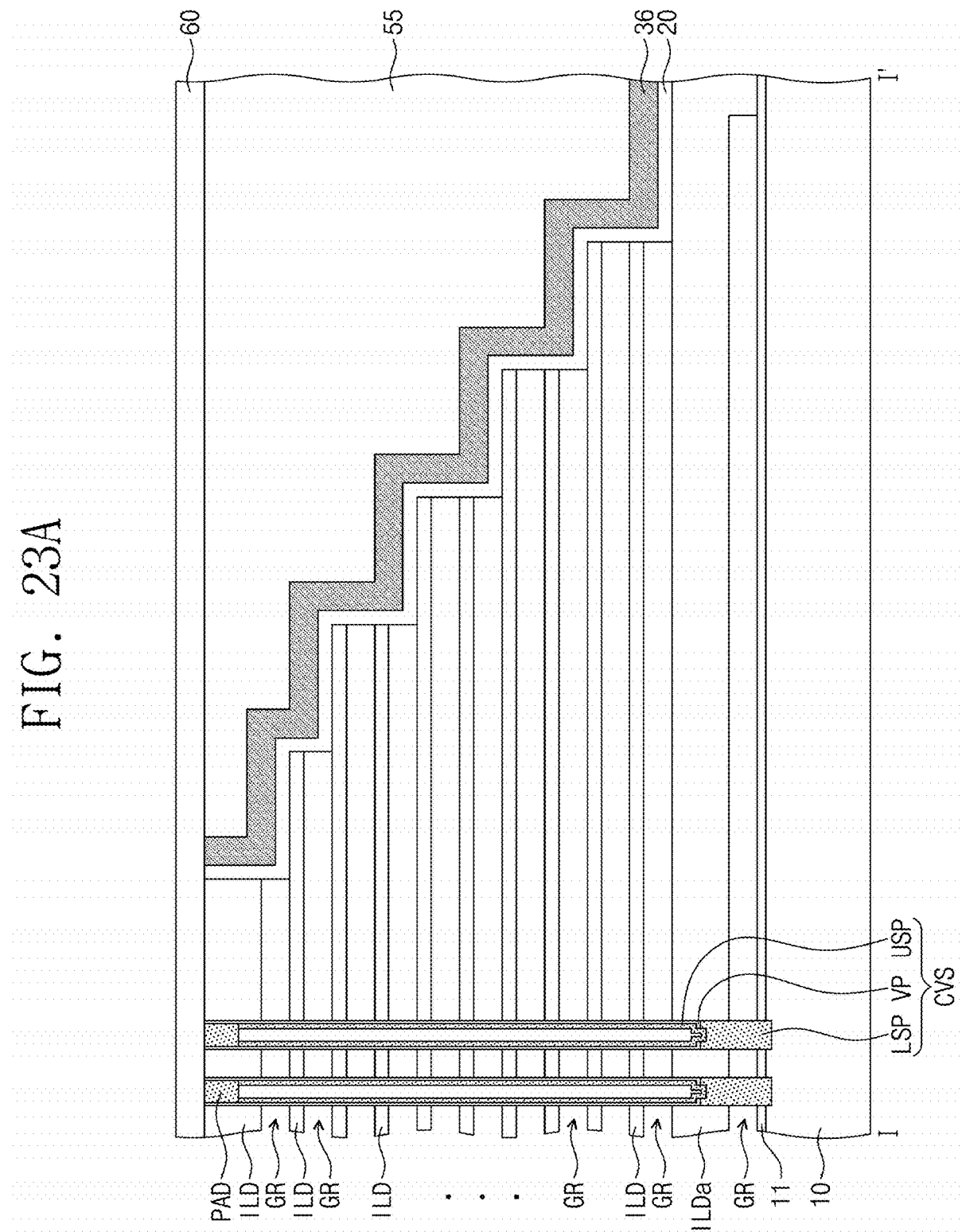

THREE-DIMENSIONAL SEMICONDUCTOR MEMORY DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2018-0133773 filed on Nov. 2, 2018 in the Korean Intellectual Property Office, the entire contents of which are hereby incorporated by reference.

BACKGROUND

The present inventive concepts relate to a semiconductor device and a method of fabricating the same, and more particularly, to a three-dimensional semiconductor memory device with enhanced reliability and/or electrical characteristics and a method of fabricating the same.

Semiconductor devices have been highly integrated to meet high performance and/or low manufacturing cost which are required by customers. Because integration of the semiconductor devices is a factor in determining product price, higher integration is increasingly requested. Integration of typical two-dimensional or planar semiconductor devices is primarily determined by the area occupied by a unit memory cell, such that it is influenced by the level of technology for forming fine patterns. However, the expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide a three-dimensional semiconductor memory device with enhanced reliability and electrical characteristics.

Some example embodiments of the present inventive concepts provide a method of fabricating a three-dimensional semiconductor memory device with enhanced reliability and/or electrical characteristics.

The present inventive concepts is not limited to the mentioned above, and other objects which have not been mentioned above will be clearly understood to those skilled in the art from the following description.

According to some example embodiments of the present inventive concepts, a three-dimensional semiconductor memory device may include a substrate that includes a cell array region and a connection region; an electrode structure that includes a plurality of electrodes and a plurality of dielectric layers alternately stacked on the substrate, the electrode structure having a stepwise structure on the connection region; and an etch stop pattern that covers the stepwise structure of the electrode structure. The electrode structure and the etch stop pattern may extend in a first direction when viewed in plan. The electrode structure may have a first width in a second direction intersecting the first direction. The etch stop pattern may have a second width in the second direction. The second width may be less than the first width.

According to some example embodiments of the present inventive concepts, a three-dimensional semiconductor memory device may include a substrate that includes a cell array region and a connection region; a plurality of separation structures that extend in a first direction on the substrate and are spaced apart from each other in a second direction; an electrode structure between the separation structures and includes a plurality of electrodes and a plurality of dielectric layers alternately stacked on the substrate, the electrode structure having a stepwise structure along the first direction on the connection region; an etch stop pattern that covers the stepwise structure of the electrode structure and includes a dielectric material different from a dielectric material of the dielectric layers; and a dummy pattern on opposing sides of the etch stop pattern, the dummy pattern covering the stepwise structure of the electrode structure and including a material different from a material of the etch stop pattern.

According to some example embodiments of the present inventive concepts, a three-dimensional semiconductor memory device may include a substrate that includes a cell array region and a connection region; an electrode structure that includes a plurality of electrodes and a plurality of dielectric layers alternately stacked on the substrate, the electrode structure having a stepwise structure on the connection region; an etch stop structure that covers the stepwise structure, the etch stop structure including an etch stop pattern including a dielectric material different from a dielectric material of the dielectric layers and a dummy region on opposing sides of the etch stop pattern, the dummy region including a material different from a material of the etch stop pattern; a plurality of dummy vertical structures on the connection region and that penetrate the dummy region and the electrode structure; and a plurality of contact plugs on the connection region, the contact plugs penetrating the etch stop pattern and connecting with corresponding ends of the electrodes.

According to some example embodiments of the present inventive concepts, a three-dimensional semiconductor memory device may include a substrate that includes a cell array region and a connection region; an electrode structure that includes a plurality of electrodes and a plurality of dielectric layers alternately stacked on the substrate, the electrode structure having a stepwise structure on the connection region; an etch stop pattern on a portion of the stepwise structure of the electrode structure and that covers the stepwise structure; a dummy conductive pattern on a side of the etch stop pattern; and a horizontal dielectric layer that conformally covers a first sidewall of the dummy conductive pattern adjacent to the etch stop pattern and top and bottom surfaces of the dummy conductive pattern.

According to some example embodiments of the present inventive concepts, a three-dimensional semiconductor memory device may include a substrate that includes a cell array region and a connection region; an electrode structure that includes a plurality of electrodes and a plurality of dielectric layers alternately stacked on the substrate, the electrode structure having a stepwise structure on the connection region; an etch stop pattern on a portion of the stepwise structure of the electrode structure and that covers the stepwise structure; and a planarized buried dielectric layer that covers the etch stop pattern, the planarized buried dielectric layer including an etch stop region covering a top surface of the etch stop pattern and a dummy region covering opposing sidewalls of the etch stop pattern.

According to some example embodiments of the present inventive concepts, a method of fabricating a three-dimensional semiconductor memory device may include providing a substrate that includes a cell array region and a connection region; forming on the substrate a mold structure in which a plurality of sacrificial layers and a plurality of dielectric layers are alternately stacked, the mold structure having a stepwise structure along a first direction on the connection region; forming a plurality of trenches that extend in the first direction and penetrate the mold structure; forming an etch stop pattern that extends in the first direction between the trenches and covers the stepwise structure of the mold structure, the etch stop pattern having a width less than a distance between the trenches; and replacing the plurality of sacrificial layers with electrodes.

Details of other example embodiments are included in the description and drawings.

BRIEF DESCRIPTION OF THE DRAWINGS

FIGS. 4A to 9A and 4B to 9B illustrate cross sectional views taken along lines I-I' and II-II' of FIG. 1A, showing a three-dimensional semiconductor memory device according to some example embodiments of the present inventive concepts.

FIGS. 10A, 10B, 11A, 11B, 12A to 15A, 12B to 15B, and 12C to 15C illustrate cross-sectional views taken along lines I-I', II-II', and III-III' of FIG. 1A, showing a method of fabricating a three-dimensional semiconductor device according to some example embodiments of the present inventive concepts.

FIGS. 20A to 25A, 20B to 25B, and 20C to 25C illustrate cross-sectional views taken along lines I-I', II-II', and III-III' of FIG. 16, showing a method of fabricating a three-dimensional semiconductor memory device according to some example embodiments of the present inventive concepts.

DETAILED DESCRIPTION OF EMBODIMENTS

Figure 1A:
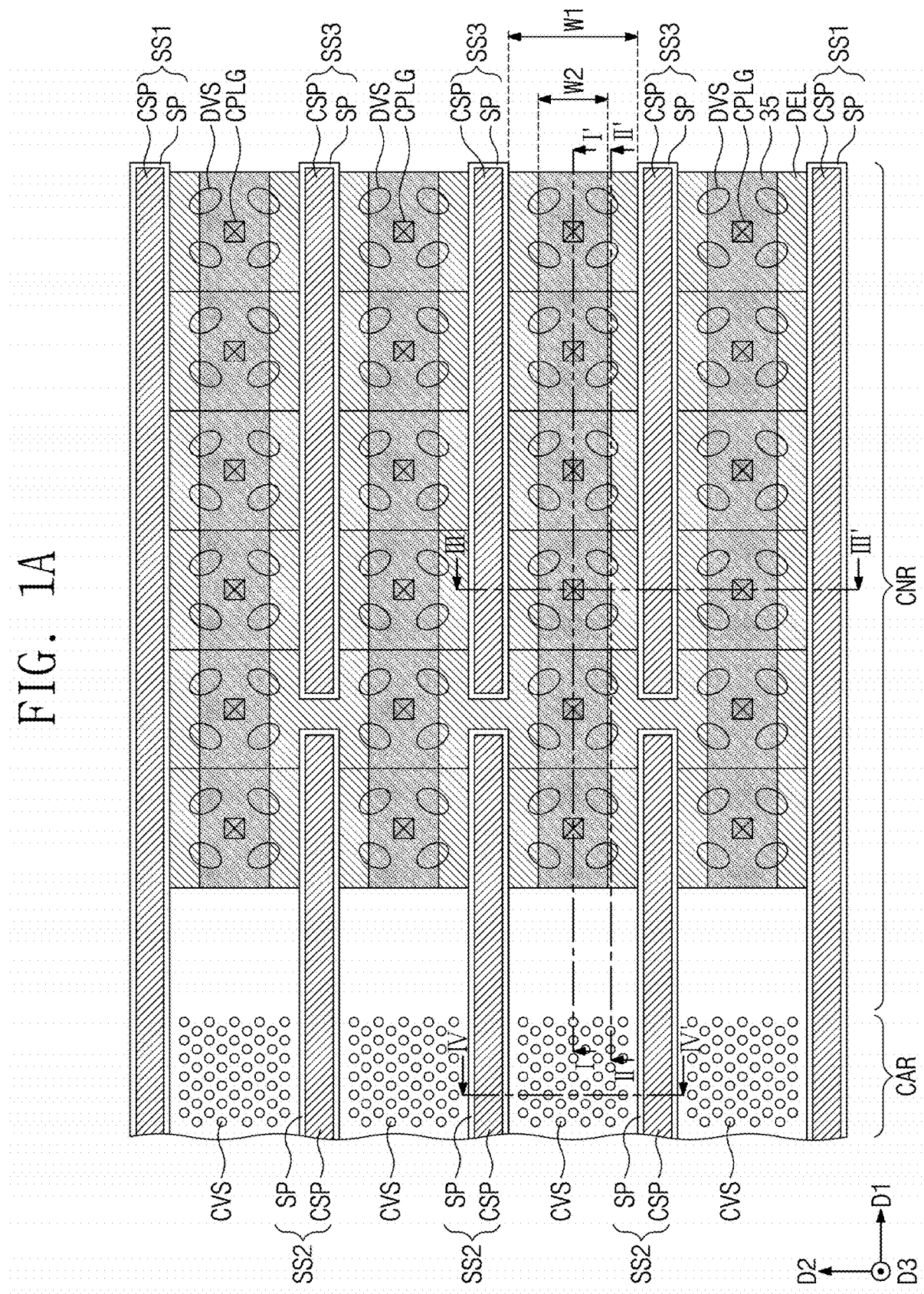
FIGS. 1A and 1B illustrate plan views showing a three-dimensional semiconductor memory device according to some example embodiments of the present inventive concepts.
Figure 1B:
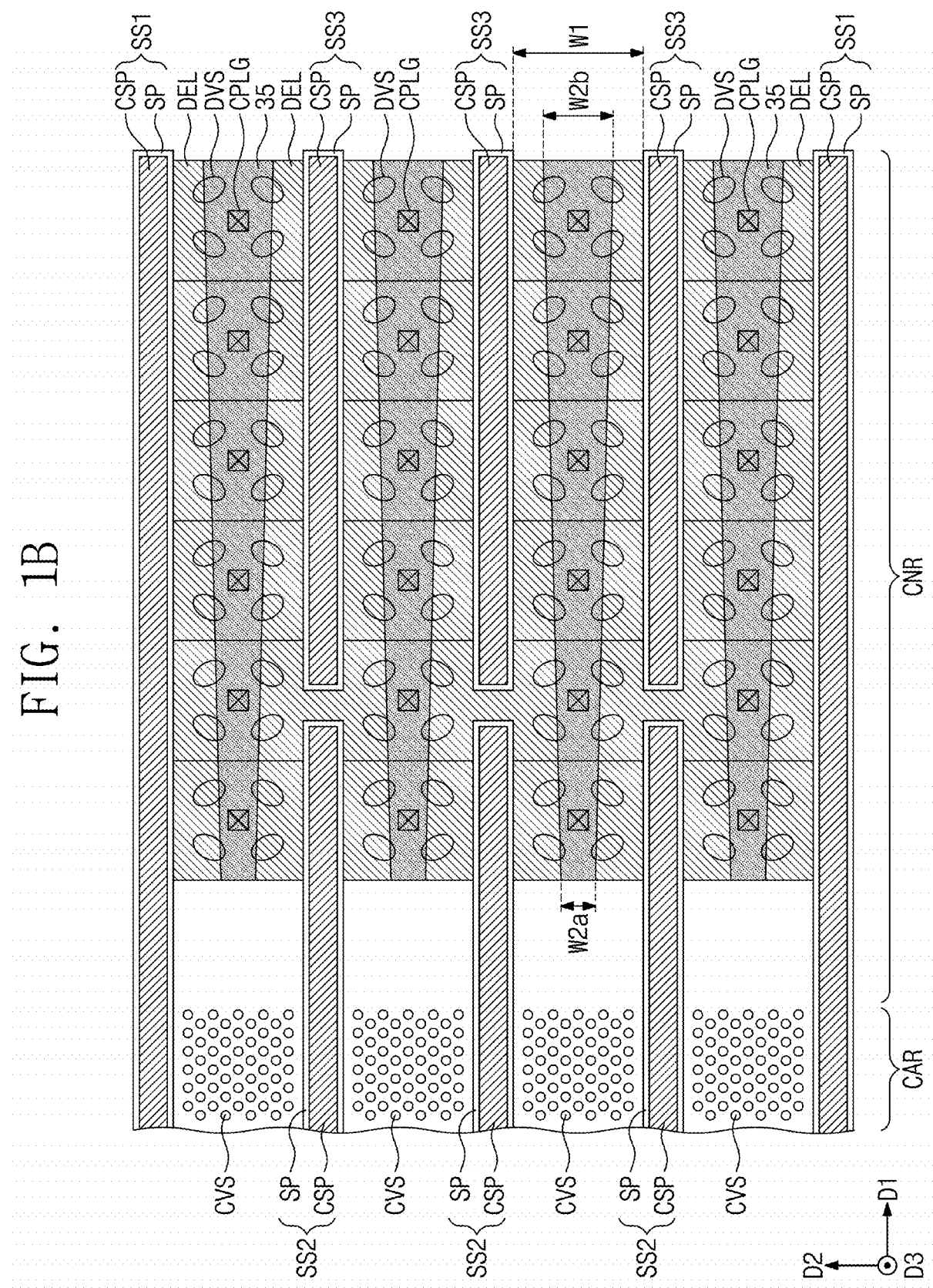
Figure 2A:
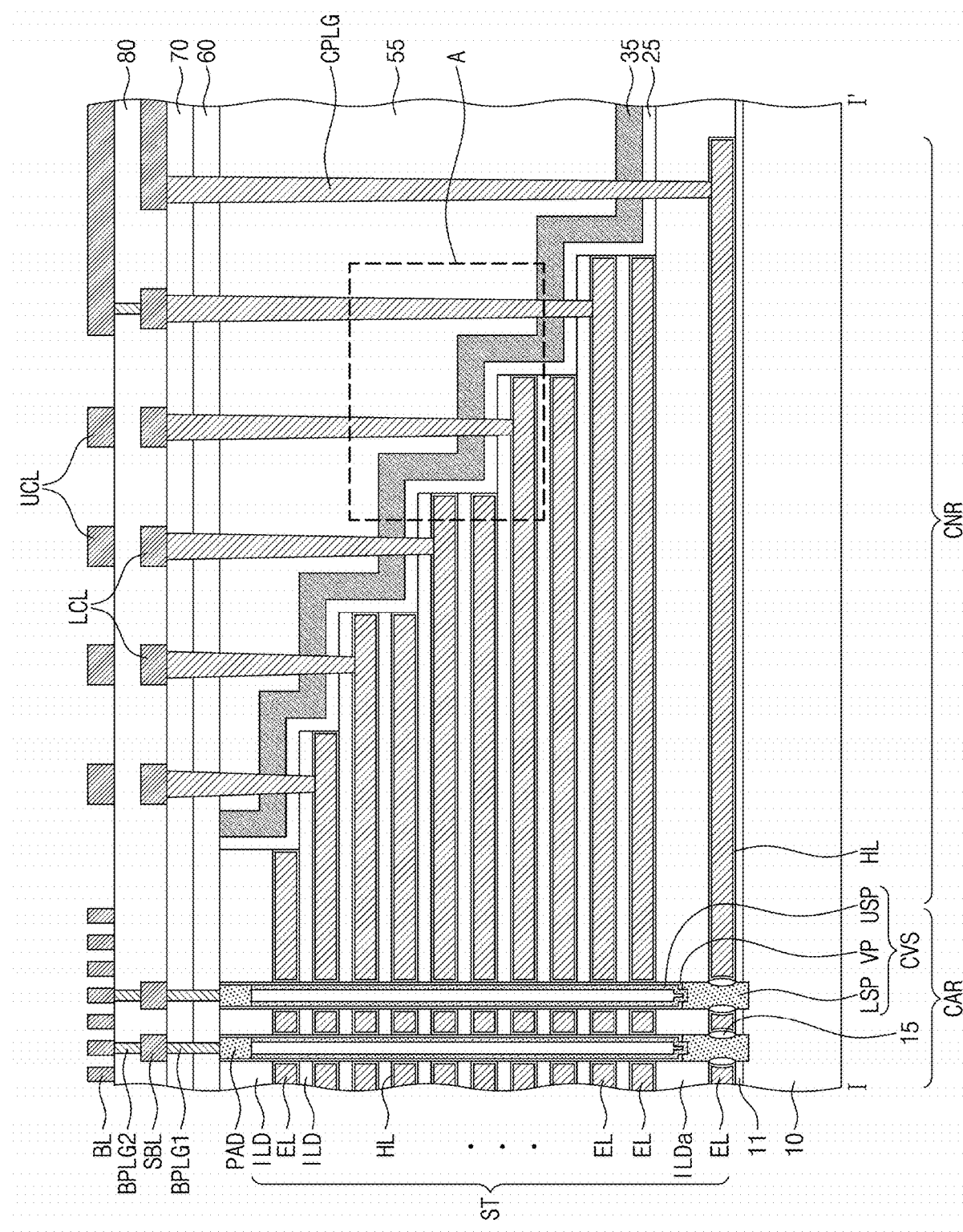
FIGS. 2A, 2B, 2C, and 2D illustrate cross-sectional views respectively taken along lines I-I', II-II', III-III', and IV-IV' of FIG. 1A, showing a three-dimensional semiconductor memory device according to some example embodiments of the present inventive concepts.
Figure 2B:
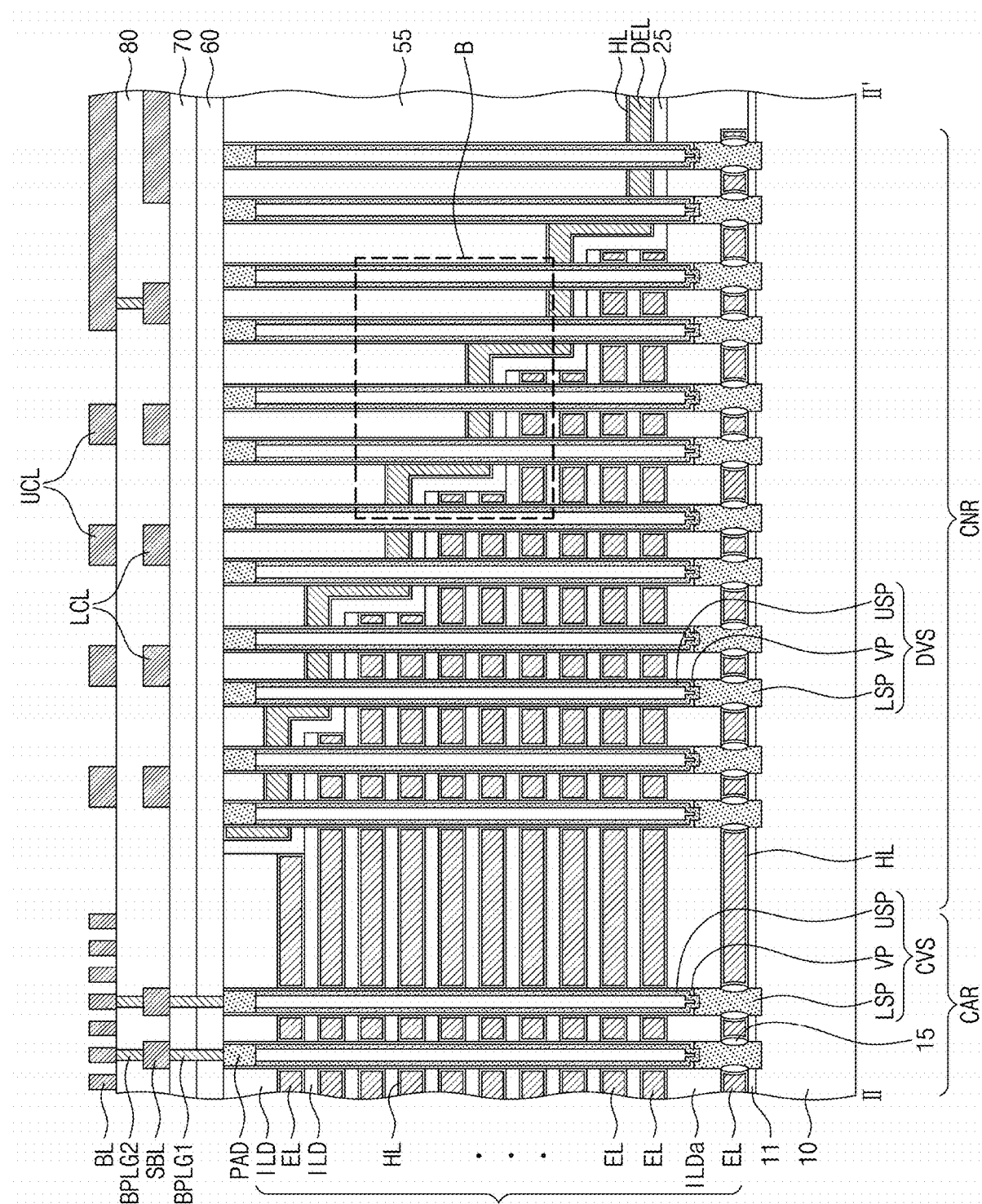
Figure 2C:
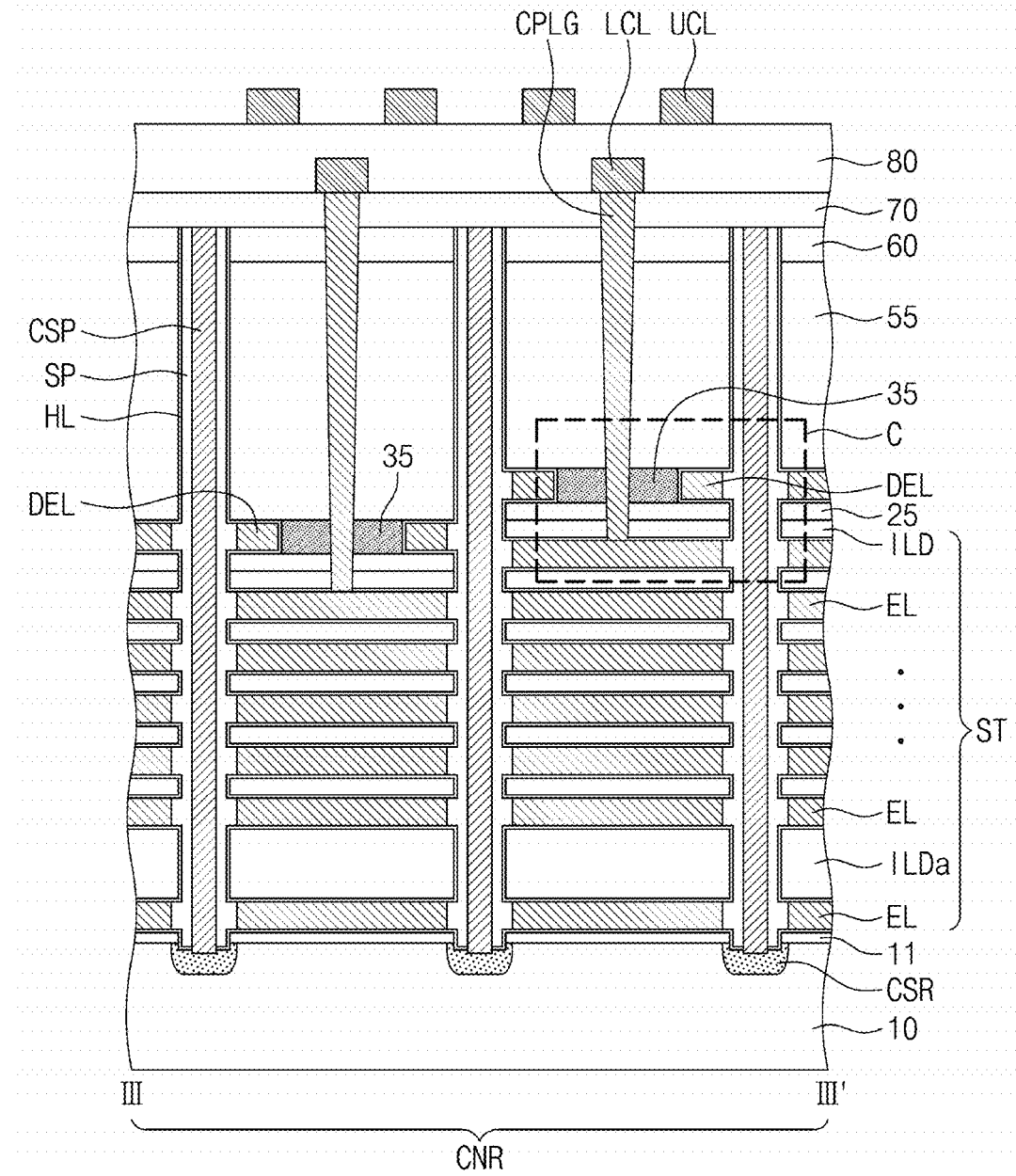
Figure 2D:
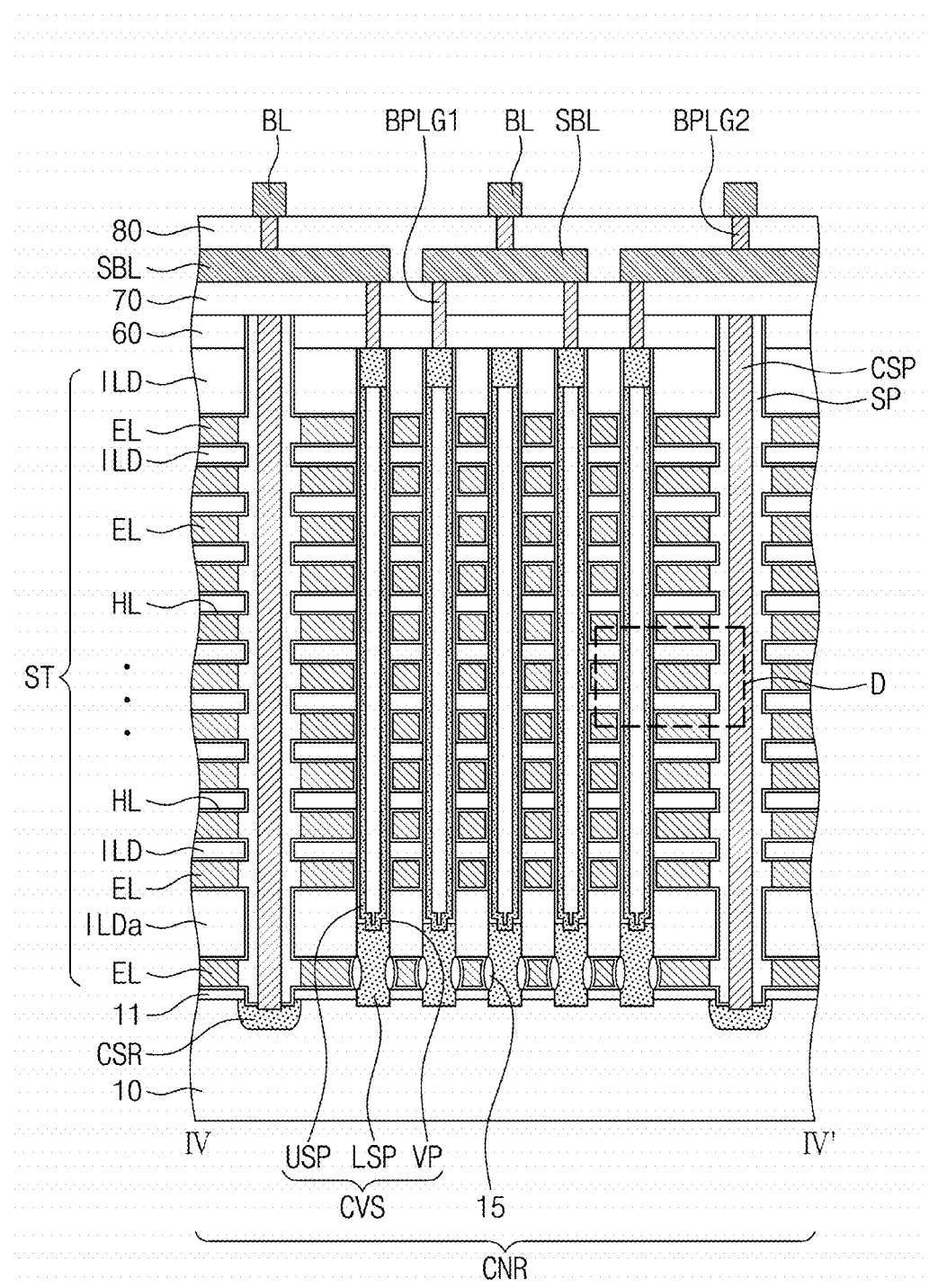

The following will now describe some example embodiments of the present inventive concepts in conjunction with the accompanying drawings. FIGS. 1A and 1B illustrate plan views showing a three-dimensional semiconductor memory device according to some example embodiments of the present inventive concepts. FIGS. 2A, 2B, 2C, and 2D illustrate cross-sectional views respectively taken along lines I-I', II-II', III-III', and IV-IV' of FIG. 1A, showing a three-dimensional semiconductor memory device according to some example embodiments of the present inventive concepts. FIGS. 3A, 3B, 3C, 3D, and 3E illustrate enlarged views respectively showing sections A, B, C, and D of FIGS. 2A, 2B, 2C, and 2D.

Referring to FIGS. 1A, 2A, 2B, 2C, and 2D, a substrate 10 may include a cell array region CAR and a connection region CNR adjacent to the cell array region CAR. The substrate 10 may be one of a semiconductor material (e.g., silicon wafer), a dielectric material (e.g., glass), and a semiconductor or conductor covered with a dielectric material. For example, the substrate 10 may be a silicon wafer having a first conductive type.

The cell array region CAR may include a memory cell array that includes a plurality of three-dimensionally arranged memory cells. The connection region CNR may include a connection line structure that electrically connects the memory cell array to a row decoder.

In certain embodiments, a three-dimensional semiconductor memory device may be a vertical NAND Flash memory device. The cell array region CAR may be provided thereon with cell strings extending along a third direction D3 perpendicular to first and second directions D1 and D2. Each of the cell strings may include string select transistors, memory cell transistors, and a ground select transistor that are connected in series. Each of the memory cell transistors may include a data storage element.

An electrode structure ST may be disposed on the substrate 10 and may include dielectric layers ILD and electrodes EL that are alternately stacked along the third direction D3 perpendicular to a top surface of the substrate 10. The electrode structure ST may extend along the first direction D1 from the cell array region CAR toward the connection region CNR. A buffer dielectric layer 11 may include a silicon oxide layer interposed between the electrode structure ST and the substrate 10.

The electrodes EL may have substantially the same thickness, and the dielectric layers ILD may have their thicknesses that are changed depending on characteristics of a semiconductor memory device. Each dielectric layer ILD may be thinner than each electrode EL; among the dielectric layers ILD, one (referred to hereinafter as a lower dielectric layer ILDa) covering a lowermost electrode EL may be thicker than the others.

The electrodes EL may include, for example, at least one selected from doped semiconductor (e.g., doped silicon, etc.), metal (e.g., tungsten, copper, or aluminum), conductive metal nitride (e.g., titanium nitride or tantalum nitride), and transition metal (e.g., titanium or tantalum). The dielectric layers ILD may include, for example, a silicon oxide layer.

The electrode structure ST may have a stepwise structure on the connection region CNR, and each of the electrodes EL have a pad portion on the connection region CNR. The pad portions of the electrodes EL may be arranged along the first and second directions D1 and D2 intersecting each other when viewed in plan, and may be located at different levels from the top surface of the substrate 10.

The electrodes EL may have their lengths in the first direction D1 that decrease with increasing distance from the substrate 10. The electrodes EL may have their sidewalls that are spaced apart along the first direction D1 from each other at a regular interval. On the connection region CNR, the sidewall of each electrode EL may be vertically aligned with a sidewall of a directly overlying dielectric layer ILD. In addition, the sidewalls of two vertically adjacent electrodes EL may be aligned with each other. In certain embodiments, the stepwise structure of the electrode structure ST may be changed in various shapes.

On the connection region CNR, the electrode structure ST may have a first width W1 in the second direction D2 intersecting the first direction D1. The first width W1 may correspond to a distance between separation structures SS1 and SS3.

On the connection region CNR, a planarized buried dielectric layer 55 may cover the stepwise structure of the electrode structure ST. For example, the planarized buried dielectric layer 55 may cover the pad portions of the electrodes EL. The planarized buried dielectric layer 55 may have a substantially flat top surface, and may include a single dielectric layer or a plurality of stacked dielectric layers. The planarized buried dielectric layer 55 may include a silicon oxide layer.

In certain embodiments, on the connection region CNR, an etch stop pattern 35 may be disposed between the planarized buried dielectric layer 55 and the electrode structure ST, and a pad dielectric pattern 25 may be disposed between the etch stop pattern 35 and the electrode structure ST.

The pad dielectric pattern 25 may include a dielectric material having an etch selectivity with respect to the etch stop pattern 35. For example, the pad dielectric pattern 25 may include the same dielectric material as that of the dielectric layers ILD of the electrode structure ST.

The etch stop pattern 35 may, when viewed in plan, extend along the first direction D1 and parallel to the electrode structure ST, and may conformally cover the stepwise structure of the electrode structure ST. The etch stop pattern 35 may be spaced apart in the second direction D2 from the separation structures SS1 and SS3.

The etch stop pattern 35 may include a dielectric material having an etch selectivity with respect to the dielectric layers ILD of the electrode structure ST, the pad dielectric pattern 25, and the planarized buried dielectric layer 55. For example, the etch stop pattern 35 may include a silicon nitride layer or a silicon oxynitride layer.

Referring to FIGS. 1A, 2C, 3C, and 3D, the etch stop pattern 35 may be spaced apart from the separation structures SS1 and SS3 and disposed on the electrode structure ST.

The etch stop pattern 35 may have a second width W2 in the second direction D2 less than the first width W1 of the electrode structure ST. The first width W1 may correspond to a distance between the separation structures SS1 and SS3. For example, on the connection region CNR, the second width W2 in the second direction D2 of the etch stop pattern 35 may be less than a distance in the second direction D2 between the separation structures SS1 and SS2.

Referring to FIG. 1B, the etch stop pattern 35 may include a lower segment at a first level from the top surface of the substrate 10 and an upper segment at a second level from the top surface of the substrate 10, which second level is higher than the first level. The etch stop pattern 35 may have an upper width W2a at the upper segment and a lower width W2b at the lower segment, which lower width W2b is different from the upper width W2a. For example, the upper width W2a may be less than the lower width W2b, and the each of the upper and lower widths W2a and W2b may be less than the first width W1 of the electrode structure ST.

Figure 3A:
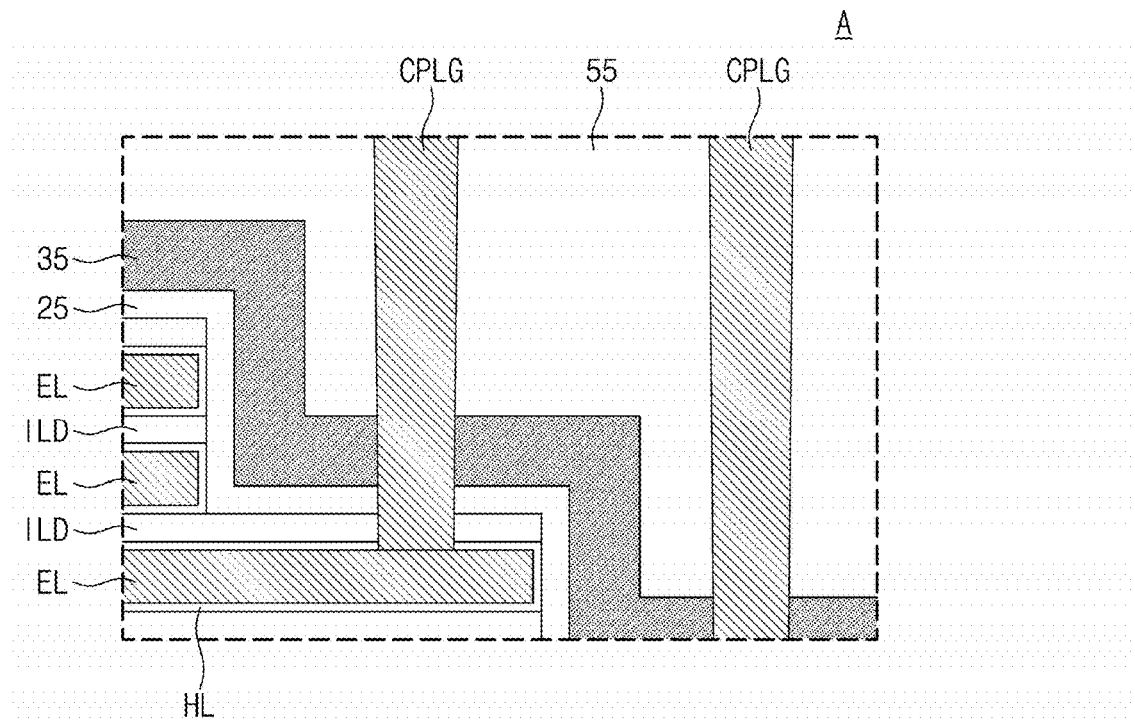
FIGS. 3A, 3B, 3C, 3D, and 3E illustrate enlarged views respectively showing sections A, B, C, and D of FIGS. 2A, 2B, 2C, and 2D.
Figure 3B:
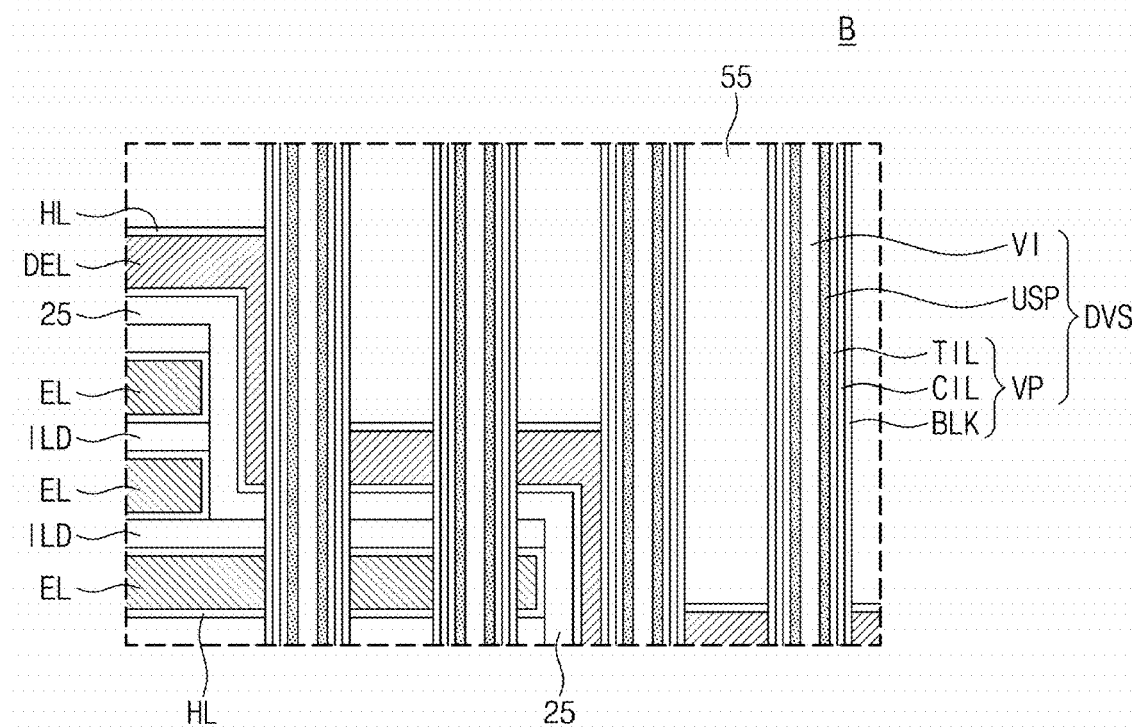
Figure 3C:
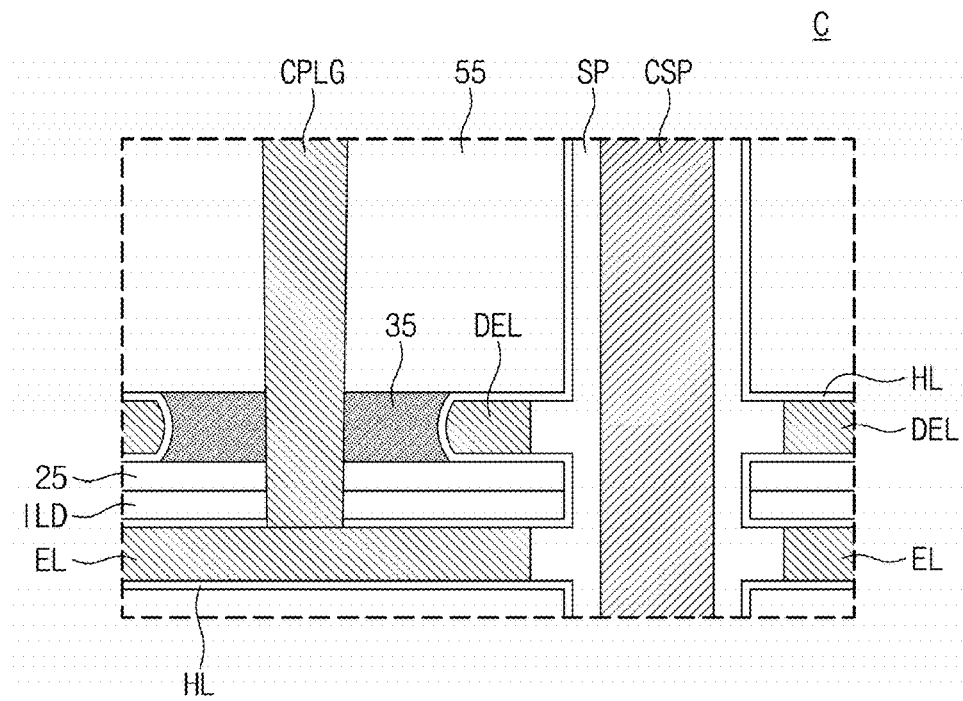
Figure 3D:
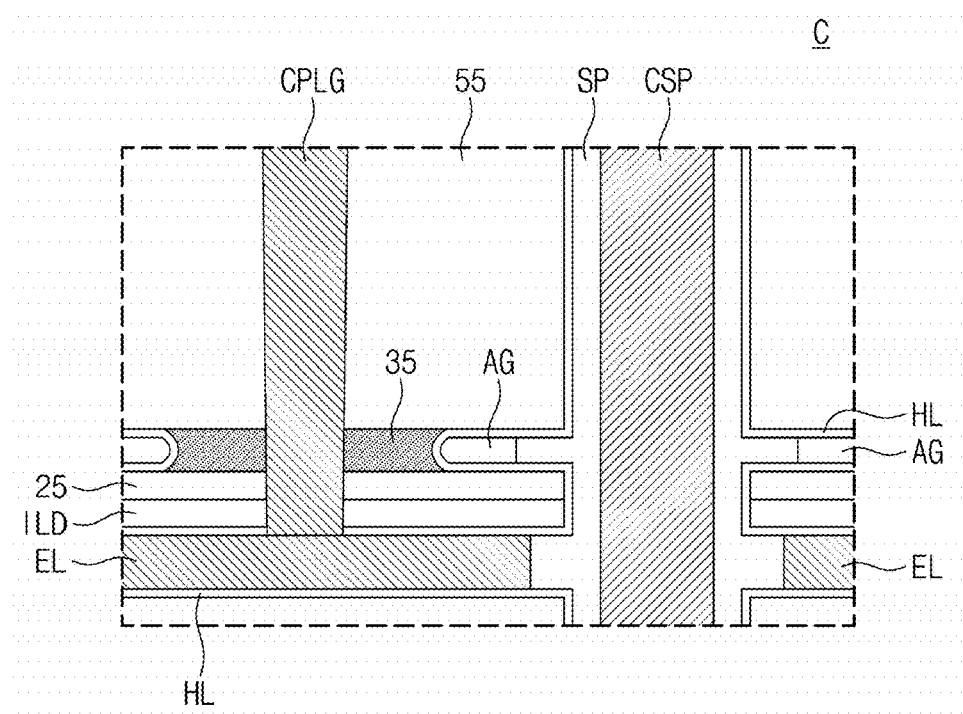

The etch stop pattern 35 may be substantially the same as that of each of the electrodes EL, or as shown in FIG. 3D, may be less than that of each of the electrodes EL. Referring to FIGS. 3C and 3D, the etch stop pattern 35 may have opposing rounded sidewalls.

In certain embodiments, the pad dielectric pattern 25 may be provided thereon with dummy conductive patterns DEL disposed on opposing sides of the etch stop pattern 35. The dummy conductive patterns DEL may be located at the same level as that of the etch stop pattern 35, while extending in the first direction D1. The dummy conductive patterns DEL may include the same conductive material as that of the electrodes EL of the electrode structure ST. The dummy conductive patterns DEL may have sidewalls vertically aligned with the sidewalls of the electrodes EL.

In certain embodiments, on the cell array region CAR, a plurality of cell vertical structures CVS may penetrate the electrode structure ST and connect with the substrate 10. When viewed in plan, the cell vertical structures CVS may be arranged in one direction or in a zigzag shape. The cell vertical structures CVS may have circular top surfaces.

The cell vertical structures CVS may include a semiconductor material, such as silicon (Si), germanium (Ge), or a mixture thereof. The cell vertical structures CVS including a semiconductor material may be used as channels of ground select, string select, and memory cell transistors included in a cell string of a vertical NAND Flash memory device.

Each of the cell vertical structures CVS may include a lower semiconductor pattern LSP, an upper semiconductor pattern USP, and a vertical dielectric pattern VP. A bit line contact pad PAD may be positioned on a top end of the upper semiconductor pattern USP. The bit line contact pad PAD may include an impurity-doped semiconductor material.

The lower semiconductor pattern LSP may directly contact the substrate 10 and may include a pillar-shaped epitaxial layer grown from the substrate 10. A gate dielectric layer 15 may be disposed on a portion of a sidewall of the lower semiconductor pattern LSP. The gate dielectric layer 15 may be disposed between the lowermost electrode EL and the lower semiconductor pattern LSP. The gate dielectric layer 15 may include a silicon oxide layer (e.g., a thermal oxide layer).

The upper semiconductor pattern USP may directly contact the lower semiconductor pattern LSP or the substrate 10, and may have a "U" or pipe shape with a closed bottom end. The upper semiconductor pattern USP may have an inside filled with a buried dielectric pattern VI including a dielectric material. The vertical dielectric pattern VP may surround a sidewall of the upper semiconductor pattern USP.

The upper semiconductor pattern USP may include a semiconductor material, such as silicon (Si), germanium (Ge), or a mixture thereof. The upper semiconductor pattern USP may have a different crystal structure from that of the lower semiconductor pattern LSP. For example, the upper semiconductor pattern USP may have at least one selected from a single crystalline structure, an amorphous structure, and a polycrystalline structure.

On the connection region CNR, dummy vertical structures DVS may penetrate the planarized buried dielectric layer 55 and the electrode structure ST. The number of the electrodes EL through which the dummy vertical structures DVS penetrate may decrease as the dummy vertical structures DVS become farther away from the cell array region CAR.

The dummy vertical structures DVS may have substantially the same stack structure and material as those of the cell vertical structures CVS. For example, likewise the cell vertical structures CVS, each of the dummy vertical structures DVS may include a lower semiconductor pattern LSP, an upper semiconductor pattern USP, and a vertical dielectric pattern VP.

The dummy vertical structures DVS may have substantially the same vertical length as that of the cell vertical structures CVS. For example, the dummy vertical structures DVS may have their top surfaces at substantially the same level as that of top surfaces of the cell vertical structures CVS. The dummy vertical structures DVS may have their widths greater than those of the cell vertical structures CVS. For example, each top surface of the dummy vertical structures DVS may have a bar or oval shape having major and minor axes.

A plurality of the dummy vertical structures DVS may penetrate the pad portion of each electrode EL. For example, four dummy vertical structures DVS may penetrate the pad portion of each electrode EL, but the present inventive concepts are not limited thereto. An arrangement and the number of the dummy vertical structures DVS may be variously changed.

In certain embodiments, when viewed in plan, the dummy vertical structures DVS may penetrate boundaries between the etch stop pattern 35 and the dummy conductive patterns DEL. For example, the dummy vertical structures DVS may penetrate portions of the etch stop pattern 35 and portions of the dummy conductive patterns DEL. The vertical dielectric patterns VP may electrically separate the dummy conductive patterns DEL from the upper semiconductor patterns USP of the dummy vertical structures DVS.

Figure 3E:
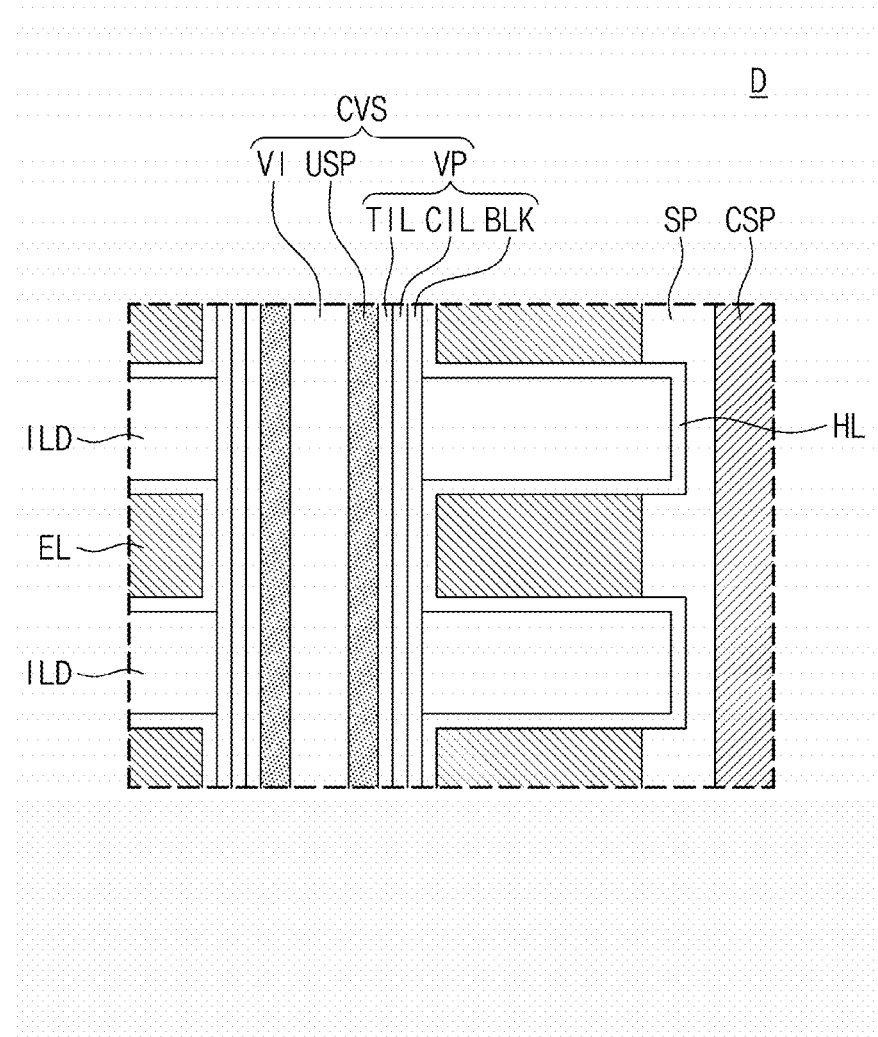

Referring to FIGS. 3B and 3E, on each of the cell and dummy vertical structures CVS and DVS, the vertical dielectric pattern VP may include a tunnel dielectric layer TIL, a charge storage layer CIL, and a blocking dielectric layer BLK, that serve as a data storage layer of a NAND Flash memory device.

The charge storage layer CIL may be a trap dielectric layer, a floating gate electrode, or a dielectric layer including conductive nano-dots. For example, the charge storage layer CIL may include one or more of a silicon nitride layer, a silicon oxynitride layer, a silicon-rich nitride layer, a nano-crystalline silicon layer, and a laminated trap layer. The tunnel dielectric layer TIL may be one of materials whose band gap is greater than that of the charge storage layer CIL, and the blocking dielectric layer BLK may be a high-k dielectric layer such as an aluminum oxide layer or a hafnium oxide layer.

In certain embodiments, a horizontal blocking dielectric layer HBLK may be provided between the vertical dielectric pattern VP and sidewalls of the electrodes EL. The horizontal blocking dielectric layer HBLK may be disposed between the vertical dielectric pattern VP and sidewalls of the electrodes EL, covering top and bottom surfaces of the electrodes EL. The horizontal blocking dielectric layer HBLK may have their uniform thicknesses covering first sidewalls of the electrodes EL adjacent to the cell and dummy vertical structures CVS and DVS, and also covering the top and bottom surfaces of the electrodes EL. The horizontal blocking dielectric layer HBLK may be portions of data storage layers of a NAND Flash memory device, and may include a blocking dielectric layer including a high-k dielectric layer such as an aluminum oxide layer or a hafnium oxide layer.

A horizontal dielectric layer HL may be disposed between a common source plug CSP which will be discussed below and sidewalls of the dielectric layers ILD of the electrode structure ST, and may include the same material as that of the horizontal blocking dielectric layers HBLK. Referring to FIG. 3C, the horizontal dielectric layer HL may extend between the etch stop pattern 35 and the dummy conductive patterns DEL. The horizontal dielectric layer HL may cover the rounded sidewall of the etch stop pattern 35, and may extend from between the etch stop pattern 35 and the dummy conductive pattern DEL onto top and bottom surfaces of the dummy conductive pattern DEL. For example, the horizontal dielectric layer HL may include a first upper segment covering the top surface of the electrode EL and a first lower segment covering the bottom surface of the electrode EL, and the first upper segment and the first lower segment may have substantially the same thickness. The horizontal dielectric layer HL may include a second upper segment covering the top surface of the dummy conductive pattern DEL and a second lower segment covering the bottom surface of the dummy conductive pattern DEL, and the second upper segment and the second lower segment may have substantially the same thickness.

A first interlayer dielectric layer 60 may be disposed on the planarized buried dielectric layer 55, and may cover the top surfaces of the cell vertical structures CVS and the top surfaces of the dummy vertical structures DVS. The first interlayer dielectric layer 60 may further cover an uppermost top surface of the etch stop pattern 35 and an uppermost top surface of the pad dielectric pattern 25.

When viewed in plan, the electrode structure ST may be disposed between first separation structures SS1 extending in parallel to each other. The first separation structures SS1 may extend from the cell array region CAR toward the connection region CNR, and may penetrate the first interlayer dielectric layer 60, the planarized buried dielectric layer 55, the pad dielectric pattern 25, and the electrode structure ST.

On the cell array region CAR, second separation structures SS1 may be disposed between the first separation structures SS1 and spaced apart in the second direction D2 from each other at a regular interval. The second separation structures SS2 may penetrate the first interlayer dielectric layer 60 and the electrode structure ST, while extending along the first direction D1.

On the connection region CNR, third separation structures SS3 may be disposed between the first separation structures SS1 and spaced apart from each other in the second direction D2. The third separation structures SS3 may penetrate the first interlayer dielectric layer 60, the planarized buried dielectric layer 55, the pad dielectric pattern 25, and the electrode structure ST, while extending along the first direction D1. The third separation structures SS3 may be spaced apart in the first direction D1 from the second separation structures SS2.

Each of the first, second, and third separation structures SS1, SS2, and SS3 may include a common source plug CSP including a conductive material and a sidewall spacer SP between the common source plug CSP and the electrode structure ST.

The sidewall spacer SP may include a dielectric material different from that of the etch stop pattern 35. The sidewall spacer SP may include protrusions that horizontally protrude toward the dummy conductive patterns DEL and the electrodes EL. As shown in FIG. 3D, the sidewall spacer SP may include a protrusion that protrudes between the planarized buried dielectric layer 55 and the pad dielectric pattern 25, and may define an air gap AG locally between the protrusion and the etch stop pattern 35.

The common source plug CSP may be coupled to a common source region CSR formed in the substrate 10. The common source region CSR may extend in the first direction D1 and parallel to the electrode structure ST. The common source region CSR may include second conductive type impurities doped in the substrate 10. The common source region CSR may include N-type impurities (e.g., arsenic (As) or phosphorous (P)). Each of the first, second, and third separation structures SS1, SS2, and SS3 may be a linear pillar including a dielectric material.

In certain embodiments, on the connection region CNR, the first and third separation structures SS1 and SS3 may be spaced apart in the second direction D2 from the etch stop pattern 35, and the sidewall spacers SP of the first and third separation structures SS1 and SS3 may cover the sidewalls of the electrodes EL and the sidewalls of the dummy conductive patterns DEL.

Referring to FIGS. 3C and 3D, the sidewalls of the electrodes EL may be spaced apart in the second direction D2 from a sidewall of the common source plug CSP at a first horizontal distance, and the sidewall of the etch stop pattern 35 may be spaced apart in the second direction D2 from the sidewall of the common source plug CSP at a second horizontal distance greater than the first horizontal distance.

Referring back to FIGS. 2A, 2B, 2C, and 2D, a second interlayer dielectric layer 70 may be disposed on the first interlayer dielectric layer 60, and may cover top surfaces of the first, second, and third separation structures SS1, SS2, and SS3.

On the cell array region CAR, first bit line plugs BPLG1 may penetrate the first and second interlayer dielectric layers 60 and 70 and connect with corresponding cell vertical structures CVS.

On the connection region CNR, cell contact plugs CPLG may penetrate the first and second interlayer dielectric layers 60 and 70, the planarized buried dielectric layer 55, the etch stop pattern 35, and the pad dielectric pattern 25, and may connect with corresponding pad portions of the electrodes EL.

The cell contact plugs CPLG may have their top surfaces at substantially the same level and may have different vertical lengths from each other. The top surfaces of the cell contact plugs CPLG may be substantially planar with each other, and the vertical lengths of the cell contact plugs CPLG may decrease as approaching the cell array region CAR.

Each of the cell contact plugs CPLG may be spaced apart from the dummy vertical structures DVS penetrating the pad portions of the electrodes EL. The top surfaces of the cell contact plugs CPLG may be located at a higher level than that of the top surfaces of the dummy vertical structures DVS and that of the top surfaces of the first, second, and third separation structures SCS1, SS2, and SS3.

Each of the cell contact plugs CPLG may have a diameter less than the second width W2 of the etch stop pattern 35, and may be horizontally spaced apart from the dummy conductive patterns DEL. Each of the cell contact plugs CPLG may have a sidewall whose portion is in direct contact with the etch stop pattern 35. In certain embodiments, because the etch stop pattern 35 includes a dielectric material, a reliable electrical connections may be ensured between the cell contact plugs CPLG and the electrodes EL.

On the cell array region CAR, the second interlayer dielectric layer 70 may be provided thereon with subsidiary bit lines SBL whose major axes extend in the second direction D2. Each of the subsidiary bit lines SBL may be connected through the first bit line plugs BPLG1 to two adjacent cell vertical structures CVS.

On the connection region CNR, lower connection lines CL may be disposed on the second interlayer dielectric layer 70. The lower connection lines LCL may have their ends coupled to corresponding cell contact plugs CPLG. The lower connection lines LCL may be electrically connected through the cell contact plugs CPLG to corresponding pad portions of the electrodes EL.

On the cell array region CAR, bit lines BL may be disposed on a third interlayer dielectric layer 80, and on the connection region CNR, upper connection lines UCL may be disposed on the third interlayer dielectric layer 80. The bit lines BL may extend in the second direction D2 while running across the electrode structures ST, and may be connected to the subsidiary bit lines SBL through second bit line contact plugs BPLG2.

On the connection region CNR, upper connection lines UCL may be disposed on the third interlayer dielectric layer 80, and may be electrically connected to the lower connection lines LCL through upper contacts.

FIGS. 4A to 9A and 4B to 9B illustrate cross sectional views taken along lines I-I' and II-II' of FIG. 1A, showing a three-dimensional semiconductor memory device according to some example embodiments of the present inventive concepts.

A detailed description of technical features the same as those of the three-dimensional semiconductor memory device discussed above may be omitted for brevity of explanation, and a difference thereof will be described.

Figure 4B:
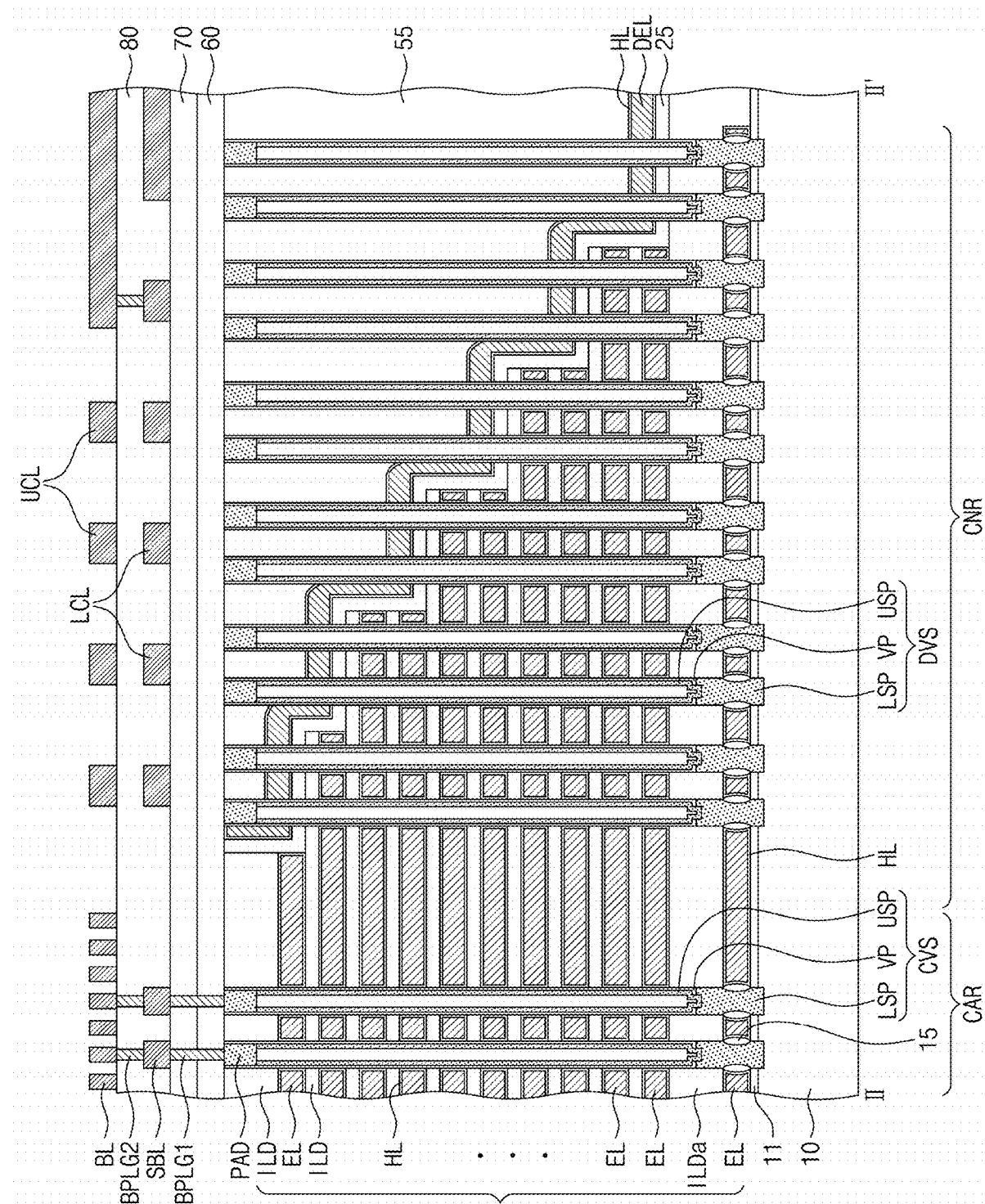

Referring to FIGS. 4A and 4B, the etch stop pattern 35 may have different thicknesses on a sidewall of each stair-step of the electrode structure ST and on a top surface of each stair-step. The etch stop pattern 35 may have a rounded profile at a portion covering each stair-step. The dummy conductive patterns DEL may be disposed on opposing sides of the etch stop pattern 35, and may also have substantially the same rounded profile as that of the etch stop pattern 35. The thickness of the etch stop pattern 35 on an upper stair-step may be different from that of the etch stop pattern 35 on a lower stair-step.

Figure 5A:
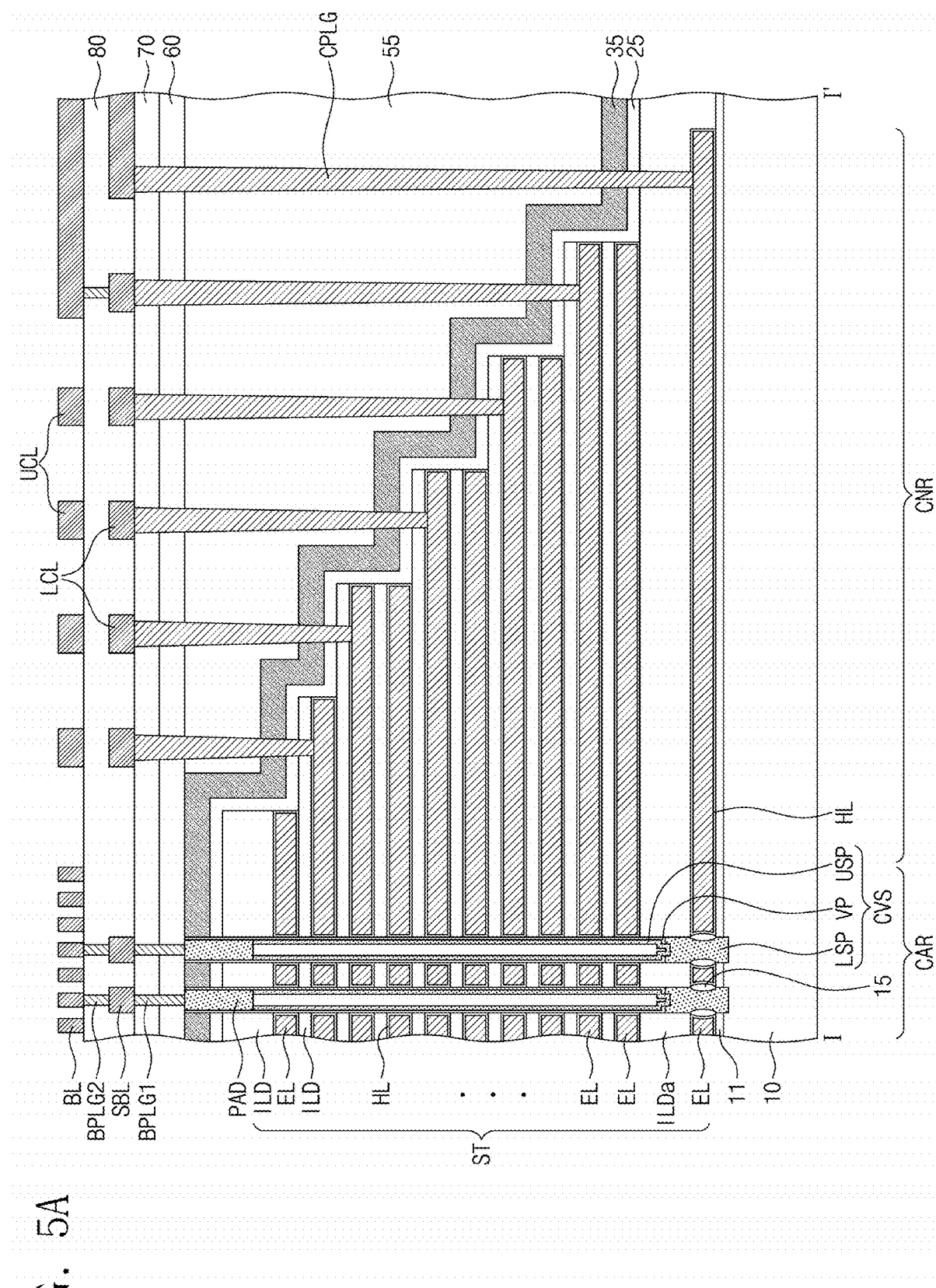
Figure 5B:
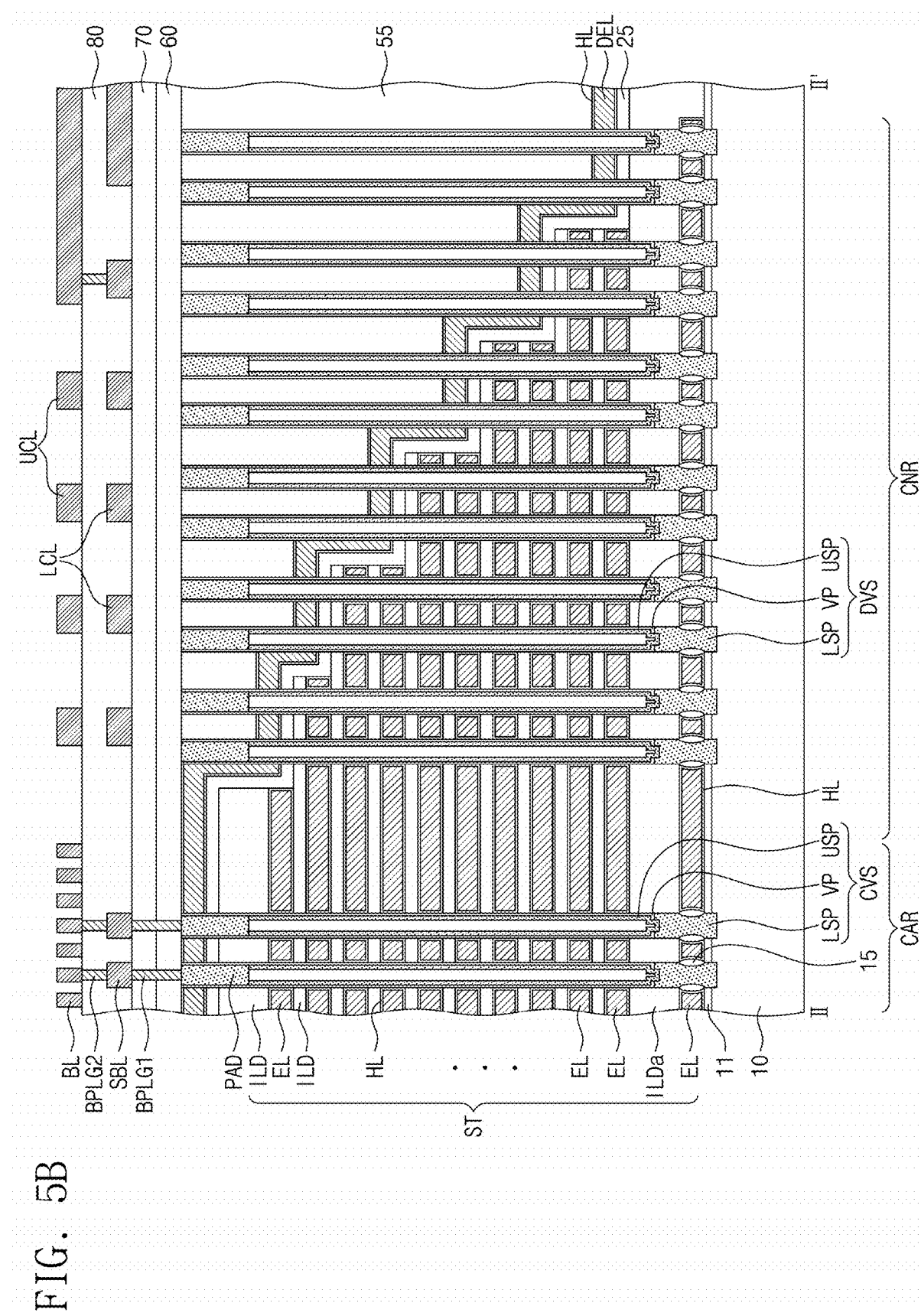

Referring to FIGS. 5A and 5B, the etch stop pattern 35 and the dummy conductive patterns DEL may extend from the connection region CNR toward the cell array region CAR. For example, on the cell array region CAR and the connection region CNR, the etch stop pattern 35 may conformally cover the top surface of the electrode structure ST. The etch stop pattern 35 and the dummy conductive patterns DEL may have a planarized portion on the electrode structure ST of the cell array region CAR and a stepwise portion on the electrode structure ST of the connection region CNR.

The planarized buried dielectric layer 55 may cover the stepwise portion of the etch stop pattern 35 and the stepwise portions of the dummy conductive patterns DEL, and the first interlayer dielectric layer 60 may cover the planarized portion of the etch stop pattern 35, the planarized portions of the dummy conductive patterns DEL, and the planarized buried dielectric layer 55.

On the cell array region CAR, the cell vertical structures CVS may penetrate the planarized portion of the etch stop pattern 35, the pad dielectric pattern 25, and the electrode structure ST.

Figure 6B:
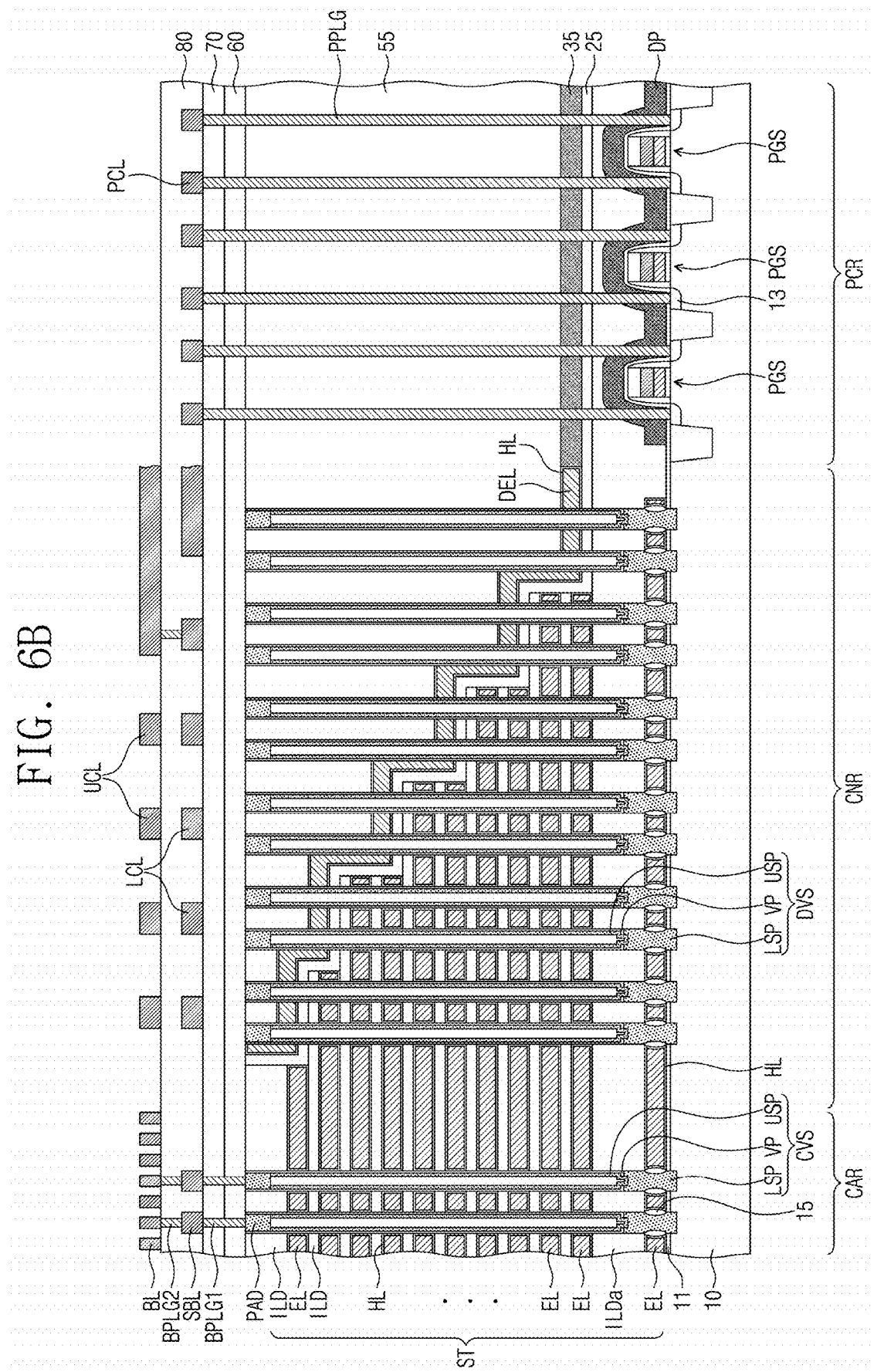

Referring to FIGS. 6A and 6B, the substrate 10 may include the cell array region CAR, the connection region CNR, and further include a peripheral circuit region PCR. The connection region CNR may be positioned between the cell array region CAR and the peripheral circuit region PCR.

On the peripheral circuit region PCR, the substrate 10 may be provided thereon with peripheral logic circuits such as row and column decoders, a page buffer, and control circuits. The peripheral logic circuits may include, for example, high-voltage and low-voltage transistors, a resistor, and a capacitor. On the peripheral circuit region PCR, peripheral gate stacks PGS may be disposed spaced apart from each other on the substrate 10. Source/drain impurity regions 13 may be provided in the semiconductor substrate 10 on opposing sides of each of the peripheral gate stacks PGS.

On the cell array region CAR, the substrate 10 may be provided thereon with the electrode structure ST spaced apart from the peripheral logic circuits. The electrode structure ST may extend along the first direction D1 from the cell array region CAR toward the connection region CNR, and may have a stepwise structure on the connection region CNR. The buffer dielectric layer 11 may include a silicon oxide layer interposed between the electrode structure ST and the substrate 10. The buffer dielectric layer 11 may extend onto the peripheral circuit region PCR and conformally cover the peripheral gate stacks PGS.

The electrode structures ST may include the electrodes EL and the dielectric layers ILD that are vertically and alternately stacked. In the electrode structure ST, the lower dielectric layer ILDa covering the lowermost electrode EL may successively extend from the cell array region CAR toward the peripheral circuit region PCR. The lowermost electrode EL may have a top surface lower than those of the peripheral gate stacks PGS.

On the peripheral circuit region PCR, a dummy sacrificial pattern DP may conformally cover the peripheral gate stacks PGS. The dummy sacrificial pattern DP may include a dielectric material having an etch selectivity with respect to the dielectric layers ILD. For example, the dummy sacrificial pattern DP may include a silicon nitride layer. The dummy sacrificial pattern DP may be covered with the lower dielectric layer ILDa of the electrode structure ST.

On the connection region CNR, the etch stop pattern 35 and the dummy conductive patterns DEL may conformally cover the electrode structure ST. The pad dielectric pattern 25 may be disposed between the electrode structure ST and the etch stop pattern 35 and between the electrode structure ST and the dummy conductive patterns DEL. The pad dielectric pattern 25 may extend from the electrode structure ST on the connection region CNR onto the lower dielectric layer ILDa on the peripheral circuit region PCR.

In certain embodiments, as discussed above, the etch stop pattern 35 may have the second width (see W2 of FIG. 1A) in the second direction D2 on the connection region CNR, which second width W2 is less than the first width W1, and may successively extend from the connection region CNR toward the peripheral circuit region PCR. The etch stop pattern 35 may entirely cover the lower dielectric layer ILDa on the peripheral circuit region PCR.

On the connection region CNR, the dummy conductive patterns DEL may be disposed on opposing sides of the etch stop pattern 35. As shown in FIG. 6B, a portion of the horizontal dielectric layer HL may be disposed between the dummy conductive pattern DEL and a portion of the etch stop pattern 35 covering the peripheral circuit region PCR.

On the peripheral circuit region PCR, peripheral contact plugs PPLG may penetrate the first and second interlayer dielectric layers 60 and 70, the planarized buried dielectric layer 55, the etch stop pattern 35, the pad dielectric pattern 25, the lower dielectric layer ILDa, and the dummy sacrificial pattern DP, and may connect with the source/drain impurity regions 13. The etch stop pattern 35 may be used as an etch stop layer when the peripheral contact plugs PPLG are formed on the peripheral circuit region PCR. On the peripheral circuit region PCR, the peripheral circuit connection lines PCL may be disposed on the second interlayer dielectric layer 70 and coupled to the peripheral cell contact plugs PPLG.

Figure 7A:
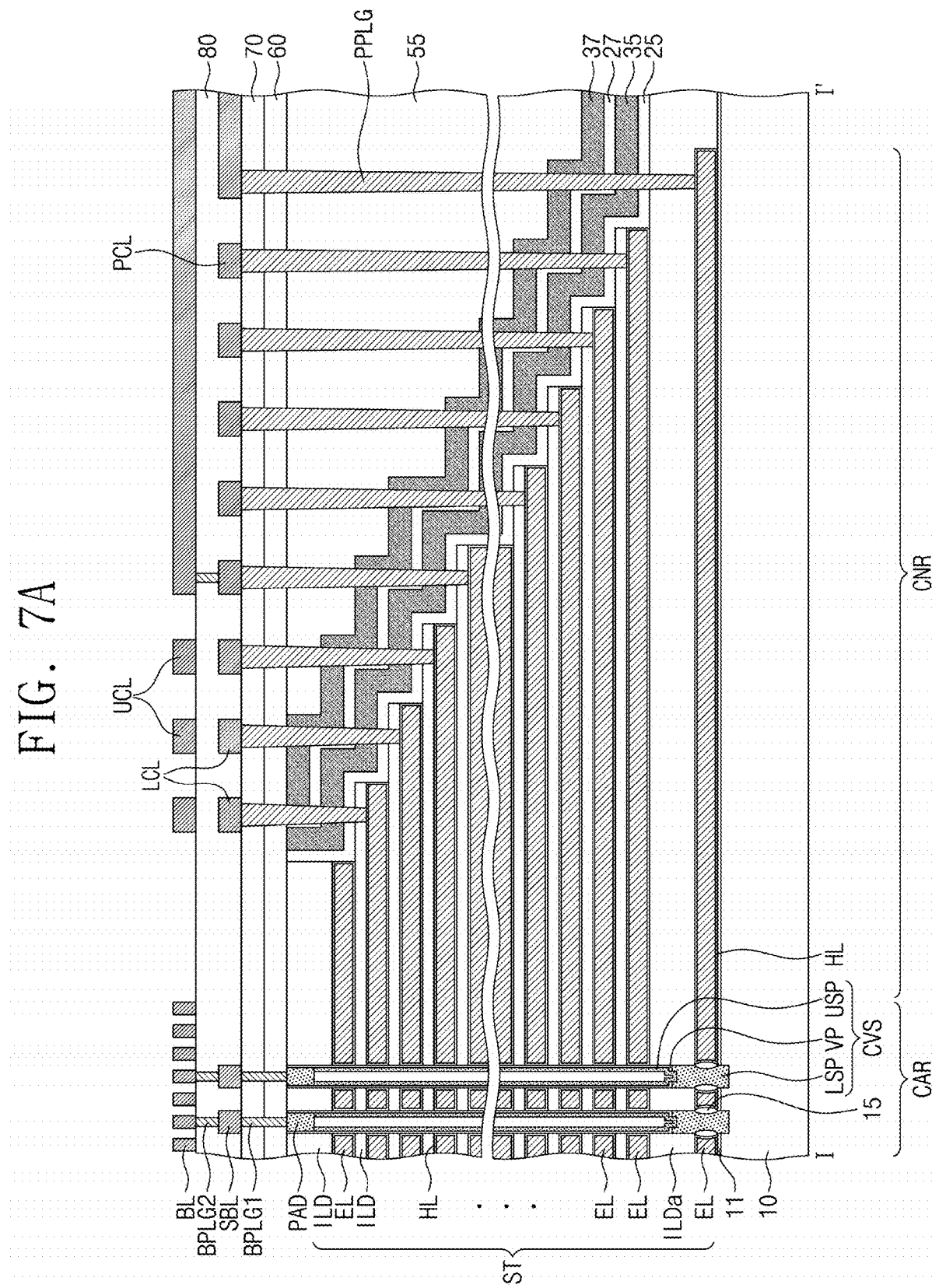
Figure 7B:
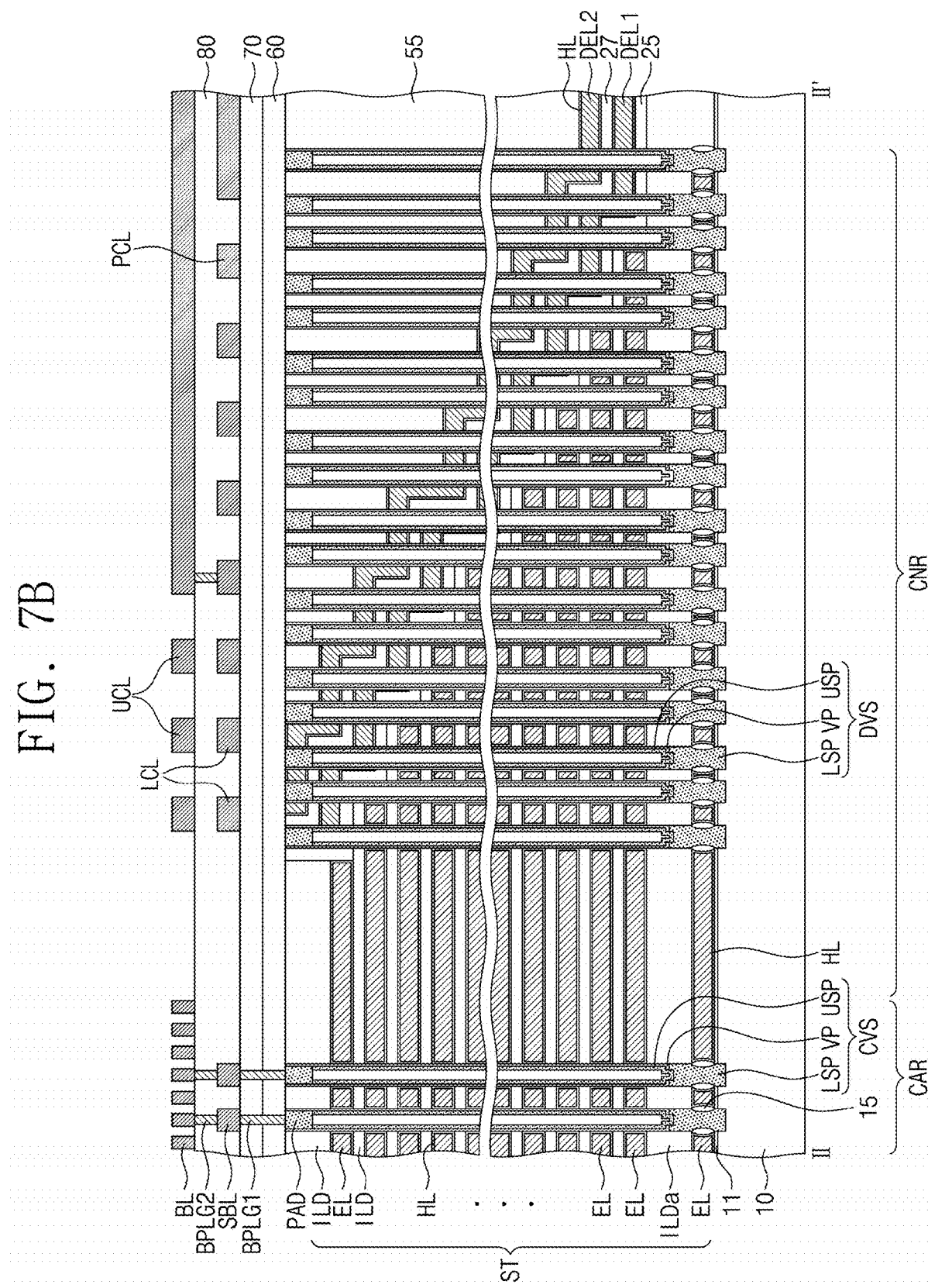

Referring to FIGS. 7A and 7B, the electrode structure ST may be disposed on the substrate 10, and may have a stepwise structure on the connection region CNR. Each stair-step of the stepwise structure may consist of one electrode EL and one dielectric layer ILD.

A plurality of etch stop patterns 35 and 37 may be stacked on the stepwise structure of the electrode structure ST. For example, first and second etch stop patterns 35 and 37 may conformally cover the stepwise structure of the electrode structure ST.

The first etch stop pattern 35 and the electrode structure ST may be provided therebetween with a first pad dielectric pattern 25 having a uniform thickness, and the first etch stop pattern 35 and the second etch stop pattern 37 may be provided therebetween with a second pad dielectric pattern 27 having a uniform thickness.

Likewise the etch stop pattern 35 discussed above with reference to FIGS. 2A, 2B, and 2C, on the connection region CNR, each of the first and second etch stop patterns 35 and 37 may have the second width (see W2 of FIG. 1A) less than the first width (see W1 of FIG. 1A) of the electrode structure ST.

First dummy conductive patterns DEL1 may be disposed on the first pad dielectric pattern 25 on opposing sides of the first etch stop pattern 35, and second dummy conductive patterns DEL2 may be disposed on the second pad dielectric pattern 27 on opposing sides of the second etch stop pattern 37.

The first and second etch stop patterns 35 and 37 may have their uppermost top surfaces at substantially the same level, and the planarized buried dielectric layer 55 may be disposed on the second etch stop pattern 37 and the second dummy conductive patterns DEL2.

On the connection region CNR, the cell contact plugs CPLG may penetrate the first and second etch stop patterns 35 and 37, and may connect with corresponding pad portions of the electrodes EL. The cell contact plugs CPLG may be horizontally spaced apart from the first and second dummy conductive patterns DEL1 and DEL2.

Figure 8A:
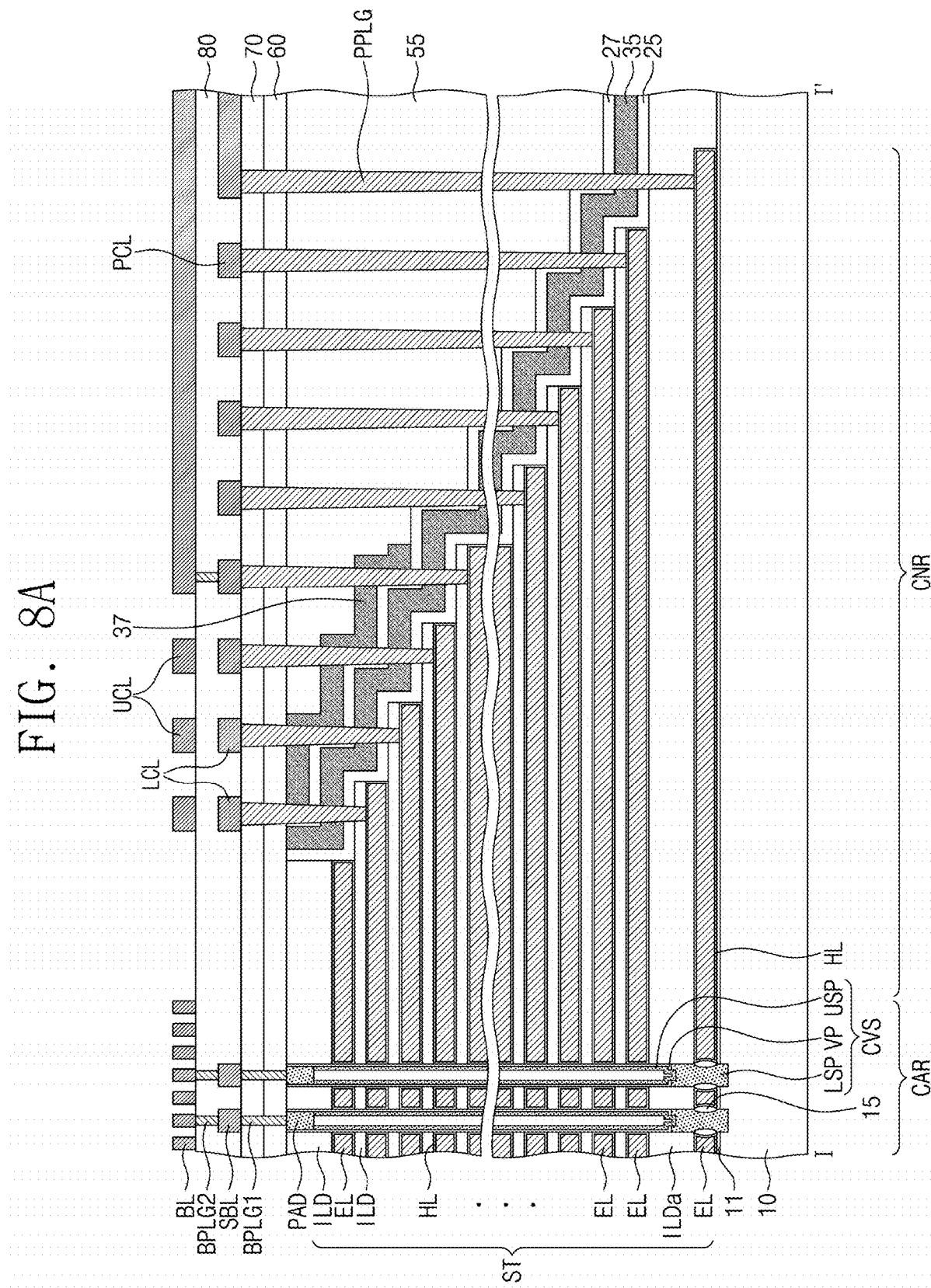
Figure 8B:
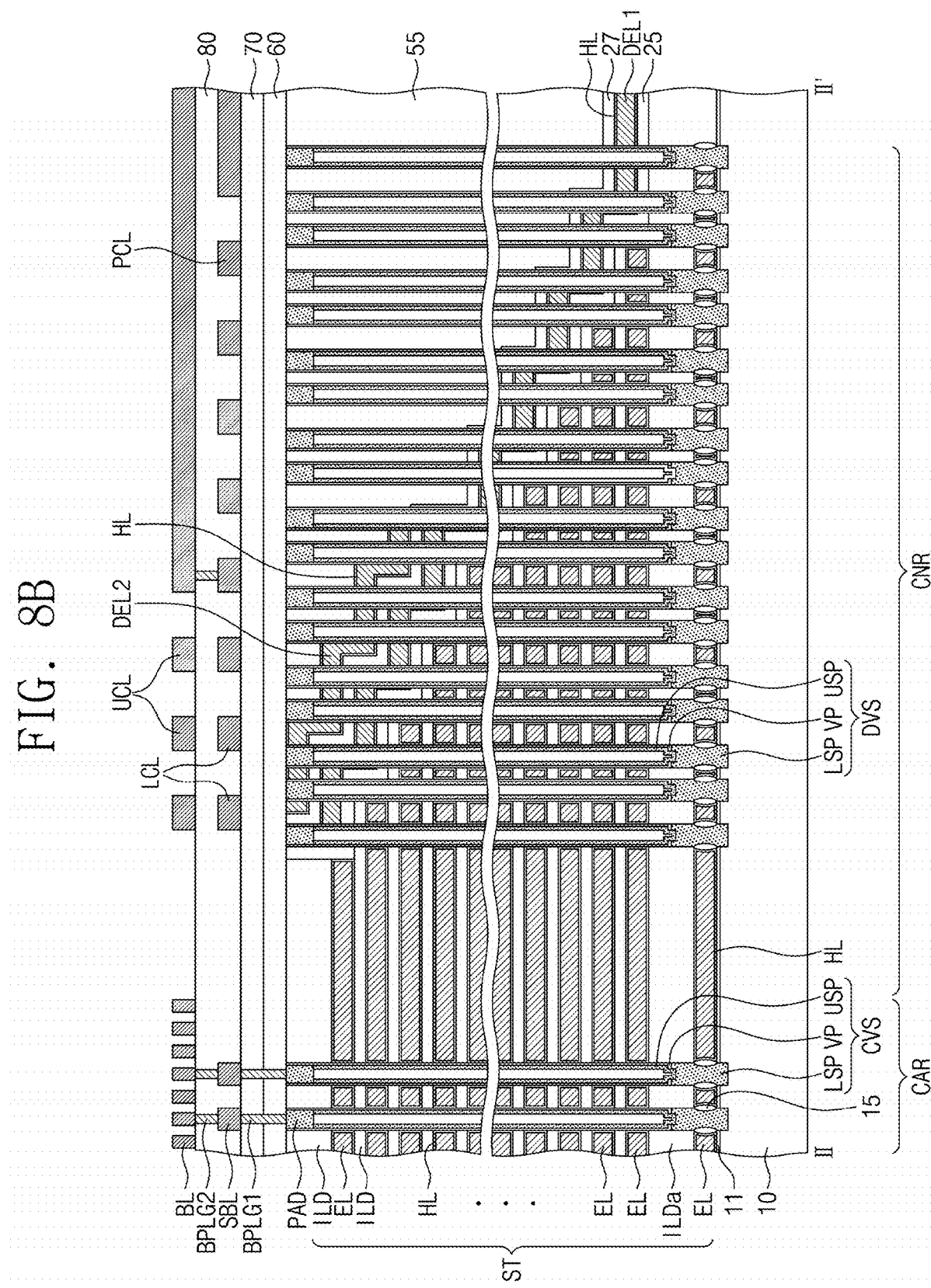

Referring to FIGS. 8A and 8B, the first and second etch stop patterns 35 and 37 may be sequentially disposed on the stepwise structure of the electrode structure ST, and the second etch stop pattern 37 may cover a portion of the first etch stop pattern 35.

The second etch stop pattern 37 may conformally cover an upper stepwise structure of the electrode structure ST. Thus, the cell contact plugs CPLG coupled to the electrodes EL at higher levels may penetrate the first and second etch stop patterns 35 and 37. The cell contact plugs CPLG coupled to the electrodes EL at lower levels may penetrate the first etch stop pattern 35.

Figure 9B:
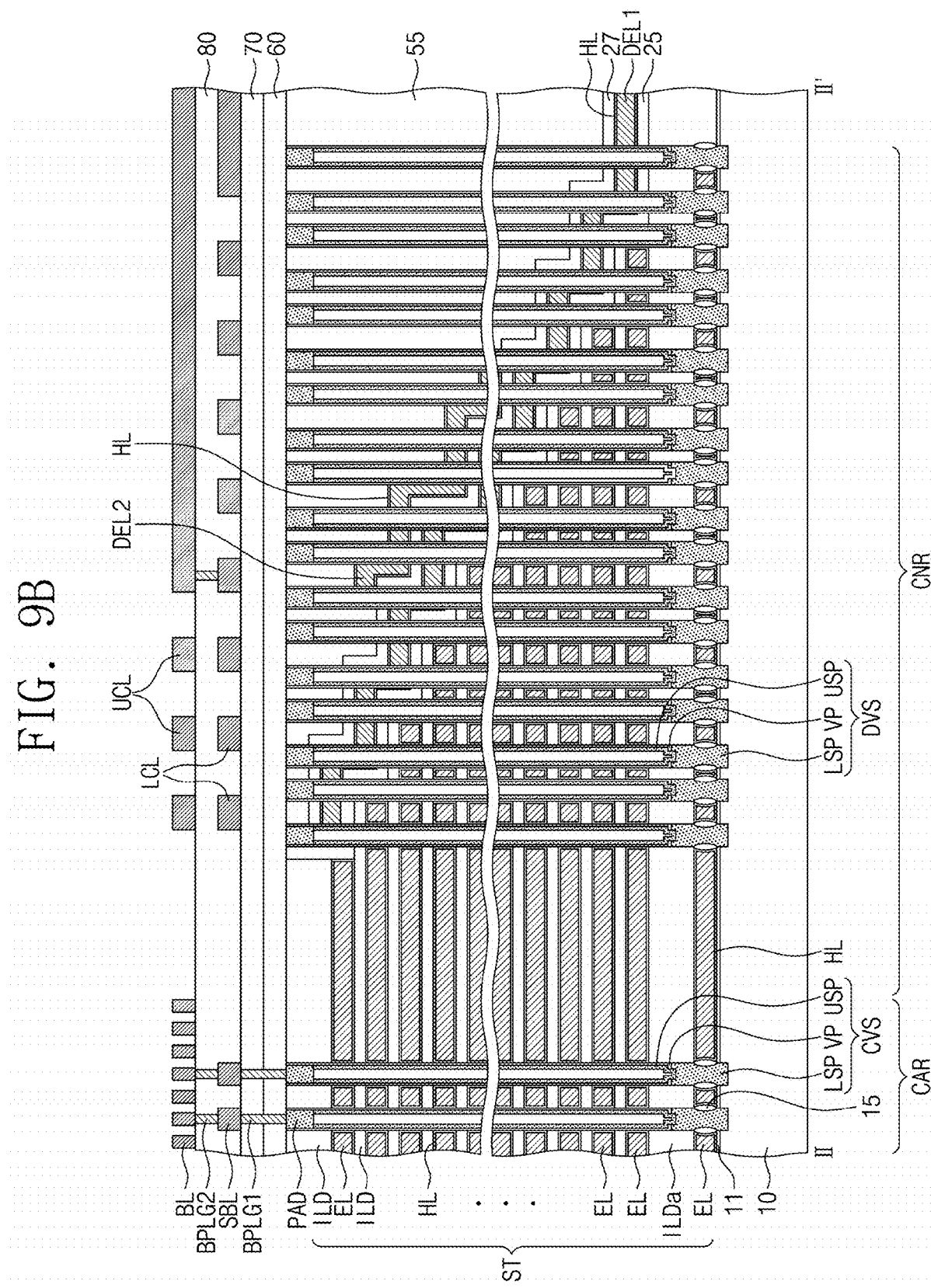

Referring to FIGS. 9A and 9B, the second etch stop pattern 35 may conformally cover an intermediate stepwise structure of the electrode structure ST. Thus, the cell contact plugs CPLG coupled to the electrodes EL at middle levels may penetrate the first and second etch stop patterns 35 and 37. The cell contact plugs CPLG coupled to the electrodes EL at higher and lower levels may penetrate the first etch stop pattern 35.

FIGS. 10A, 10B, 11A, 11B, 12A to 15A, 12B to 15B, and 12C to 15C illustrate cross-sectional views taken along lines I-I', II-II', and III-III' of FIG. 1A, showing a method of fabricating a three-dimensional semiconductor device according to some example embodiments of the present inventive concepts.

Figure 10B:
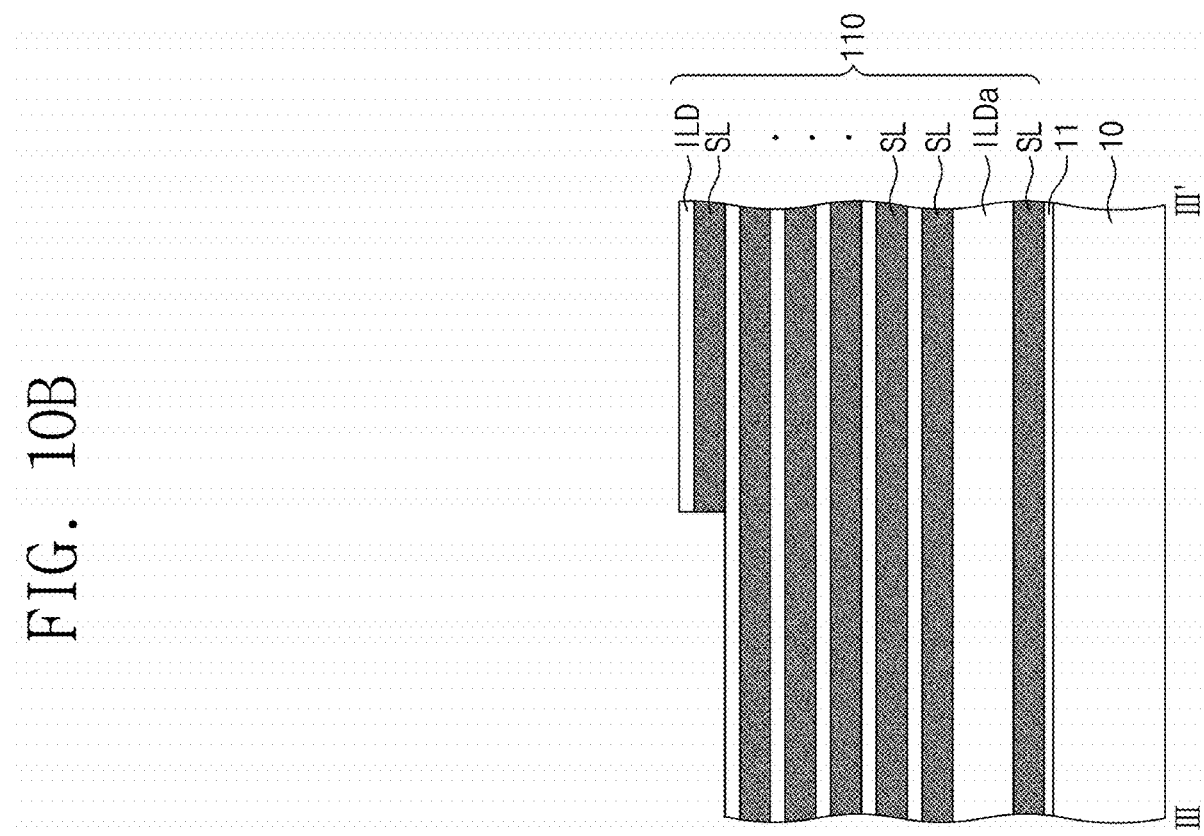

Referring to FIGS. 1A, 10A, and 10B, a substrate 10 may be provided that includes a cell array region CAR and a connection region CNR. A mold structure 110 may be formed to include sacrificial layers SL and dielectric layers ILD that are vertically and alternately stacked on the substrate 10. A polishing stop layer 111 and a dummy dielectric layer 113 may be sequentially formed on the mold structure 110. Optionally, a dielectric material such as silicon oxide may be provided to form a buffer dielectric layer 11 between the substrate 10 and the mold structure 110.

When the mold structure 110 is formed, the sacrificial layers SL may be made of a material having an etch selectivity with respect to the dielectric layers ILD. In certain embodiments, the sacrificial layers SL may include a dielectric material different from that of the dielectric layers ILD. For example, the sacrificial layers SL may be formed of a silicon nitride layer, and the dielectric layers ILD may be formed of a silicon oxide layer. The sacrificial layers SL may have substantially the same thickness, and the dielectric layers ILD may have different thicknesses depending on their positions.

In certain embodiments, the mold structure 110 may have a stepwise structure in which end portions of the dielectric layers ILD are exposed on the connection region CNR. For example, the formation of the mold structure 110 may include forming on an entire surface of the substrate 10 a thin-layer structure (not shown) in which the sacrificial layers SL and the dielectric layers ILD are vertically and alternately stacked, and then performing a stepwise patterning process on the thin-layer structure.

The stepwise patterning process may include forming a mask pattern (not shown) to cover the thin-layer structure on the cell array region CAR and the connection region CNR, and then alternately performing a process to partially etch the thin-layer structure and a process to reduce a horizontal area of the mask pattern. The stepwise patterning process may provide the mold structure 110 with a stepwise structure along a first direction D1 on the connection region CNR.

A slope of the stepwise structure formed along the first direction D1 may depend on the number of the sacrificial layers SL etched when the thin-layer is partially etched in the stepwise patterning process. When two or more sacrificial layers SL are etched when the thin-layer is partially etched, after the stepwise patterning process, a pad etching process may be performed in which the mold structure 110 is partially etched on the connection region CNR. The pad etching process may provide the mold structure 110 with stair-steps in a second direction D2.

Figure 11A:
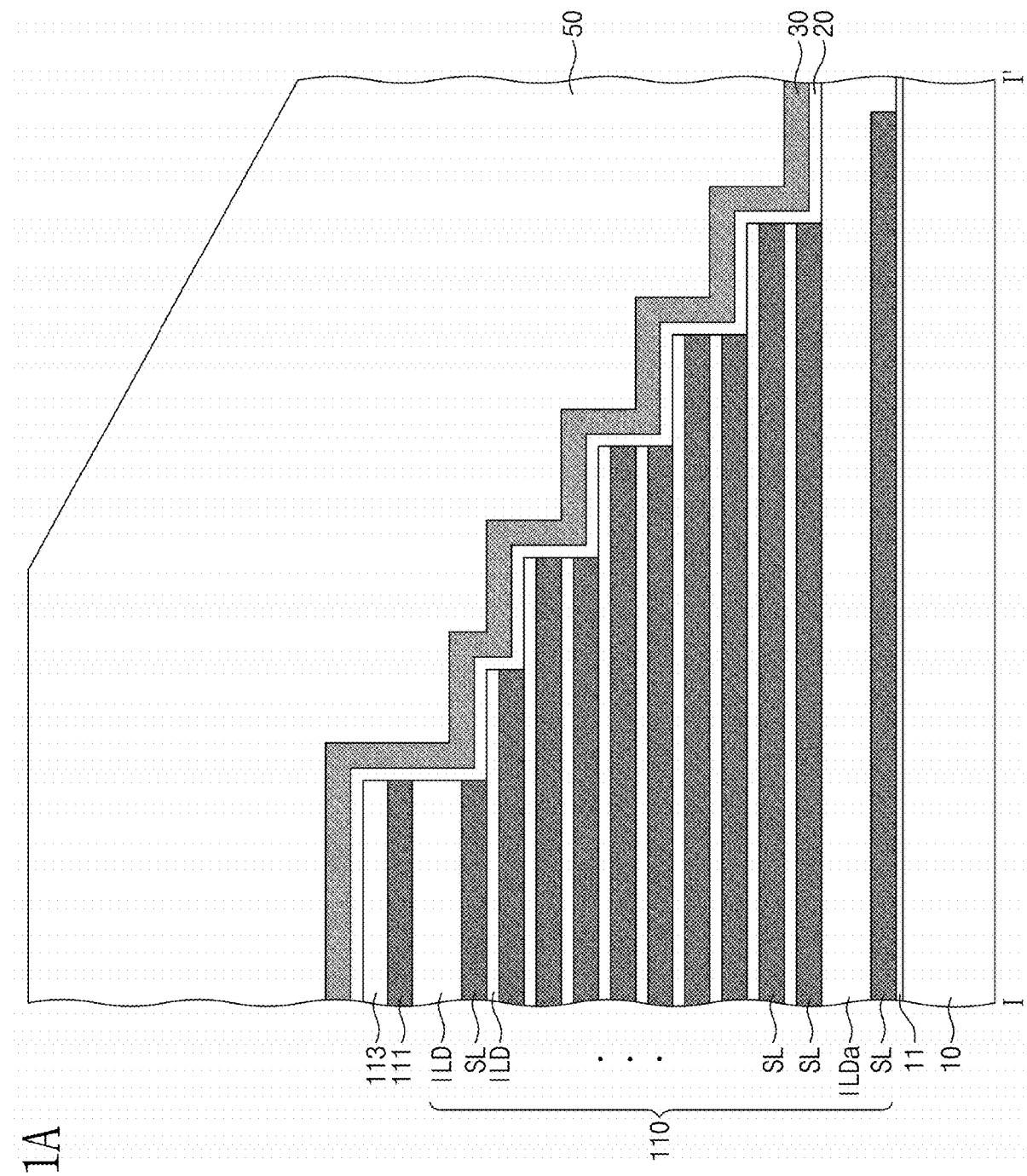
Figure 11B:
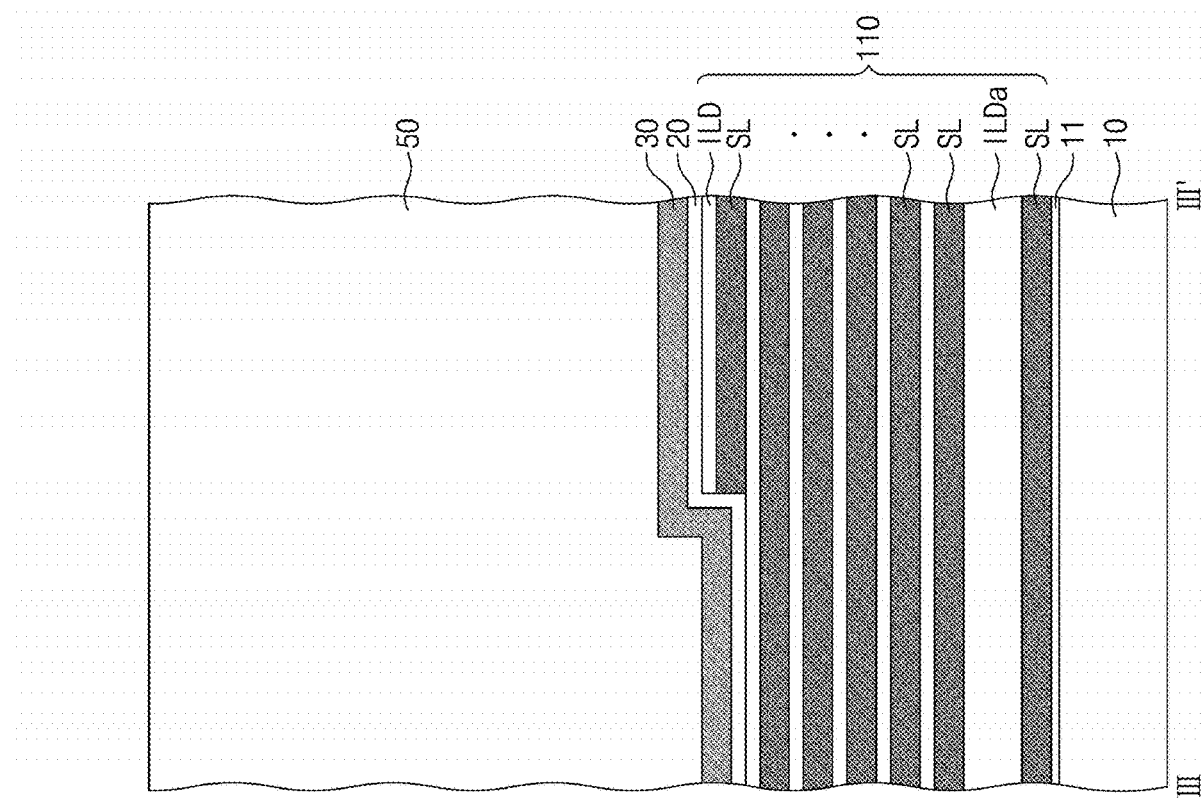
Figure 12A:
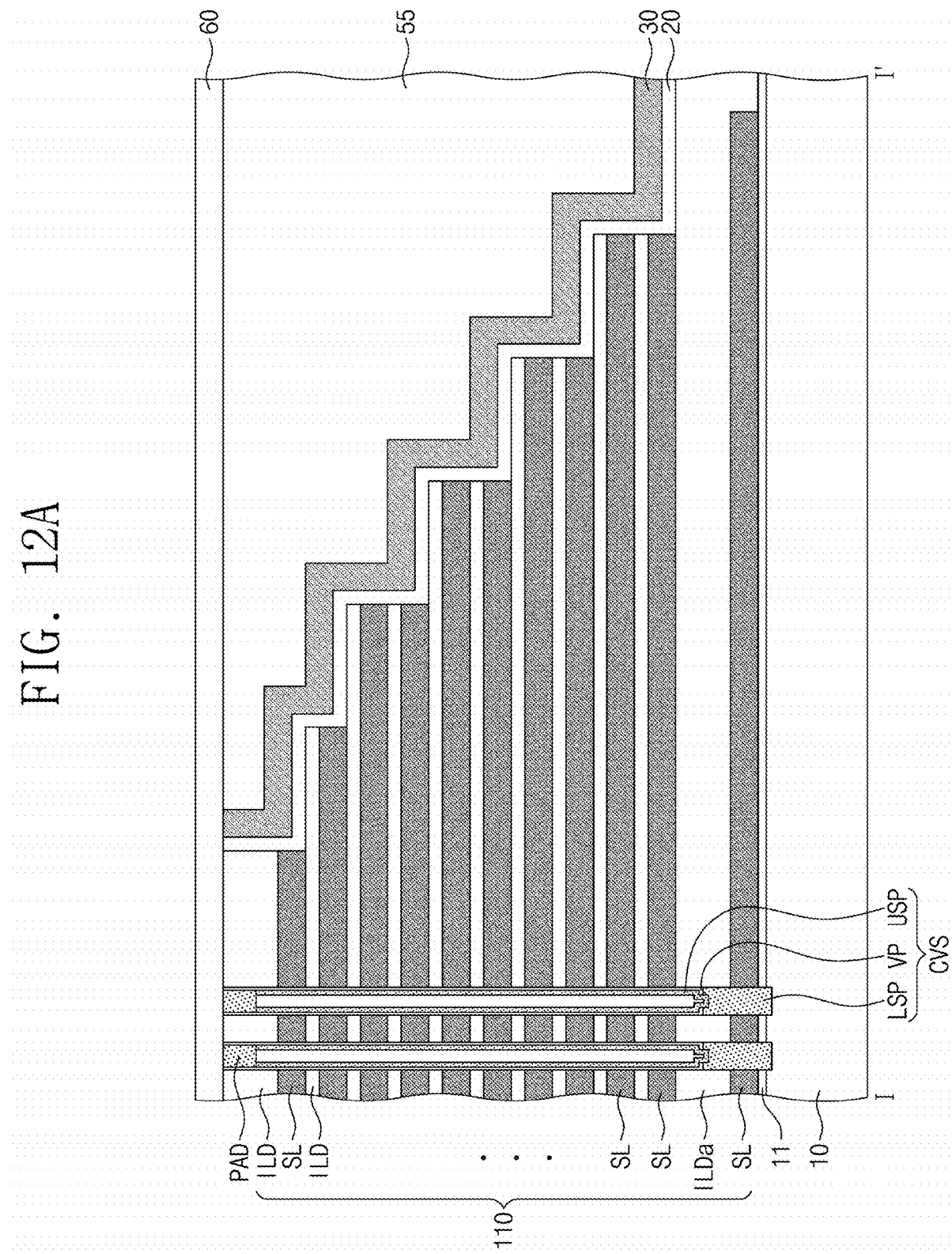
Figure 12B:
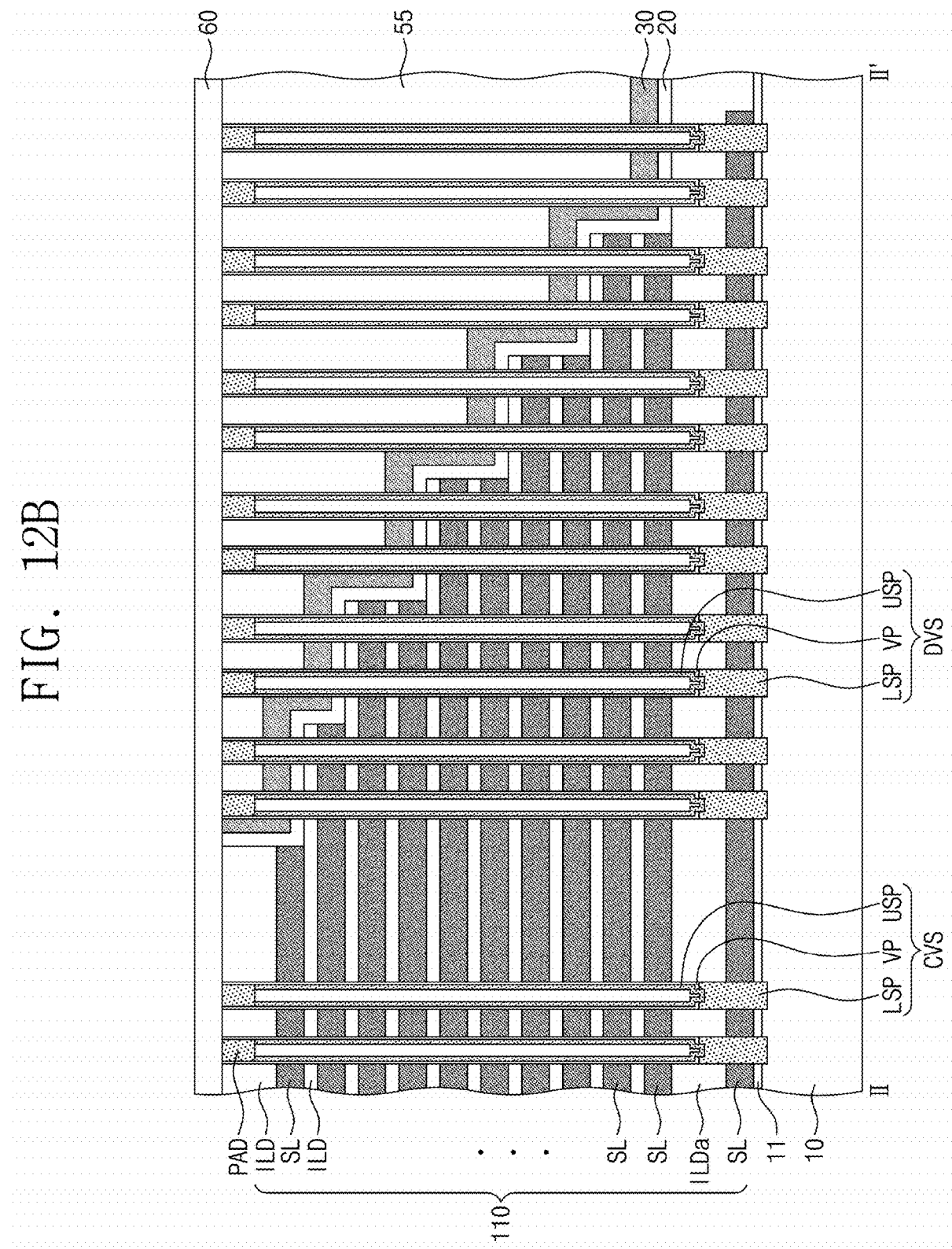
Figure 13A:
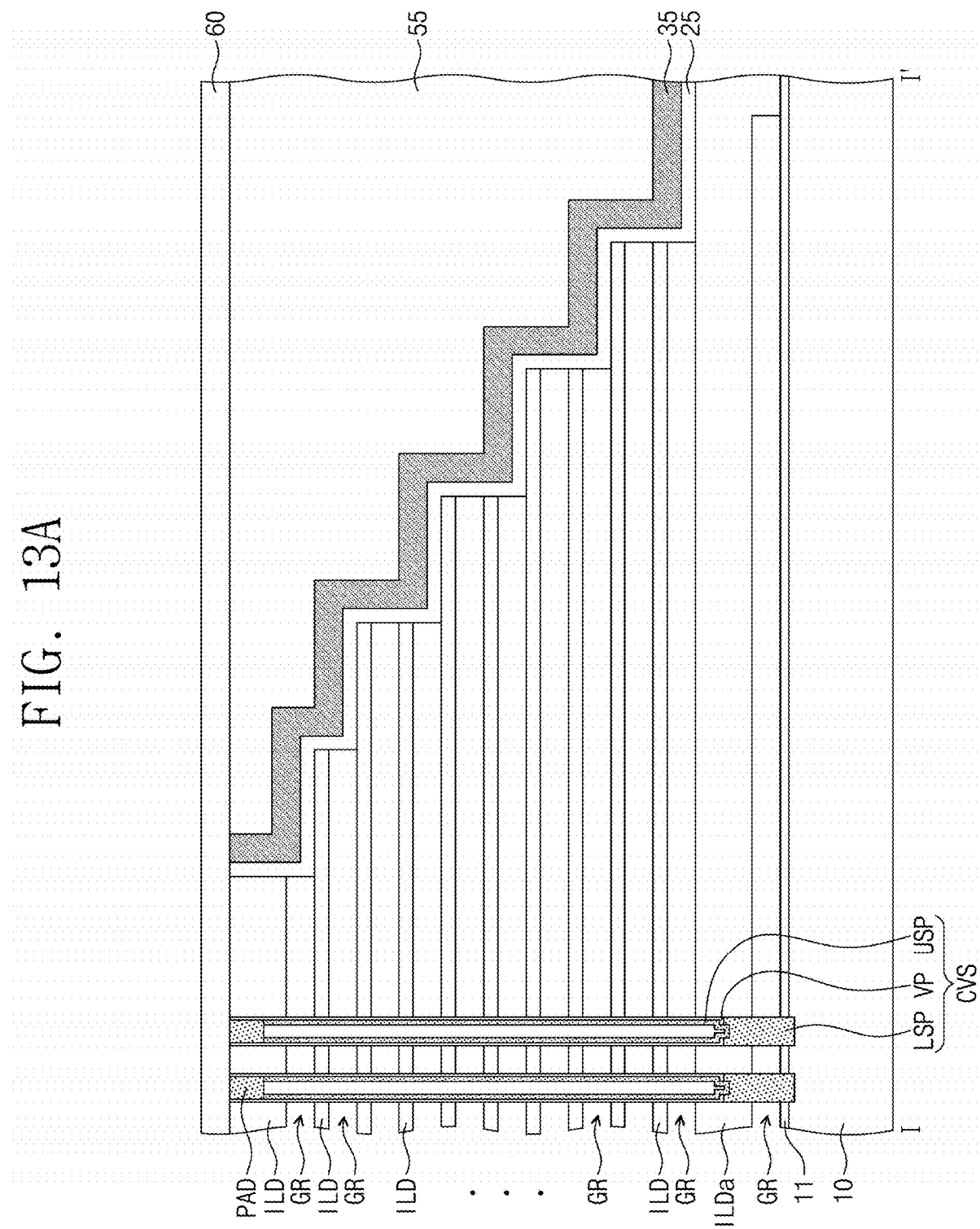
Figure 13B:
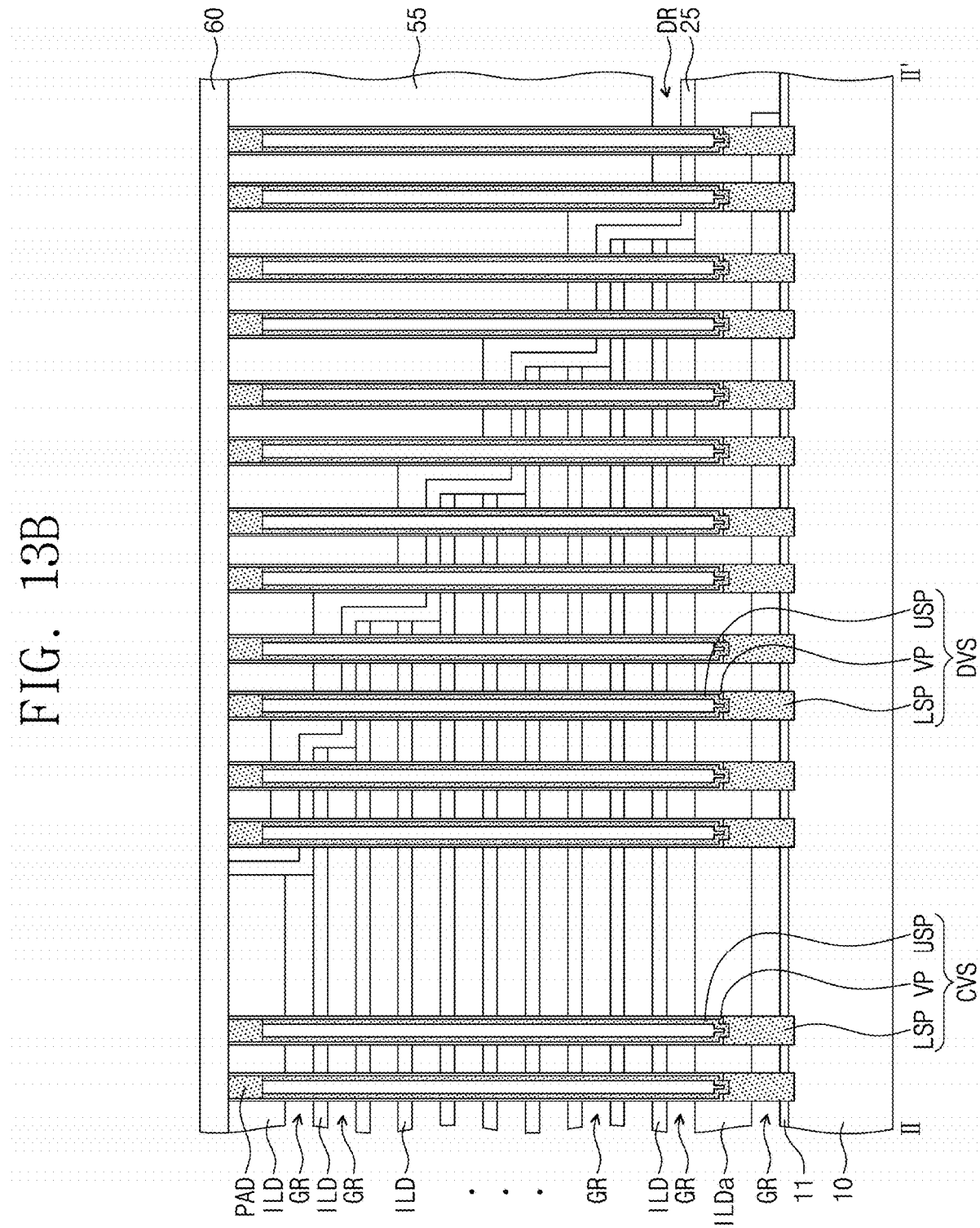
Figure 13C:
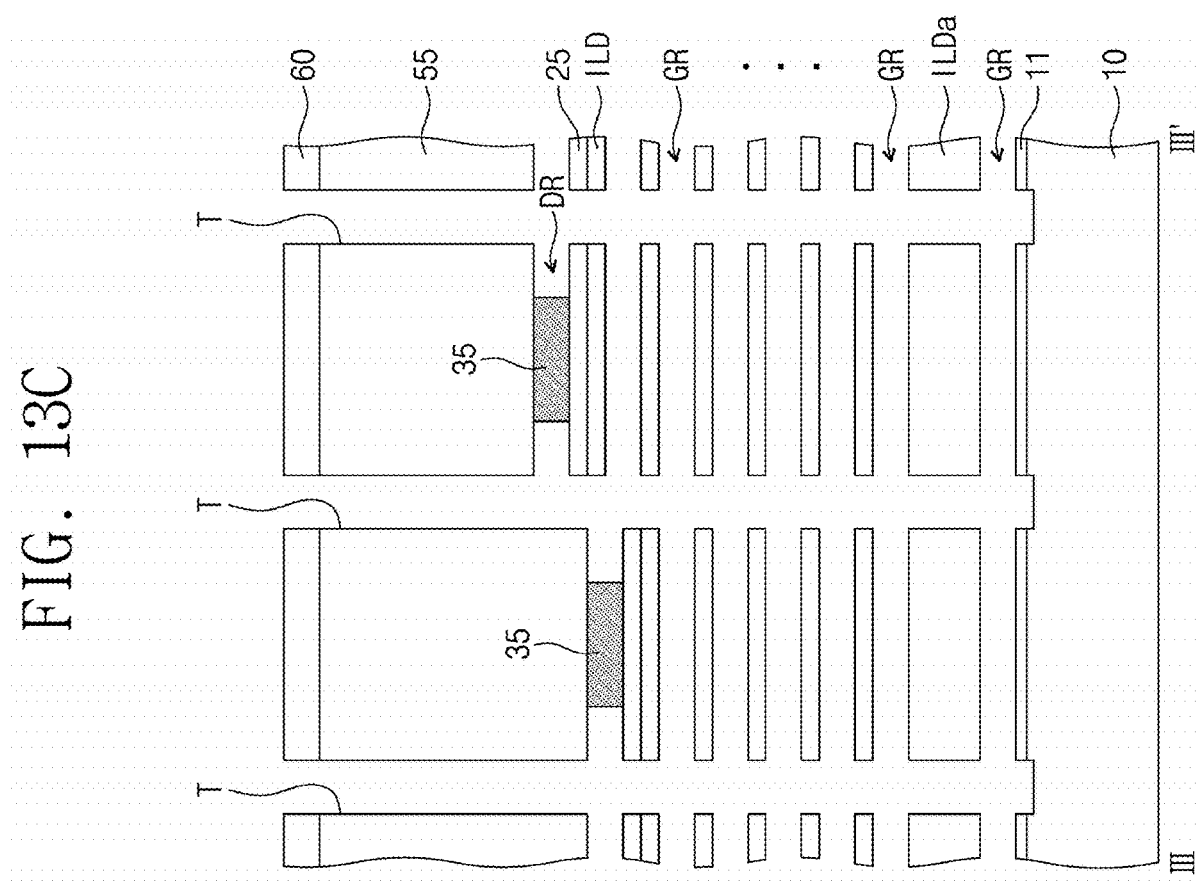
Figure 14A:
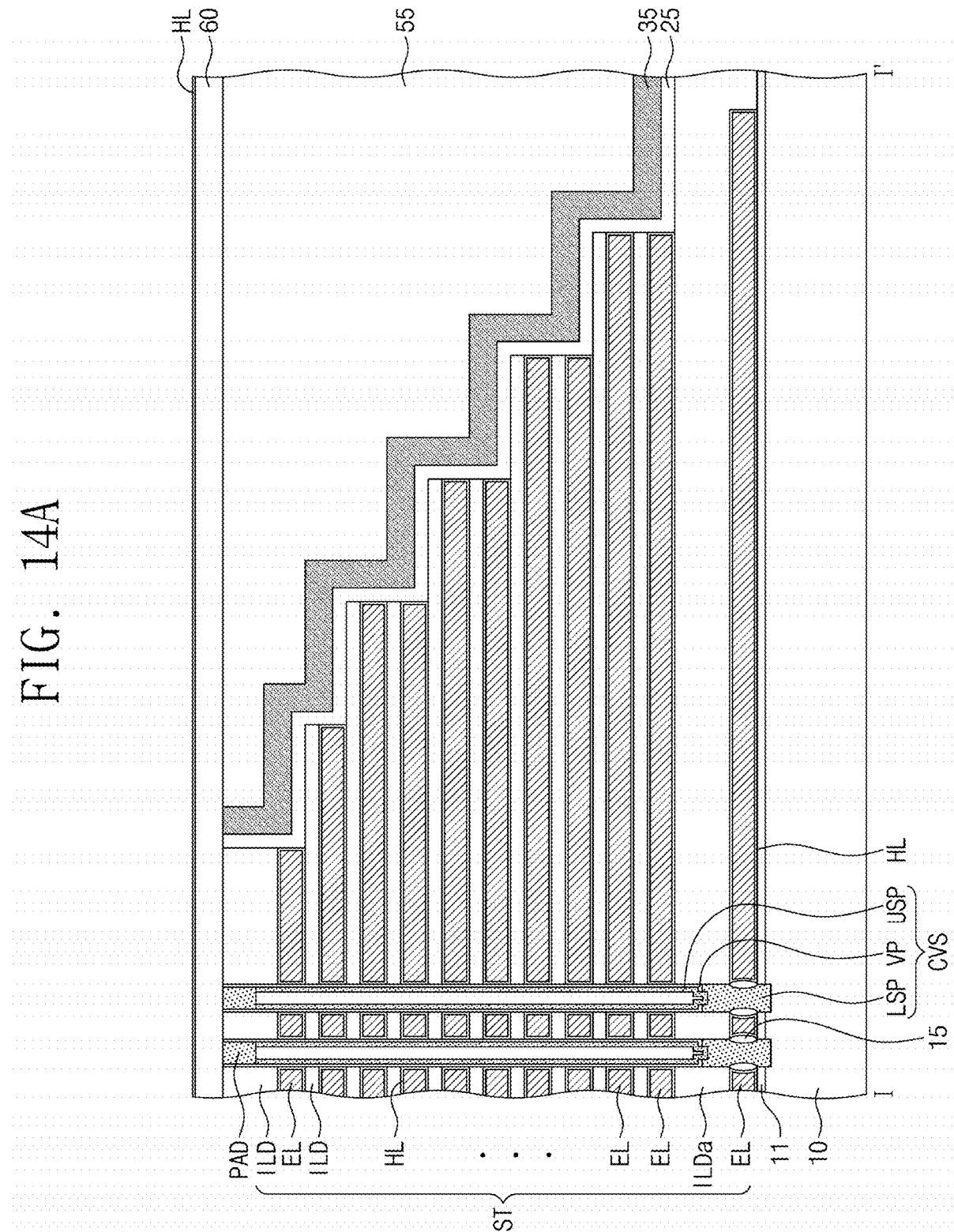
Figure 14B:
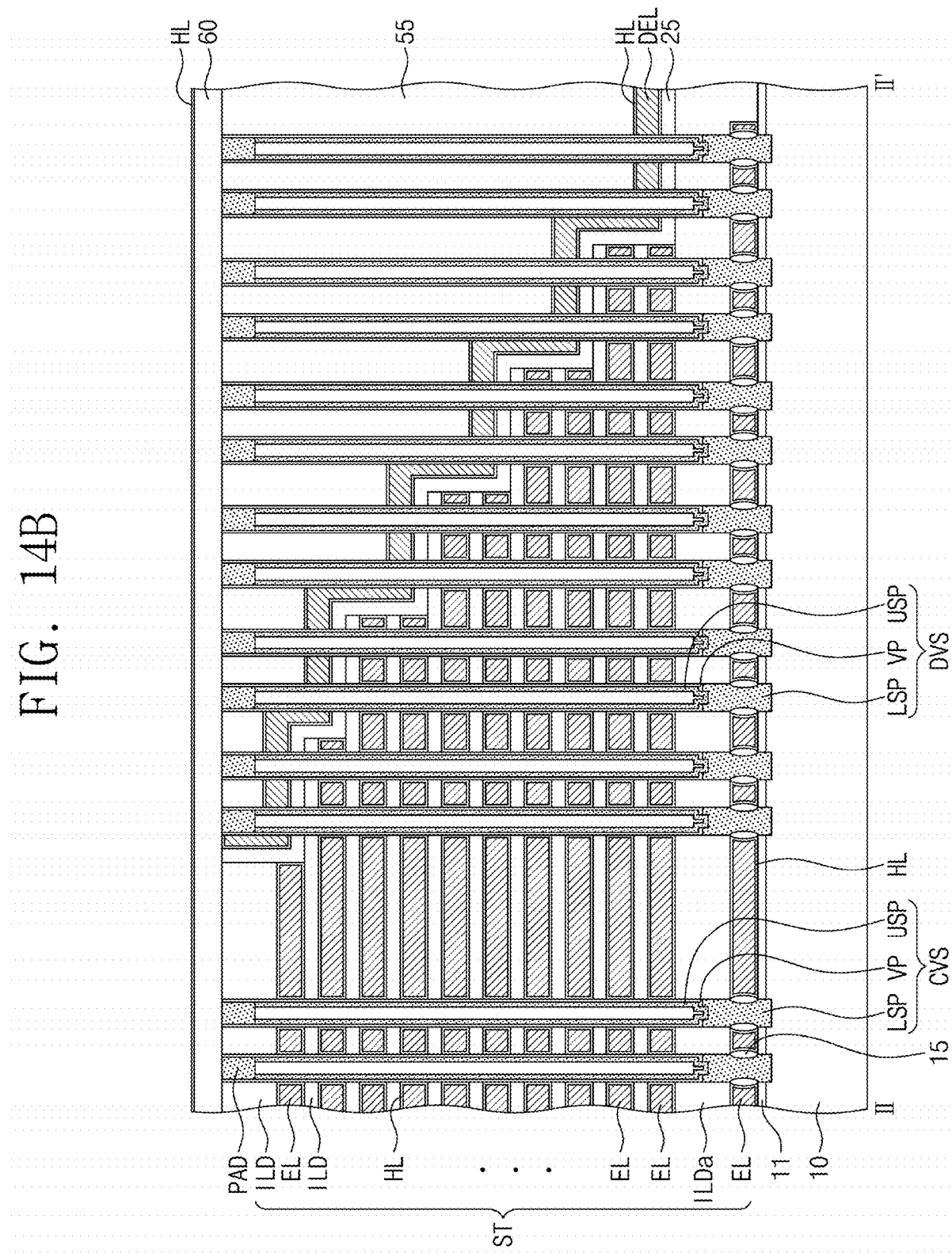
Figure 14C:
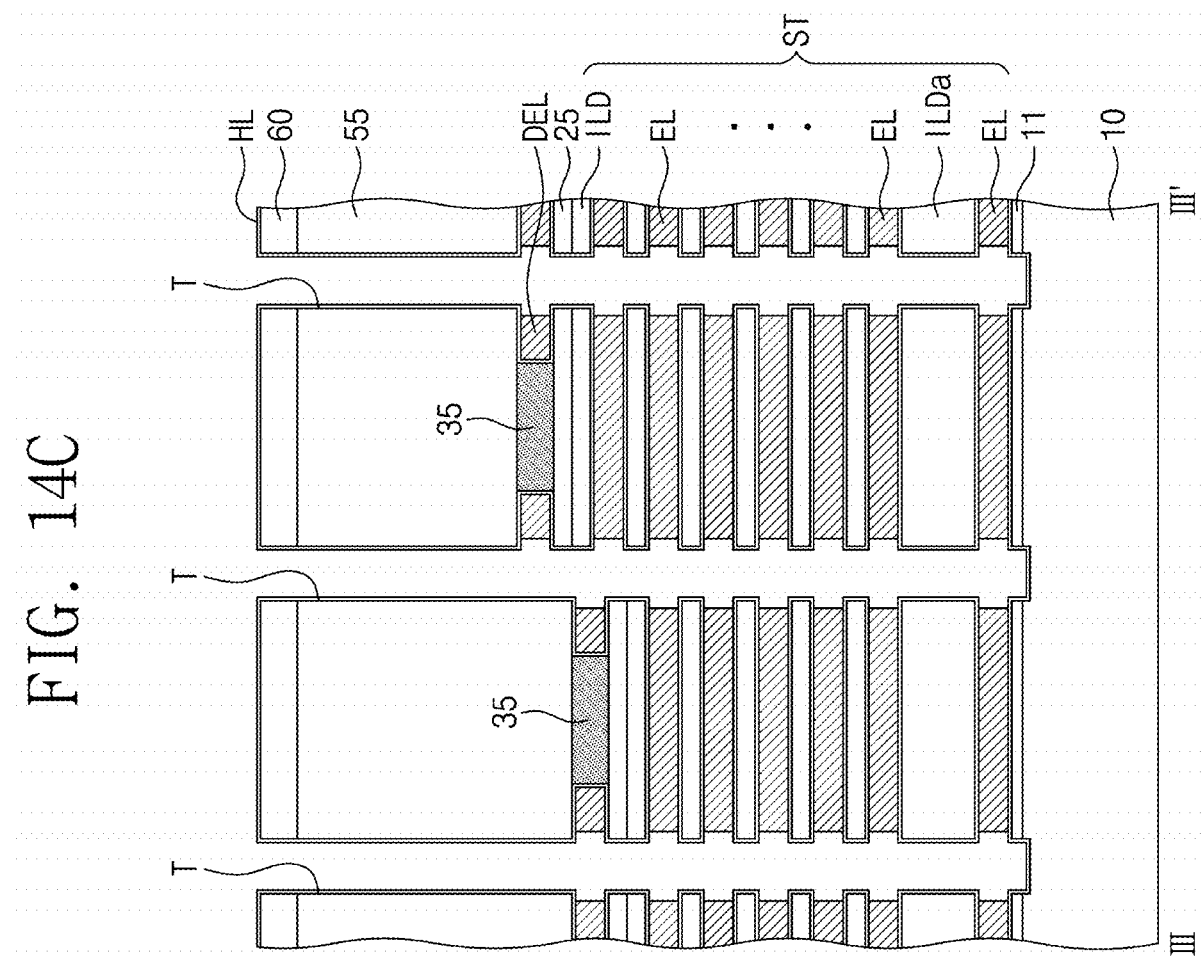
Figure 15A:
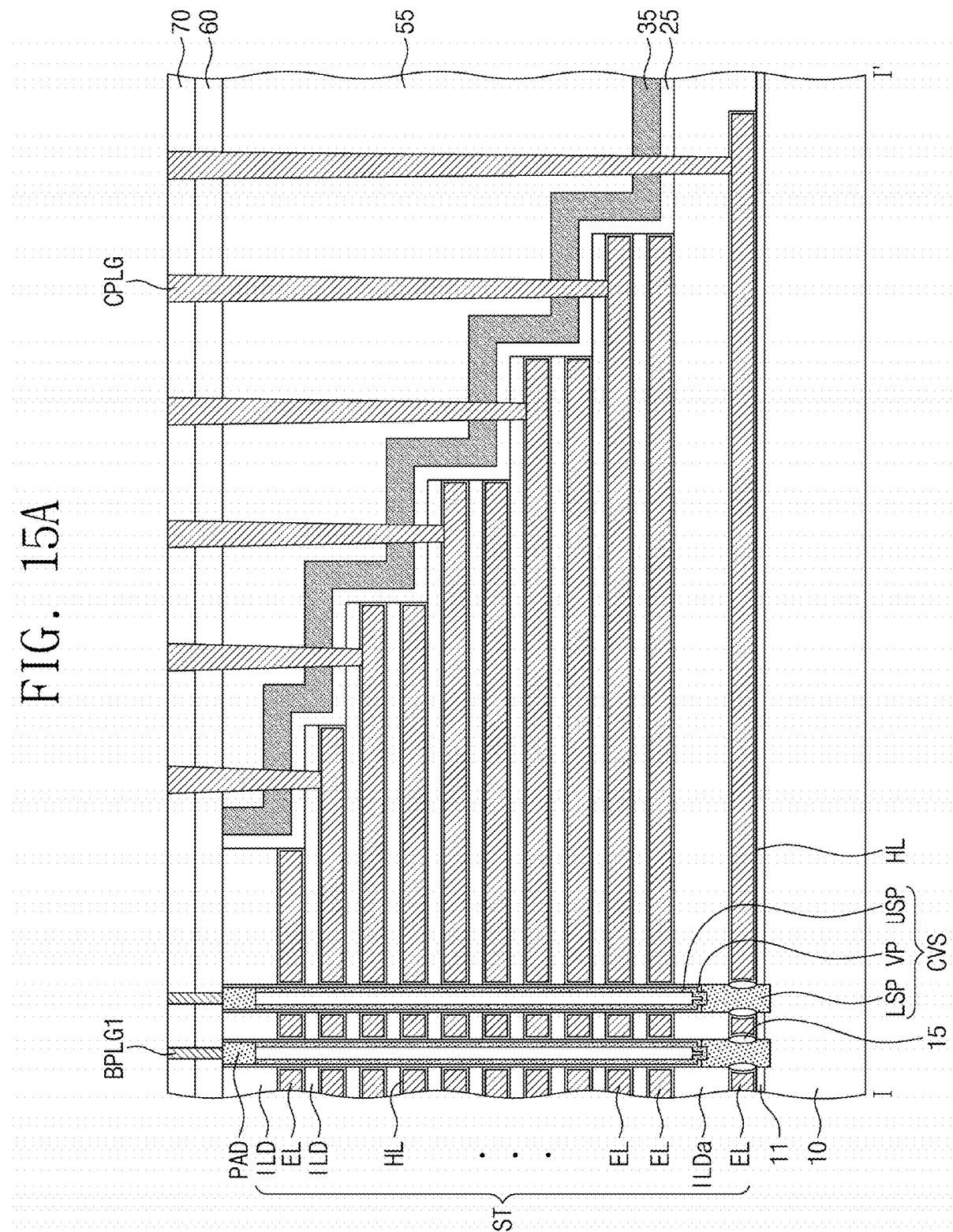
Figure 15B:
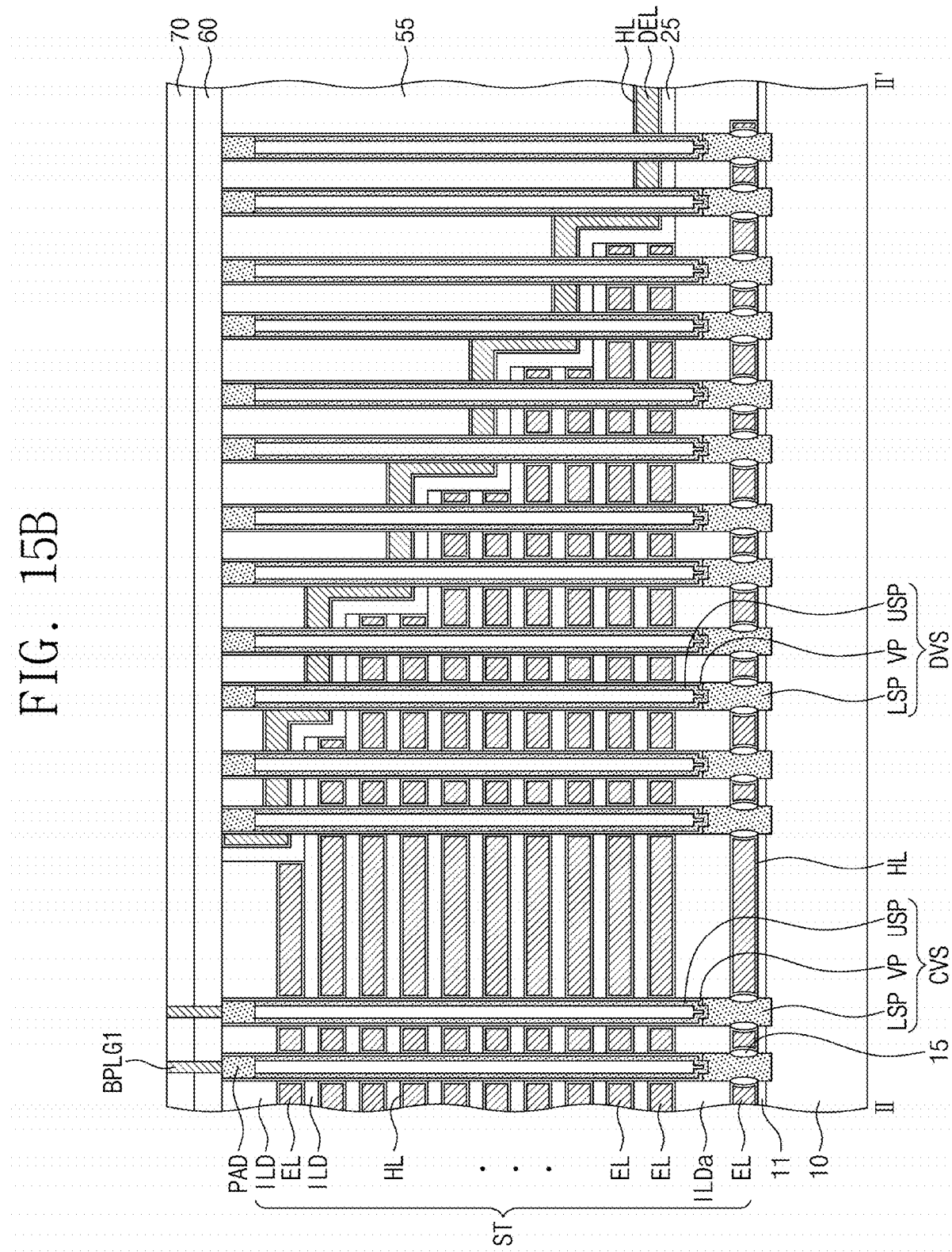
Figure 15C:
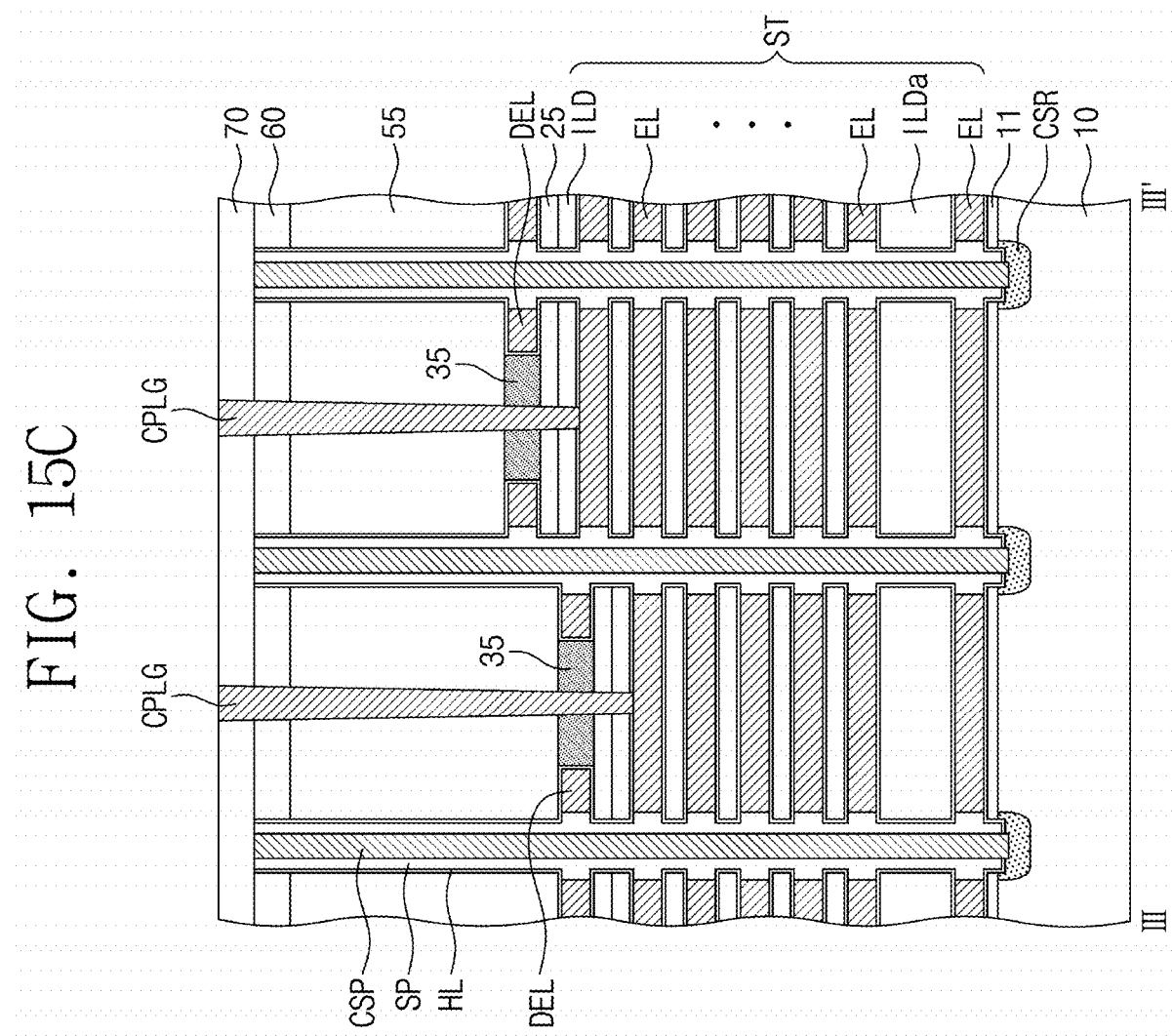

Referring to FIGS. 1A, 11A, and 11B, a pad dielectric layer 20 and an etch stop layer 30 may be sequentially formed to conformally cover the mold structure 110.

The pad dielectric layer 20 may include a dielectric material, such as a silicon oxide layer, having an etch selectivity with respect to the sacrificial layers SL.

The etch stop layer 30 may include a dielectric material having an etch selectivity with respect to the pad dielectric layer 20 and the dielectric layers ILD of the mold structure 110. The etch stop layer 30 may have a thickness identical to or less than that of each of the sacrificial layers SL. The etch stop layer 30 may include a material having an etch selectivity to the sacrificial layers SL and the dielectric layers ILD. The etch stop layer 30 and the sacrificial layers SL may include the same material, but may have different etch rates under the same etching condition. The etch stop layer 30 may have the same material as that of the sacrificial layers SL, but may have a different composition from that of the sacrificial layers SL. The etch stop layer 30 may be deposited under a different etching condition from that of the sacrificial layers SL, and thus may have an etch selectivity with respect to the sacrificial layers SL. The etch stop layer 30 may include, for example, a silicon nitride layer or a silicon oxynitride layer.

A buried dielectric layer 50 may be formed on the etch stop layer 30. The buried dielectric layer 50 may be deposited to have a thickness greater than that of the mold structure 110. The buried dielectric layer 50 may include a dielectric material having an etch selectivity with respect to the etch stop layer 30. The buried dielectric layer 50 may be formed of, for example, a silicon oxide layer.

Referring to FIGS. 1A, 12A, 12B, and 12C, the buried dielectric layer 50 may undergo a planarization process to form a planarized buried dielectric layer 55. The planarization process may include a chemical mechanical polishing (CMP) process and an etching process, and the polishing stop layer 111 on the cell array region CAR may be used as a polishing end point. After the planarization process, the planarized buried dielectric layer 55 may have a substantially flat top surface on the connection region CNR.

During the formation of the planarized buried dielectric layer 55, the etch stop layer 30 and the pad dielectric layer 20 may be partially removed on the cell array region CAR. Although an example is explained in which the etch stop layer 30 and the pad dielectric layer 20 are partially removed on the cell array region CAR during the formation of the planarized buried dielectric layer 55, the etch stop layer 30 may be used as a polishing stop layer on the cell array region CAR when the planarization process is performed on the buried dielectric layer 50.

After the planarized buried dielectric layer 55 is formed, cell vertical structures CVS and dummy vertical structures DVS may be formed.

On the cell array region CAR, the cell vertical structures CVS may penetrate the mold structure 110 and the buffer dielectric layer 11, and on the connection region CNR, the dummy vertical structures DVS may penetrate the planarized buried dielectric layer 55, the etch stop layer 30, the pad dielectric layer 20, and the mold structure 110. The dummy vertical structures DVS and the cell vertical structures CVS may be formed at the same time and may have substantially the same structure.

For example, the formation of the cell and dummy vertical structures CVS and DVS may include forming vertical holes to penetrate the planarized buried dielectric layer 55, the etch stop layer 30, the pad dielectric layer 20, the mold structure 110, and the buffer dielectric layer 11 and to expose the substrate 10, and then forming a lower semiconductor pattern LSP and an upper semiconductor pattern USP in each of the vertical holes.

In certain embodiments, because the pad dielectric layer 20 includes the same material as that of the dielectric layers ILD of the mold structure 110, and because the etch stop layer 30 includes the same material as that of the sacrificial layers SL of the mold structure 110, the same etching process may be performed on the cell array region CAR and the connection region CNR when an anisotropic etching process is performed to form the vertical holes.

The lower semiconductor pattern LSP may be formed by performing a selective epitaxial growth (SEG) process in which the substrate 10 exposed to the vertical holes is served as a seed layer. The upper semiconductor pattern USP may be formed by depositing a semiconductor layer in the vertical holes in which the lower semiconductor pattern LSP is formed, and may be in contact with the lower semiconductor pattern LSP.

Before the upper semiconductor pattern USP is formed, a vertical dielectric pattern VP may be formed in the vertical holes. The vertical dielectric pattern VP may be a portion of a data storage layer.

A bit line contact pad PAD may be formed on a top end of the upper semiconductor pattern USP. The bit line contact pad PAD may be an impurity doped region or may be formed of a conductive material.

After the cell and dummy vertical structures CVS and DVS are formed, a first interlayer dielectric layer 60 may be formed on the planarized buried dielectric layer 55, covering top surfaces of the cell and dummy vertical structures CVS and DVS. The first interlayer dielectric layer 60, the planarized buried dielectric layer 55, the etch stop layer 30, the pad dielectric layer 20, and the mold structure 110 may be patterned to form line-shaped trenches T. The trenches T may extend in the first direction D1 and may be spaced apart from each other in the second direction D2 intersecting the first direction D1. The trenches T may include first trenches extending from the cell array region CAR toward the connection region CNR, second trenches between the first trenches on the cell array region CAR, and third trenches between the first trenches on the connection region CNR. The third trenches may be spaced apart in the first direction D1 from the second trenches.

The formation of the trenches T may allow the mold structure 110 to have a linear shape extending in the first direction D1 when viewed in plan. The trenches T may be spaced apart from the cell and dummy vertical structures CVS and DVS, and may expose sidewalls of the sacrificial layers SL, sidewalls of the pad dielectric pattern 25, and sidewalls of the etch stop layer 30.

Referring to FIGS. 1A, 13A, 13B, and 13C, the sacrificial layers SL exposed to the trenches T may be removed to form gate regions GR between the dielectric layers ILD vertically adjacent to each other. The gate regions GR may be formed by isotropically etching the sacrificial layers SL using an etching recipe having an etch selectivity with respect to the dielectric layers ILD. For example, when the sacrificial layers SL are silicon nitride layers and the dielectric layers ILD are silicon oxide layers, an etchant including phosphoric acid may be used to isotropically etch the sacrificial layers SL to form the gate regions GR.

In certain embodiments, the sacrificial layers SL and the etch stop layer 30 have different etch rates when an isotropic etching process is performed to remove the sacrificial layers SL, the etch stop layer 30 may be partially removed when the sacrificial layers SL are completely removed. Therefore, an etch stop pattern 35 may be formed between the planarized buried dielectric layer 55 and the pad dielectric pattern 25, and dummy gate regions DR may be formed on opposing sides of the etch stop pattern 35 between the planarized buried dielectric layer 55 and the pad dielectric pattern 25. When the etch stop layer 30 is partially etched by the isotropic etching process, the etch stop pattern 35 may have a rounded sidewall.

The dummy gate regions DR may be exposed portions of the dummy vertical structures DVS. When the dummy gate regions DR are formed, an etching amount of the etch stop layer 30 may be different depending on a level at which the etch stop layer 30 is located from a top surface of the substrate 10. Thus, as shown in FIG. 1B, the etch stop pattern 35 may have a width that varies depending on the level from the substrate 10.

Referring to FIGS. 1A, 14A, 14B, and 14C, a horizontal blocking layer HBLK may be formed to conformally cover inner walls of the gate regions GR, and a horizontal dielectric layer HL may be formed to conformally cover inner walls of the dummy gate regions DR. For example, the horizontal blocking dielectric layer HBLK may surround the cell and dummy vertical structures CVS and DVS, and the horizontal dielectric layer HL may cover the sidewall of the etch stop pattern 35.

The horizontal blocking dielectric layer HBLK and the horizontal dielectric layer HL may be composed of a single thin layer or a plurality of thin layers. In certain embodiments, the horizontal blocking dielectric layer HBLK and the horizontal dielectric layer HL may be a portion of a data storage layer included in NAND Flash memory devices. For example, the horizontal blocking dielectric layer HBLK and the horizontal dielectric layer HL may include a high-k dielectric layer such as an aluminum oxide layer or a hafnium oxide layer. The horizontal blocking dielectric layer HBLK and the horizontal dielectric layer HL may be formed by chemical vapor deposition or atomic layer deposition.

A gate conductive layer may be formed in the gate regions GR and the dummy gate regions DR in each of which the horizontal blocking dielectric layer HBLK and the horizontal dielectric layer HL are formed. The gate conductive layer may completely fill the gate regions GR, and partially or completely fill the dummy gate regions DR. In addition, the gate conductive layer may partially or completely fill the trenches T. For example, the formation of the gate conductive layer may include sequentially depositing a barrier metal layer and a metal layer. The barrier metal layer may consist of a metal nitride layer such as TiN, TaN, or WN. The metal layer may consist of a metallic material such as W, Al, Ti, Ta, Co, or Cu.

The gate conductive layer formed in the trenches T may be partially removed to locally form electrode EL in the gate regions GR and to locally form dummy conductive patterns DEL in the dummy gate regions DR. The dummy gate patterns DEL may surround portions of the dummy vertical structures DVS.

For example, the electrodes EL and the dummy conductive patterns DEL may be formed by anisotropically etch the gate conductive layer deposited in the trenches T. For another example, the electrodes EL and the dummy conductive patterns DEL may be formed by isotropically etch the gate conductive layer deposited in the trenches T. When the gate conductive layer is etched, the horizontal blocking dielectric layer HBLK and the horizontal dielectric layer HL may be uses as an etch stop layer, and the formation of the electrodes EL and the dummy conductive patterns DEL may allow the trench T to expose the horizontal dielectric layer HL deposited on sidewalls of the dielectric layers ILD. The electrodes EL and the dummy conductive patterns DEL may have their sidewalls that are recessed more than sidewalls of the dielectric layers ILD.

The partial removal of the gate conductive layer from the trench T may form an electrode structure ST in which the dielectric layers ILD and the electrodes EL are alternately and repeatedly stacked. In addition, the dummy conductive patterns DEL may be formed on opposing sides of the etch stop pattern 35.

Referring to FIGS. 1A, 15A, 15B, and 15C, a sidewall spacer SP may be formed in the trenches T, covering sidewalls of the electrode structure ST and sidewalls of the dummy conductive patterns DEL.

The formation of the sidewall spacer SP may include depositing a spacer layer to have a uniform thickness on the substrate 10 and the sidewalls of the electrode structure ST, and then performing an etch-back process on the spacer layer to expose the substrate 10. The sidewall spacer layer may be formed of a dielectric material such as silicon oxide, silicon nitride, silicon oxynitride, or low-k dielectric having a low dielectric constant.

After the sidewall spacer SP is formed to expose the substrate 10, common source regions CSR may be formed in the substrate 10. The common source regions CSR may extend in parallel in the first direction D1 and may be spaced apart from each other in the second direction D2. The common source regions CSR may be formed by doping the substrate 10 with impurities whose conductive type is different from that of the substrate 10. The common source regions CSR may include, for example, N-type impurities (e.g., arsenic (As) or phosphorous (P)).

A common source plug CSP may be formed in each trench T in which the sidewall spacer SP is formed. The common source plug CSP may be formed by depositing a conductive layer to fill the trench T in which the sidewall spacer SP is formed and then performing a planarization process until the first interlayer dielectric layer 60 is exposed. The common source plug CSP may extend in the first direction D1 parallel to the electrode structure ST, and may connect with the common source region CSR. Instead of the formation of the common source plug CSP, a dielectric material may completely fill the trench T in which the sidewall spacer SP is formed.

A second interlayer dielectric layer 70 may be formed on the first interlayer dielectric layer 60, covering the common source plugs CSP.

After the second interlayer dielectric layer 70 is formed, first bit line contact plugs BPLG1 may be formed to penetrate the first and second interlayer dielectric layers 60 and 70 and to connect with corresponding cell vertical structures CVS. On the connection region CNR, cell contact plugs CPLG may be formed to connect with corresponding electrodes EL. The cell contact plugs CPLG may penetrate the first and second interlayer dielectric layers 60 and 70, the planarized buried dielectric layer 55, the etch stop pattern 35, and the pad dielectric pattern 25. The cell contact plugs CPLG may be disposed between a plurality of the dummy vertical structures DVS and spaced apart from the dummy conductive patterns DEL.

When the cell contact plugs CPLG are formed, the first and second interlayer dielectric layers 60 and 70, the planarized buried dielectric layer 55, the etch stop pattern 35, and the pad dielectric pattern 25 may be patterned to form contact holes that expose ends of the electrodes EL. The contact holes may be formed using an anisotropic etching process, which anisotropic etching process may be performed to expose the etch stop pattern 35. When the contact holes having different vertical lengths are formed at the same time, the etch stop pattern 35 may reduce or prevent the electrode EL from being penetrated by one or more of the contact holes.

In certain embodiments, when the contact holes are formed to expose a lowermost electrode EL, the etch stop pattern 35 may reduce or prevent an uppermost electrode EL from being first exposed to the contact hole and plasma-etched.

After the formation of the contact holes having different vertical lengths and exposing the etch stop pattern 35, the etch stop pattern 35 exposed to the contact hole, the pad dielectric pattern 25, and the horizontal dielectric layer HL may be physically over-etched. Thus, the contact holes may be formed to expose corresponding ends of the electrodes EL. The contact holes may be filled with a conductive material to form the cell contact plugs CPLG.

Thereafter, as discussed with reference to FIGS. 2A, 2B, 2C, and 2D, subsidiary bit lines SBL may be formed on the cell array region CAR, and lower connection lines LCL may be formed on the connection region CNR. A third interlayer dielectric layer 80 may be formed on the second interlayer dielectric layer 70, and bit lines BL and upper connection lines UCL may be formed on the third interlayer dielectric layer 80.

Figure 16:
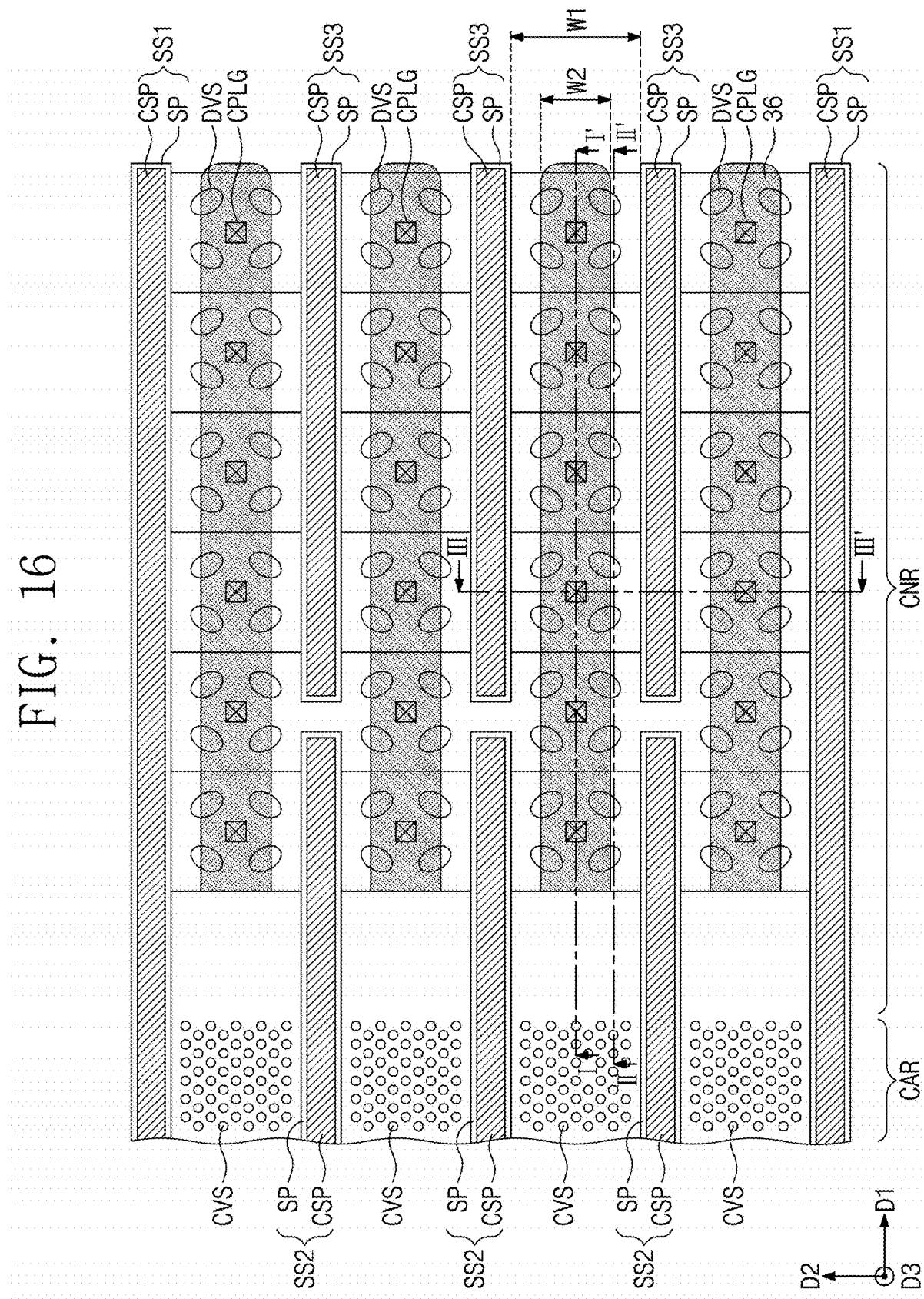
FIG. 16 illustrates a plan view showing a three-dimensional semiconductor memory device according to some example embodiments of the present inventive concepts.
Figure 17A:
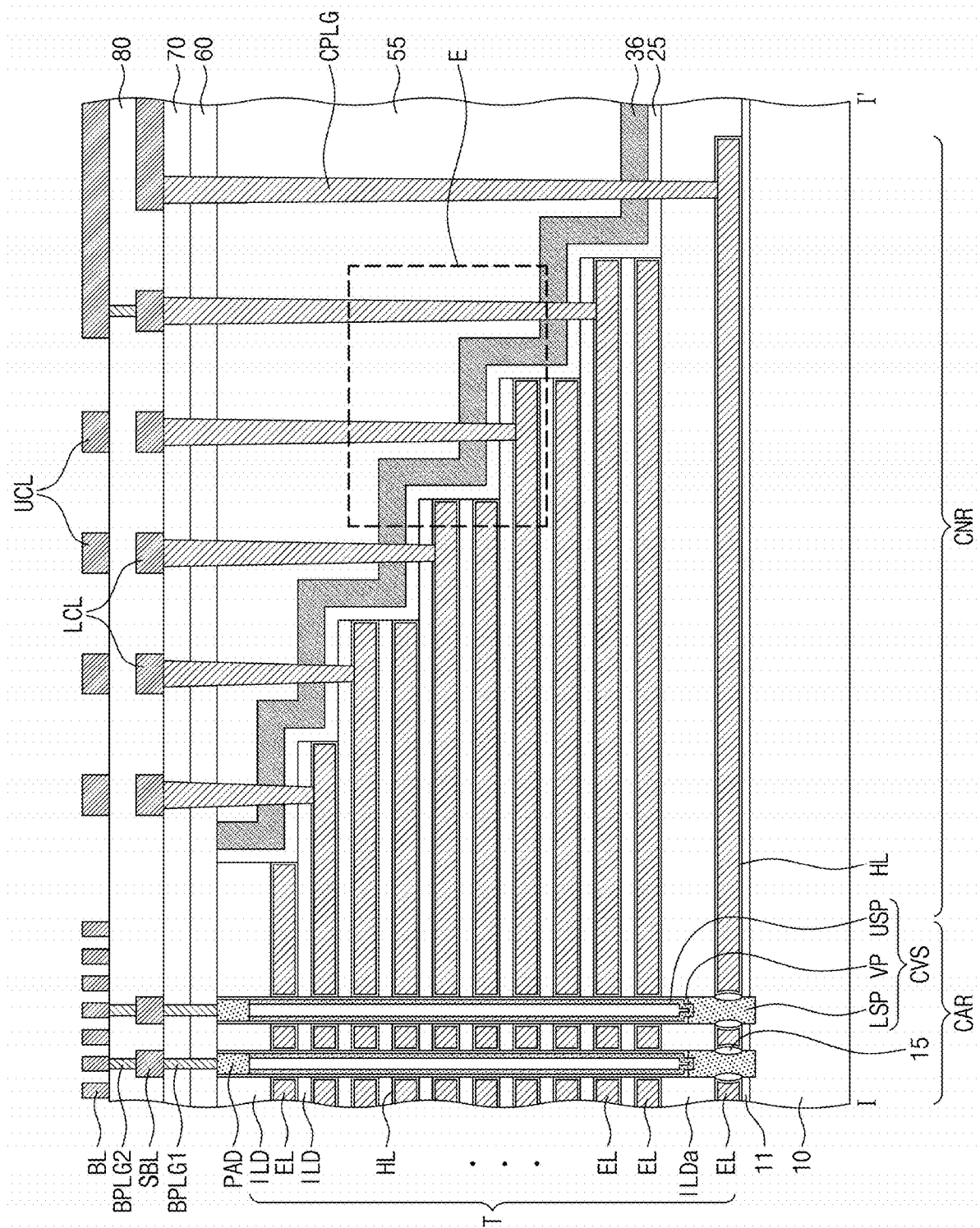
FIGS. 17A, 17B, and 17C illustrates cross-sectional views taken along lines I-I', II-II', and III-III' of FIG. 16, showing a three-dimensional semiconductor memory device according to some example embodiments of the present inventive concepts.
Figure 17B:
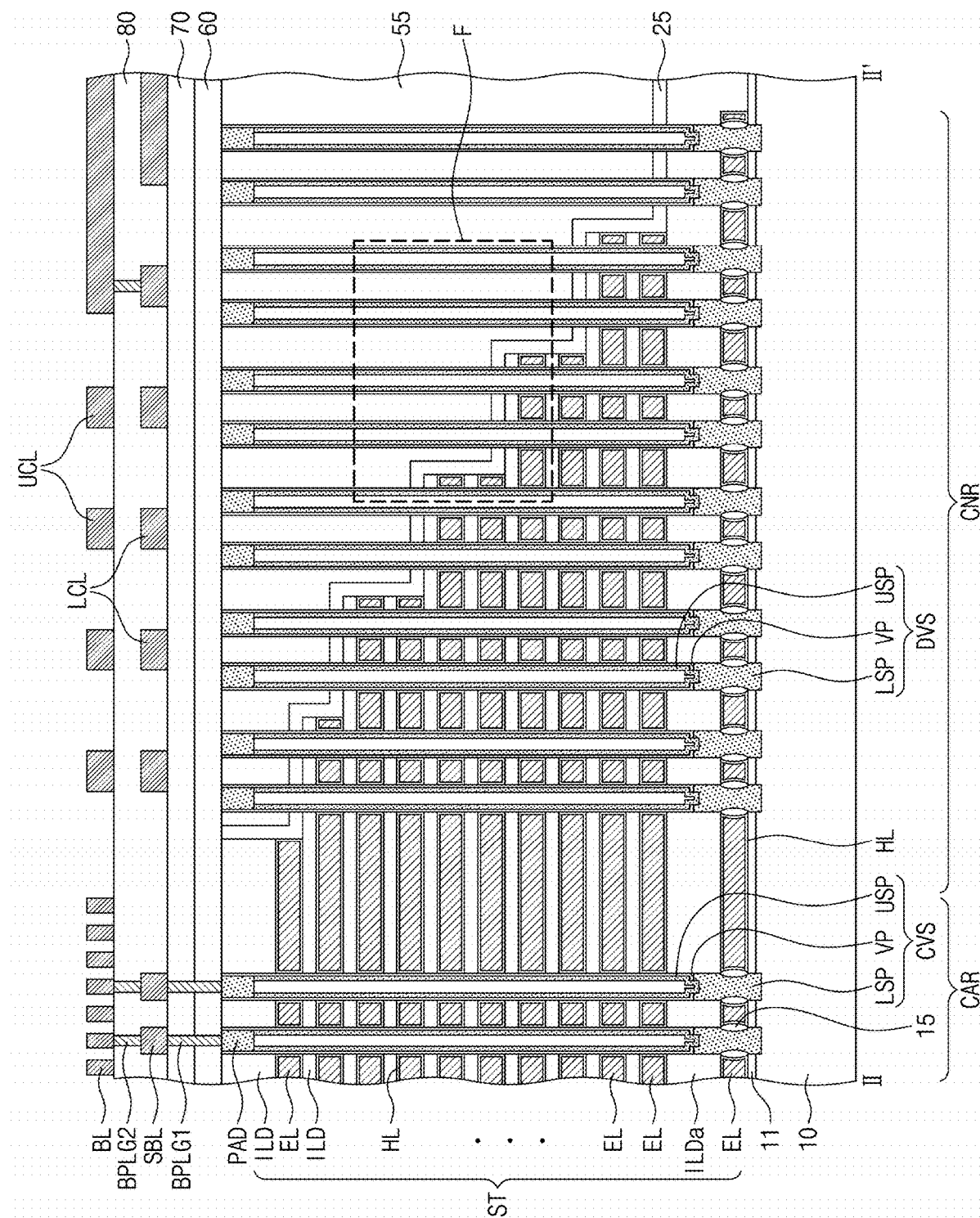
Figure 17C:
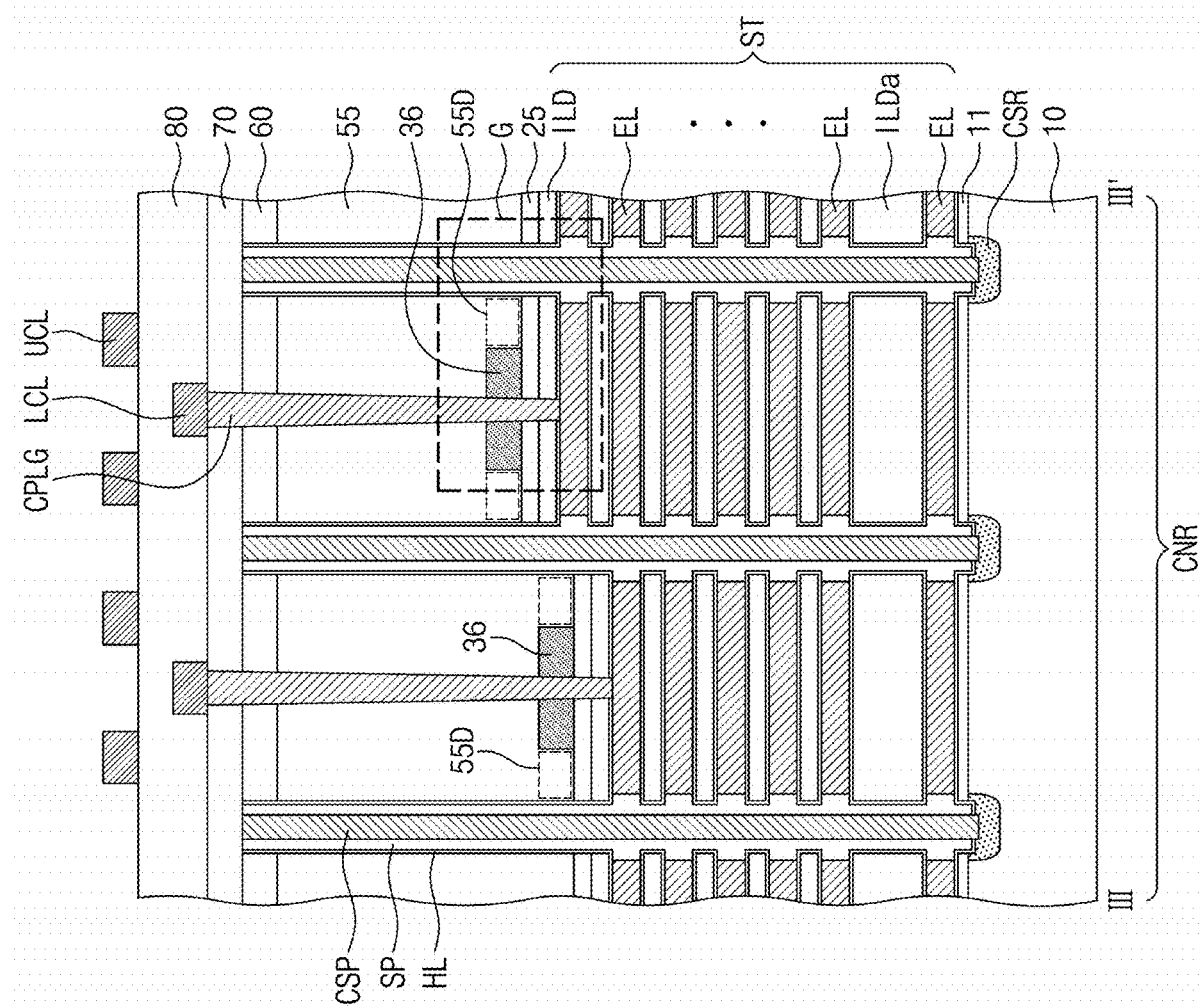
Figure 18A:
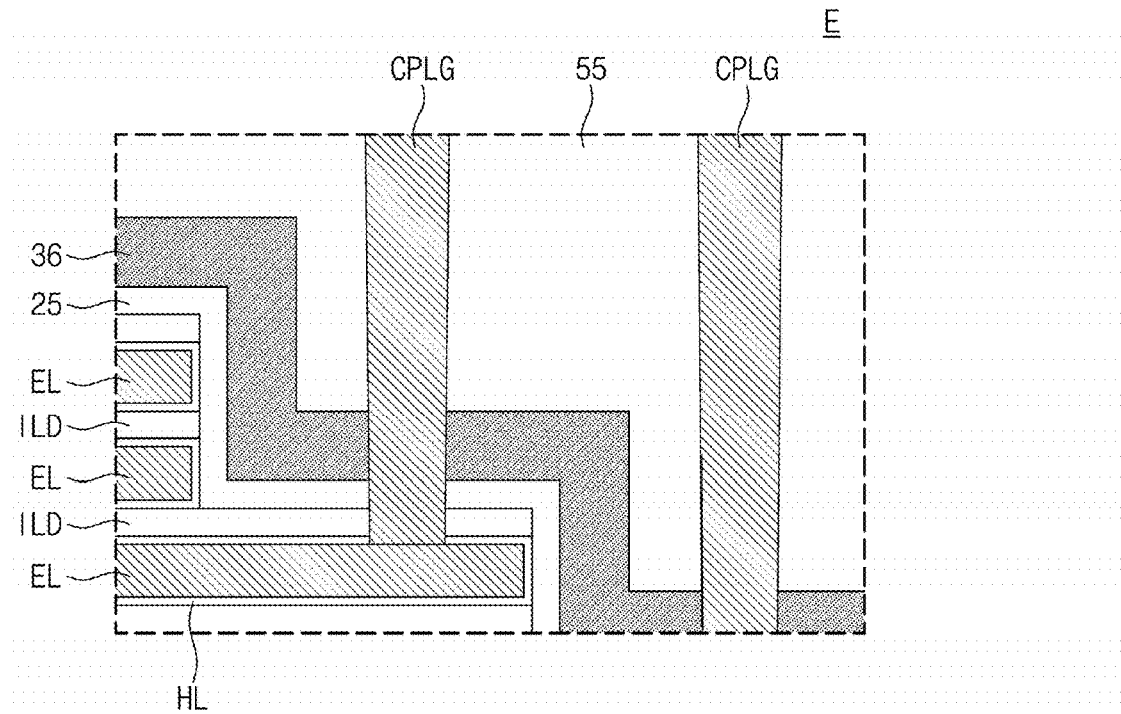
FIGS. 18A, 18B, 18C illustrate enlarged views respectively showing sections E, F, and G of FIGS. 17A, 17B, and 17C.
Figure 18B:
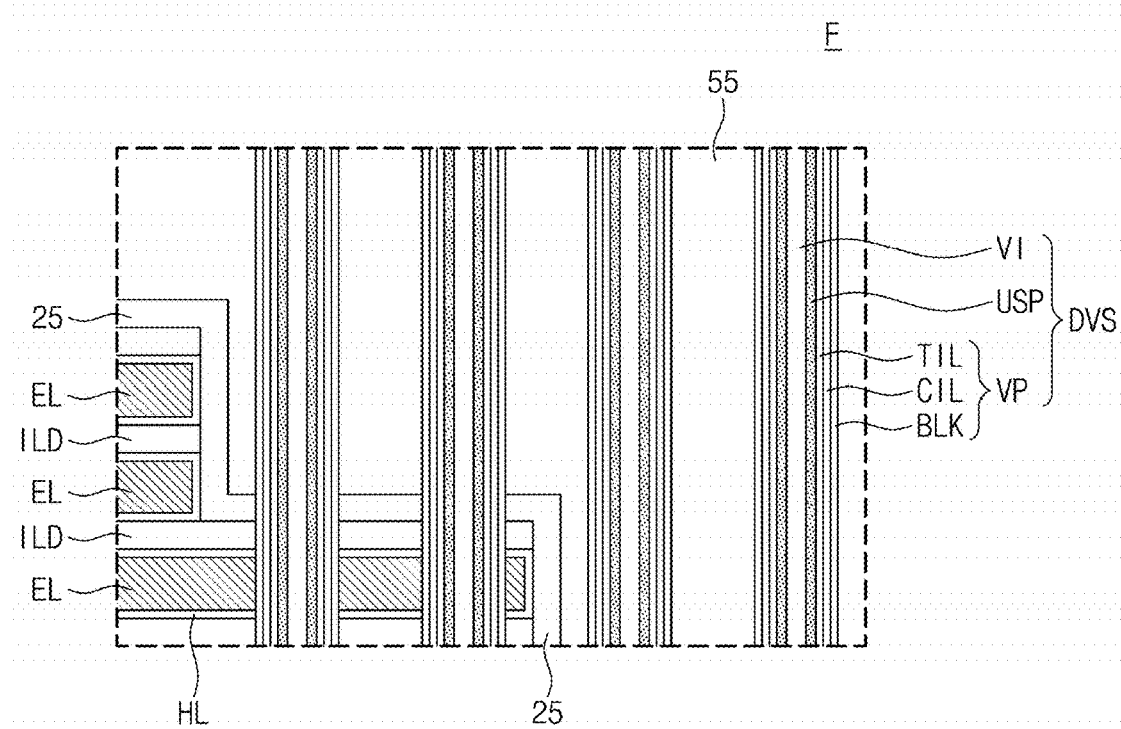
Figure 18C:
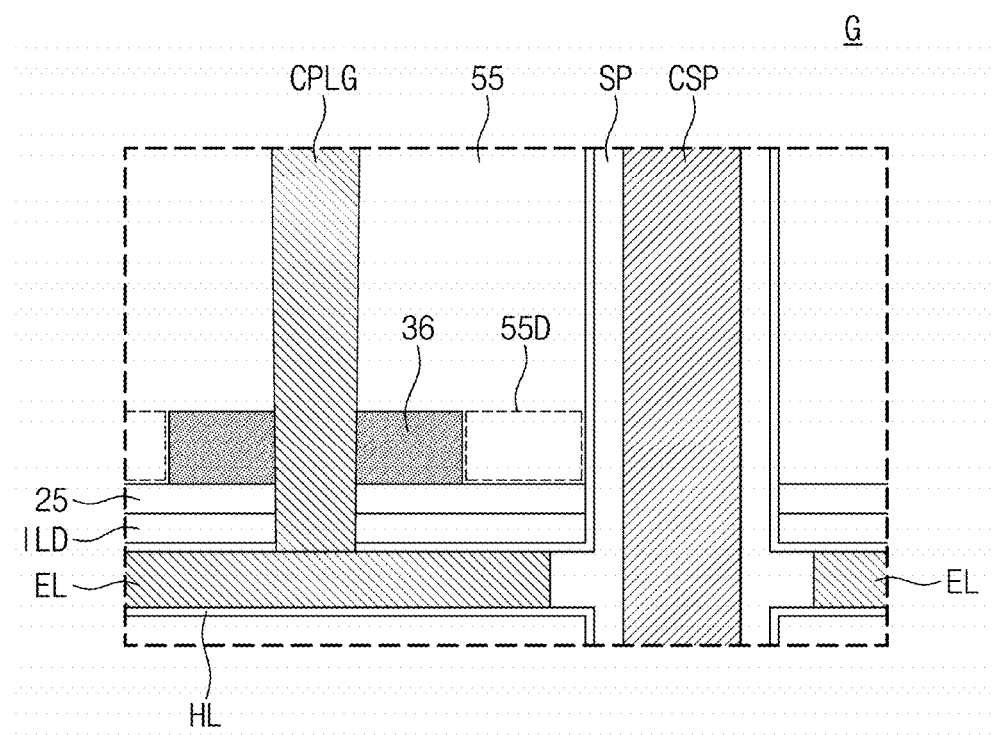

FIG. 16 illustrates a plan view showing a three-dimensional semiconductor memory device according to some example embodiments of the present inventive concepts. FIGS. 17A, 17B, and 17C illustrates cross-sectional views taken along lines I-I', II-II', and III-III' of FIG. 16, showing a three-dimensional semiconductor memory device according to some example embodiments of the present inventive concepts. FIGS. 18A, 18B, 18C illustrate enlarged views respectively showing sections E, F, and G of FIGS. 17A, 17B, and 17C.

A detailed description of technical features the same as those of the three-dimensional semiconductor memory device discussed above with reference to FIGS. 2A, 2B, 2C, and 2D may be omitted for brevity of explanation, and a difference thereof will be described.

On the connection region CNR, the electrode structure ST may have a stepwise structure and the pad dielectric pattern 25 may conformally cover the stepwise structure of the electrode structure ST.

The pad dielectric pattern 25 may be provided thereon with an etch stop pattern 36 conformally covering the stepwise structure of the electrode structure ST. When viewed in plan, the etch stop pattern 36 may extend along the first direction D1 and parallel to the electrode structure ST, and may be spaced apart in the second direction D2 from the first and third separation structures SS1 and SS3. The etch stop pattern 36 may have a second width W2 in the second direction D2, which second width W2 may be less than the first width W1 of the electrode structure ST. The etch stop pattern 36 may have a corner portion that is rounded when viewed in plan.

The etch stop pattern 36 may include a dielectric material having an etch selectivity with respect to the dielectric layers ILD of the electrode structure ST, the pad dielectric pattern 25, and the planarized buried dielectric layer 55. The etch stop pattern 36 discussed in this embodiment may include a dielectric material whose composition is different from that of a dielectric material included in the etch stop pattern 35 discussed above with reference to FIGS. 2A, 2B, 2C, and 2D.

In certain embodiments, on the pad dielectric pattern 25, the planarized buried dielectric layer 55 may cover the etch stop pattern 36. For example, the planarized buried dielectric layer 55 may include an etch stop region covering a top surface of the etch stop pattern 36 and dummy regions 55D covering opposing sidewalls of the etch stop pattern 36. The sidewalls of the etch stop pattern 36 may be covered with portions (or the dummy regions 55D) of the planarized buried dielectric layer 55 that are disposed on opposing sides of the etch stop pattern 36. The etch stop pattern 36 may be completely covered with the planarized buried dielectric layer 55 formed of a different dielectric material from that of the etch stop pattern 36. The dummy regions 55D may directly contact the pad dielectric pattern 25.

Referring to FIGS. 16 and 18B, when viewed in plan, the dummy vertical structures DVS may penetrate boundaries between the etch stop pattern 36 and the dummy regions 55D.

Referring to FIGS. 18A and 18C, the cell contact plugs CPLG may be horizontally spaced apart from the dummy vertical structures DVS and the first and third separation structures SS1 and SS3, and may penetrate the etch stop pattern 36 and the pad dielectric pattern 25.

Referring to FIG. 18C, the sidewall spacer SP may cover the sidewalls of the electrodes EL of the electrode structure ST, and may be horizontally spaced apart from the etch stop pattern 36. The horizontal dielectric layer HL may be spaced apart from the etch stop pattern 36.

Figure 19A:
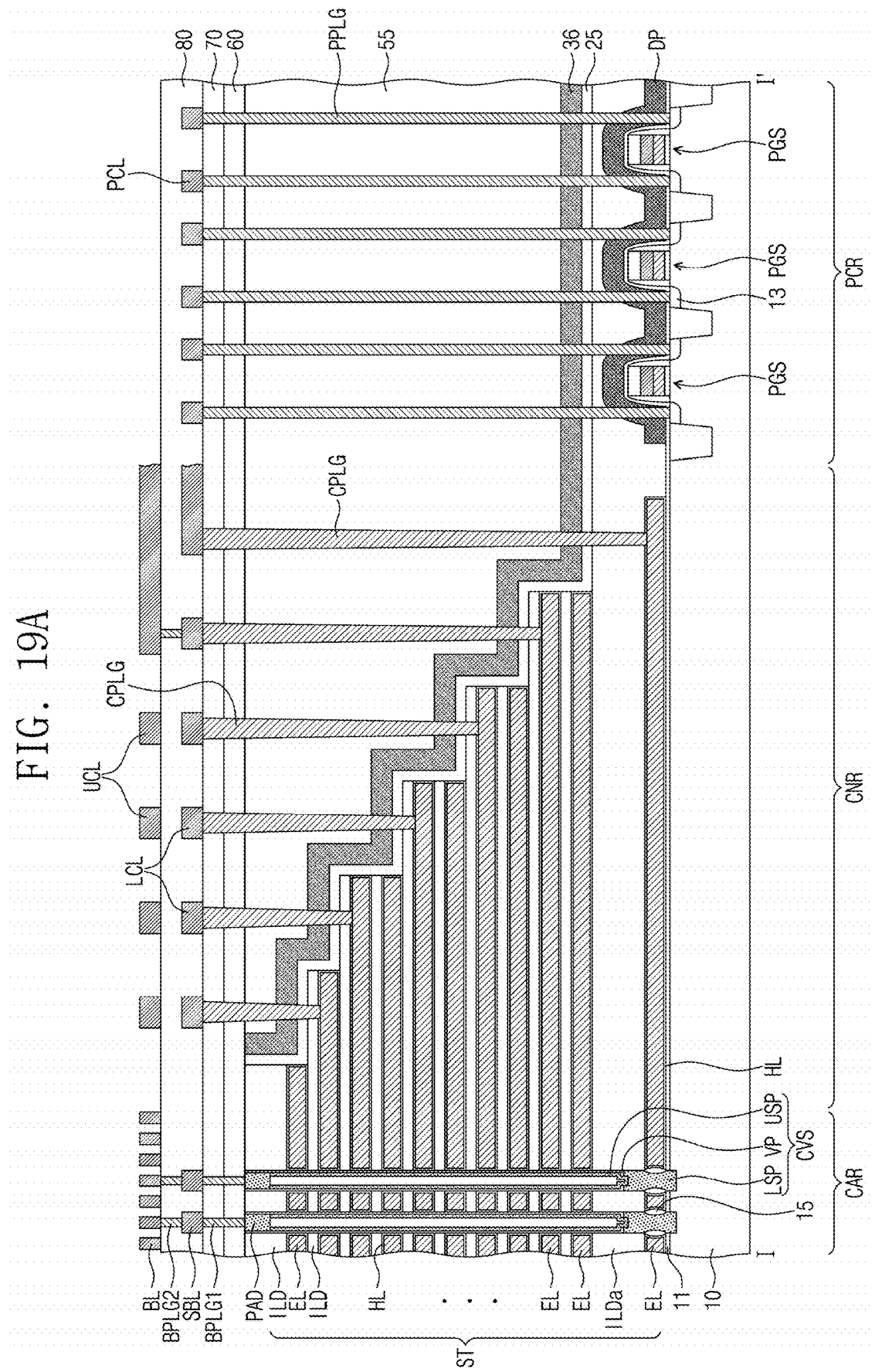
FIGS. 19A and 19B illustrate cross-sectional views showing a three-dimensional semiconductor memory device according to some example embodiments of the present inventive concepts.
Figure 19B:
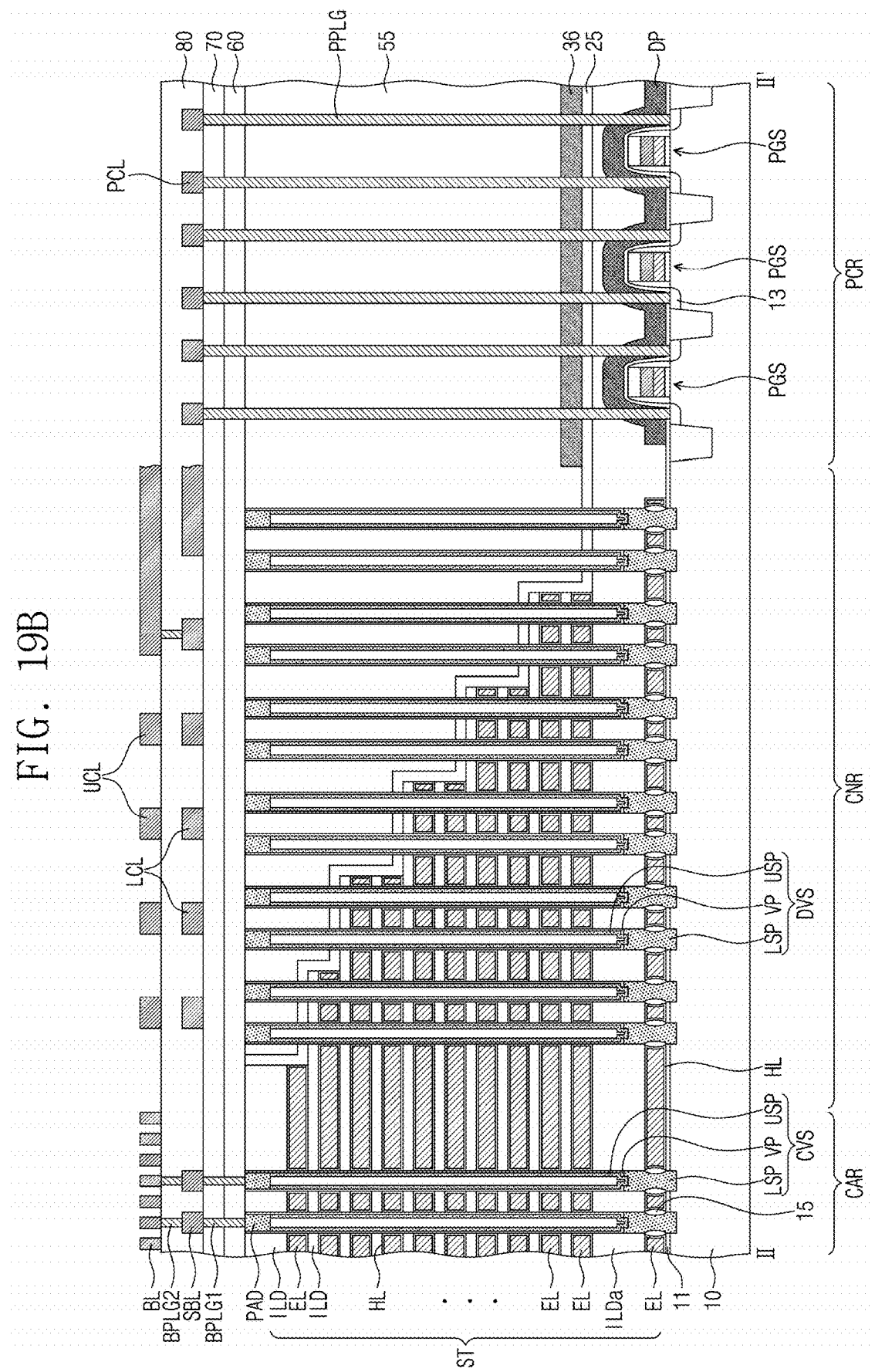
Figure 20A:
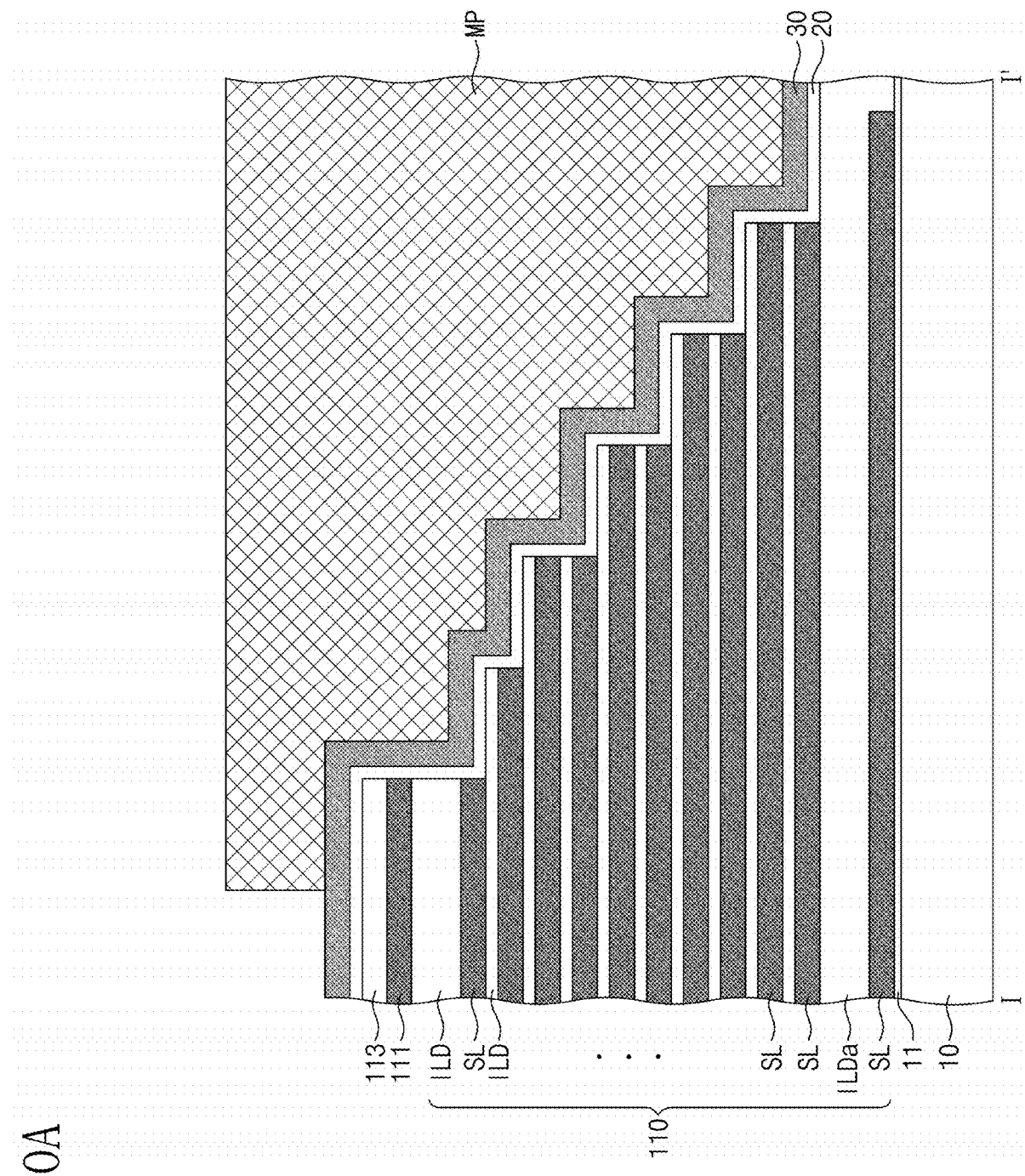
Figure 20B:
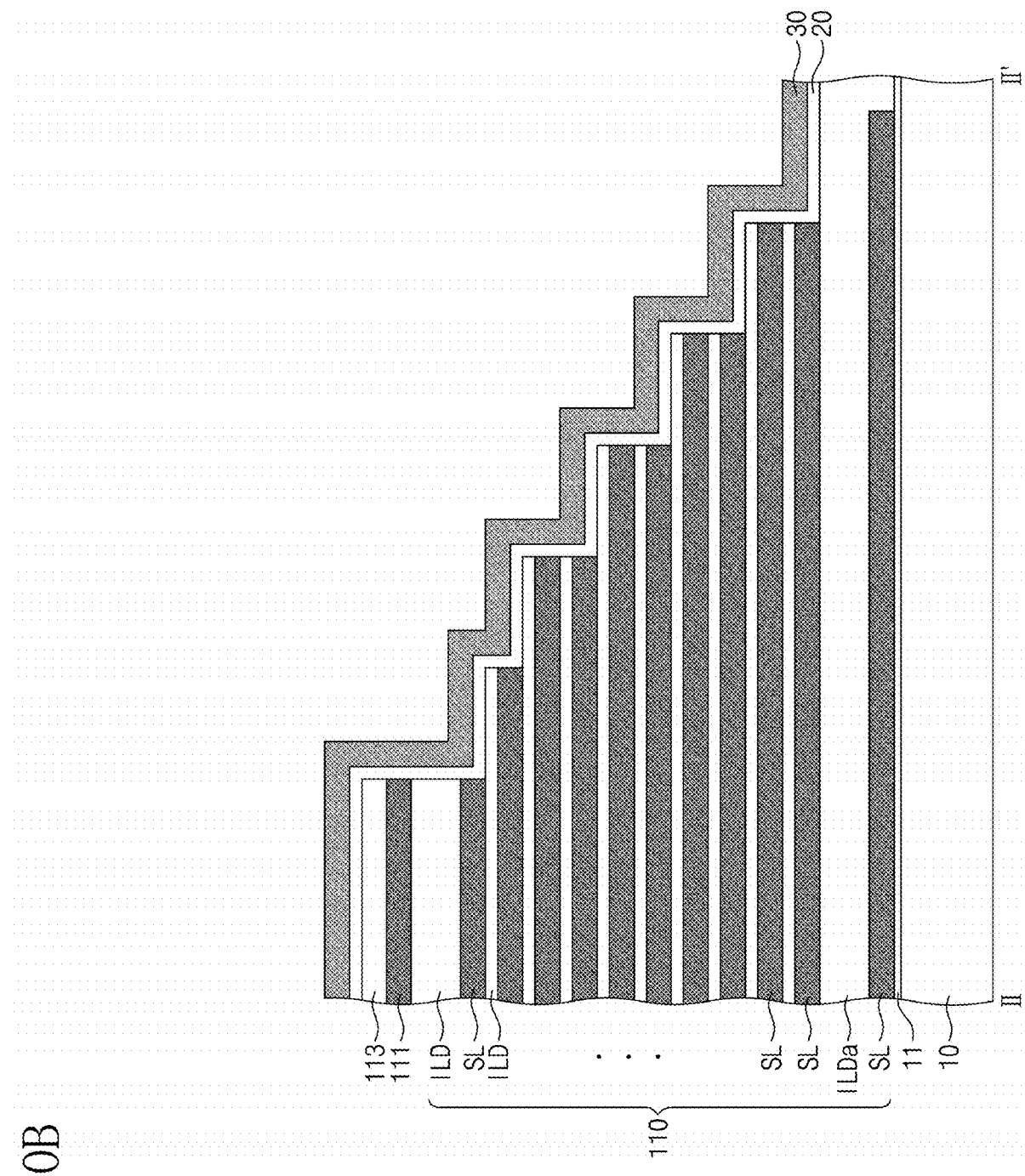
Figure 20C:
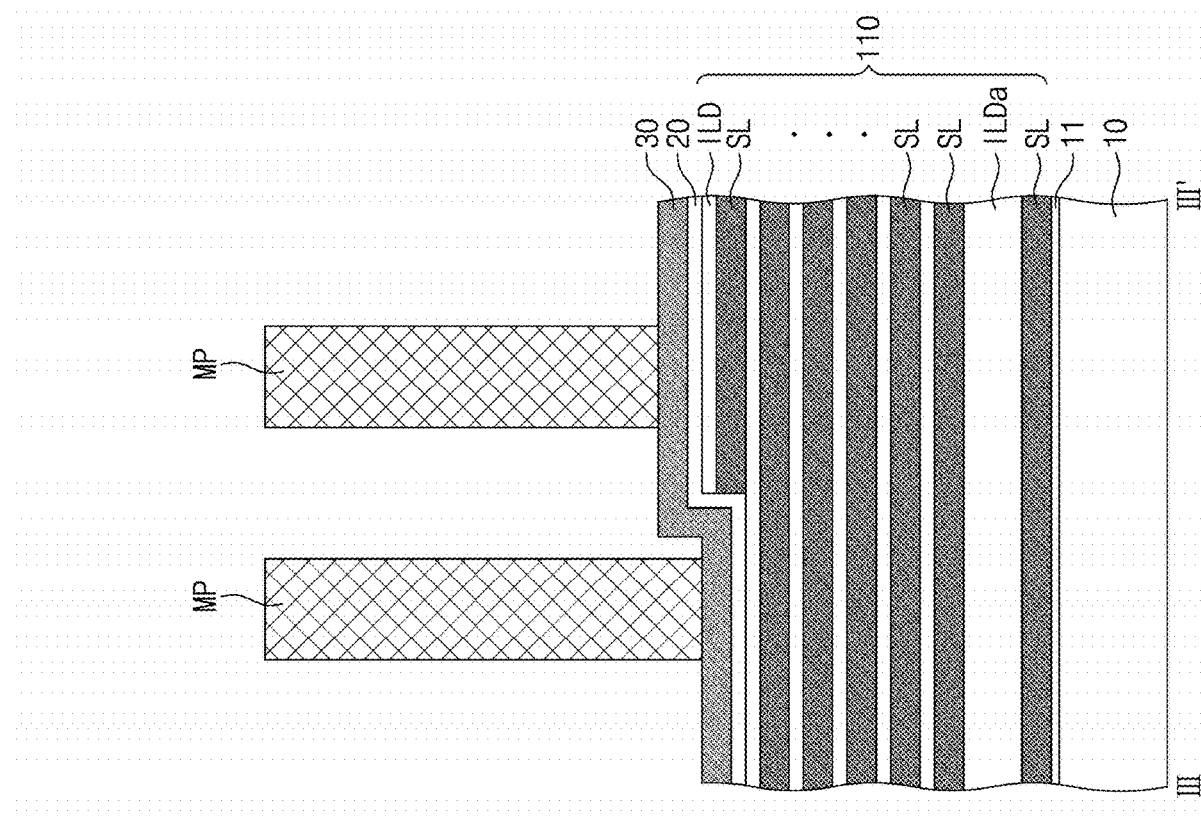
Figure 21A:
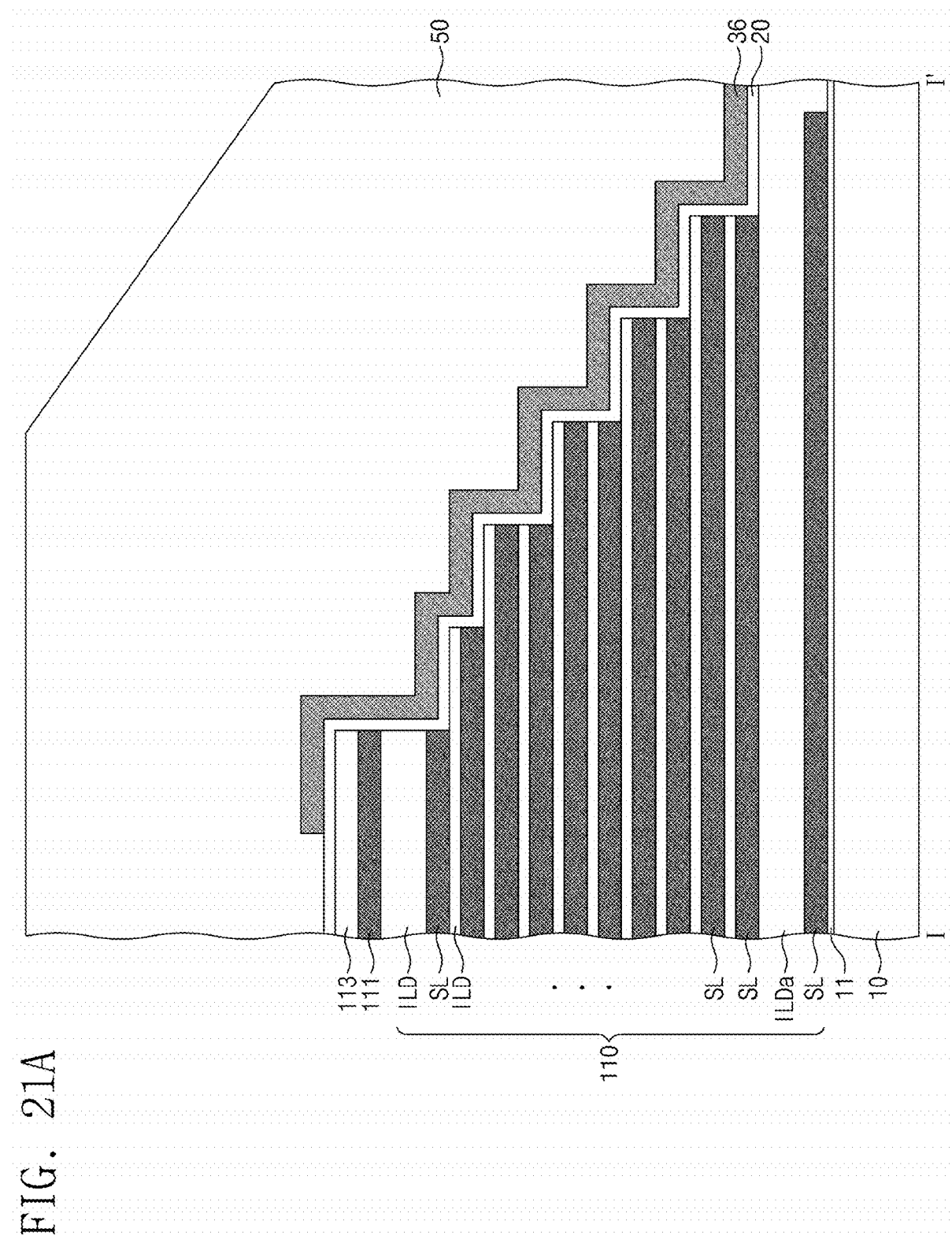
Figure 21B:
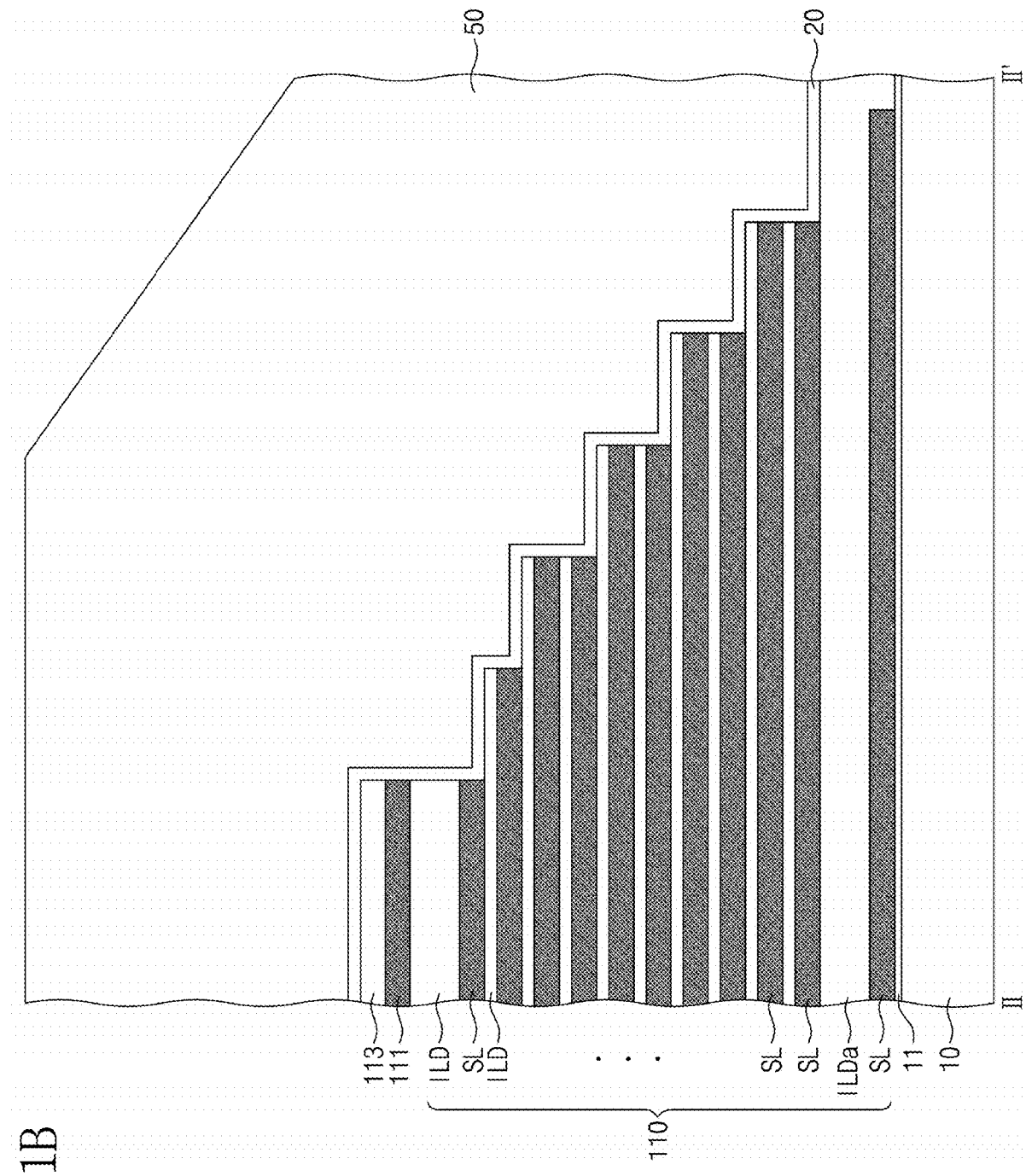
Figure 21C:
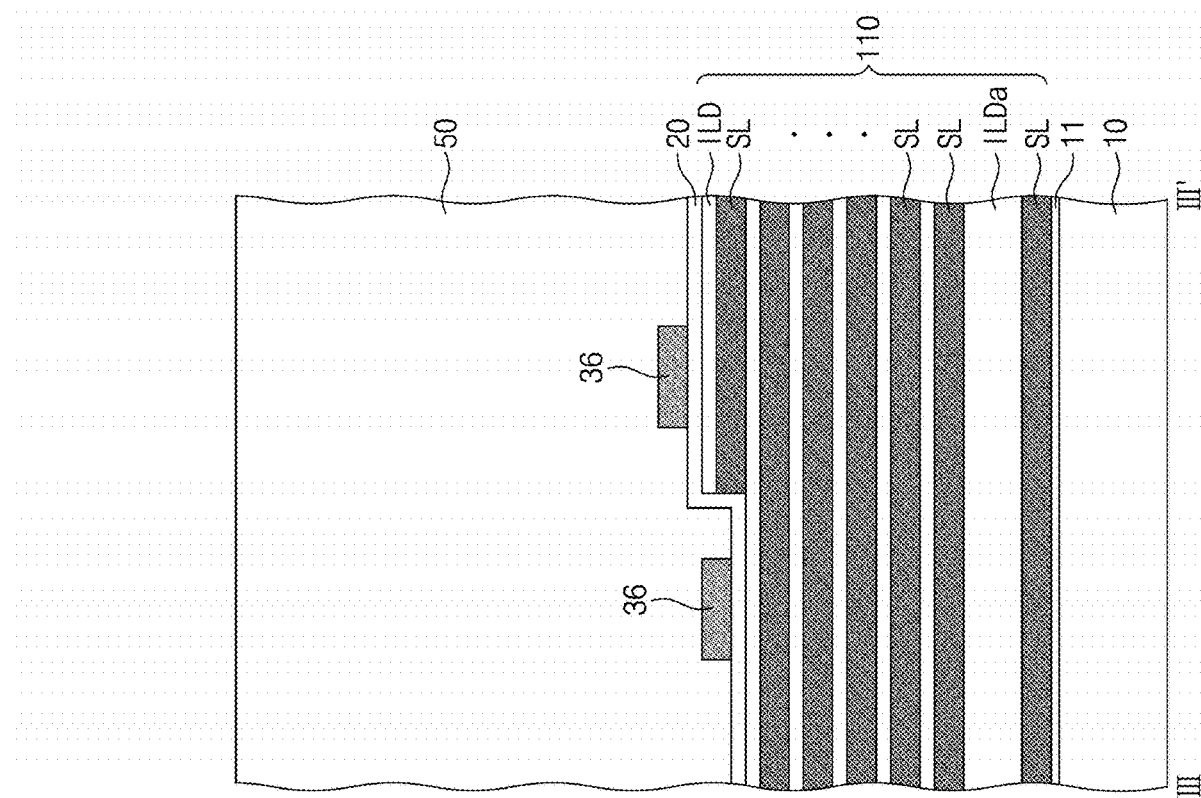
Figure 22A:
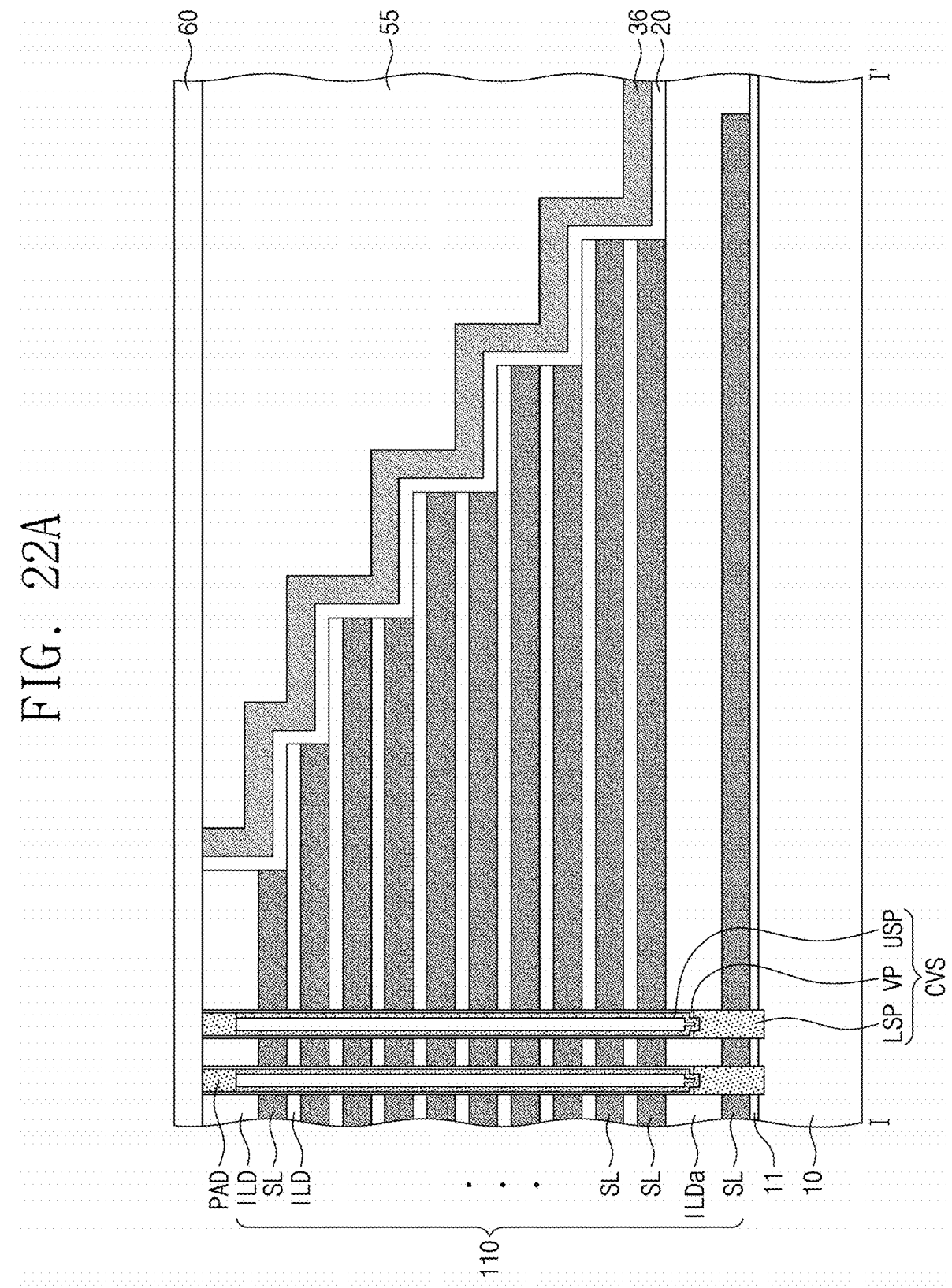
Figure 22B:
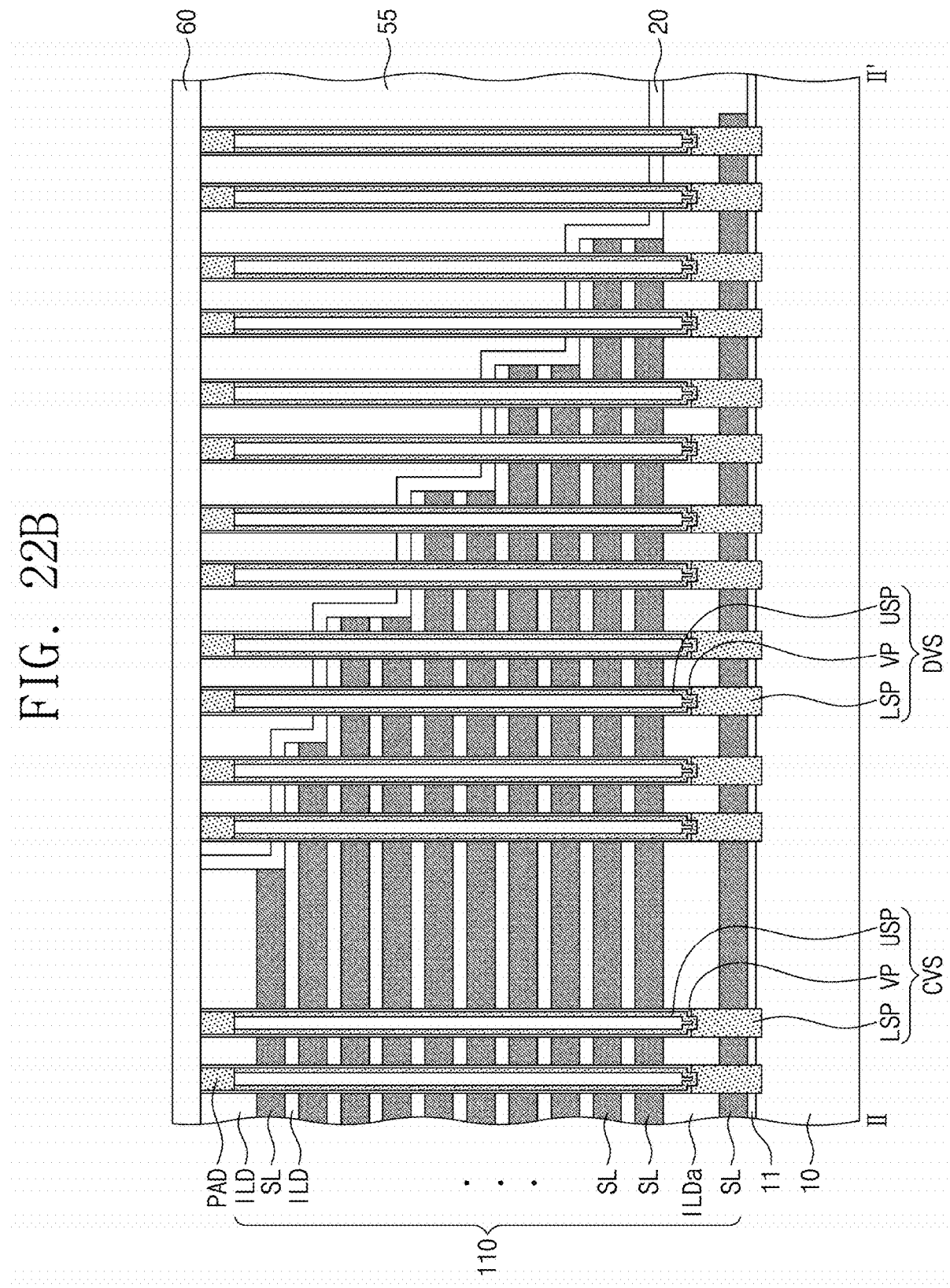
Figure 23B:
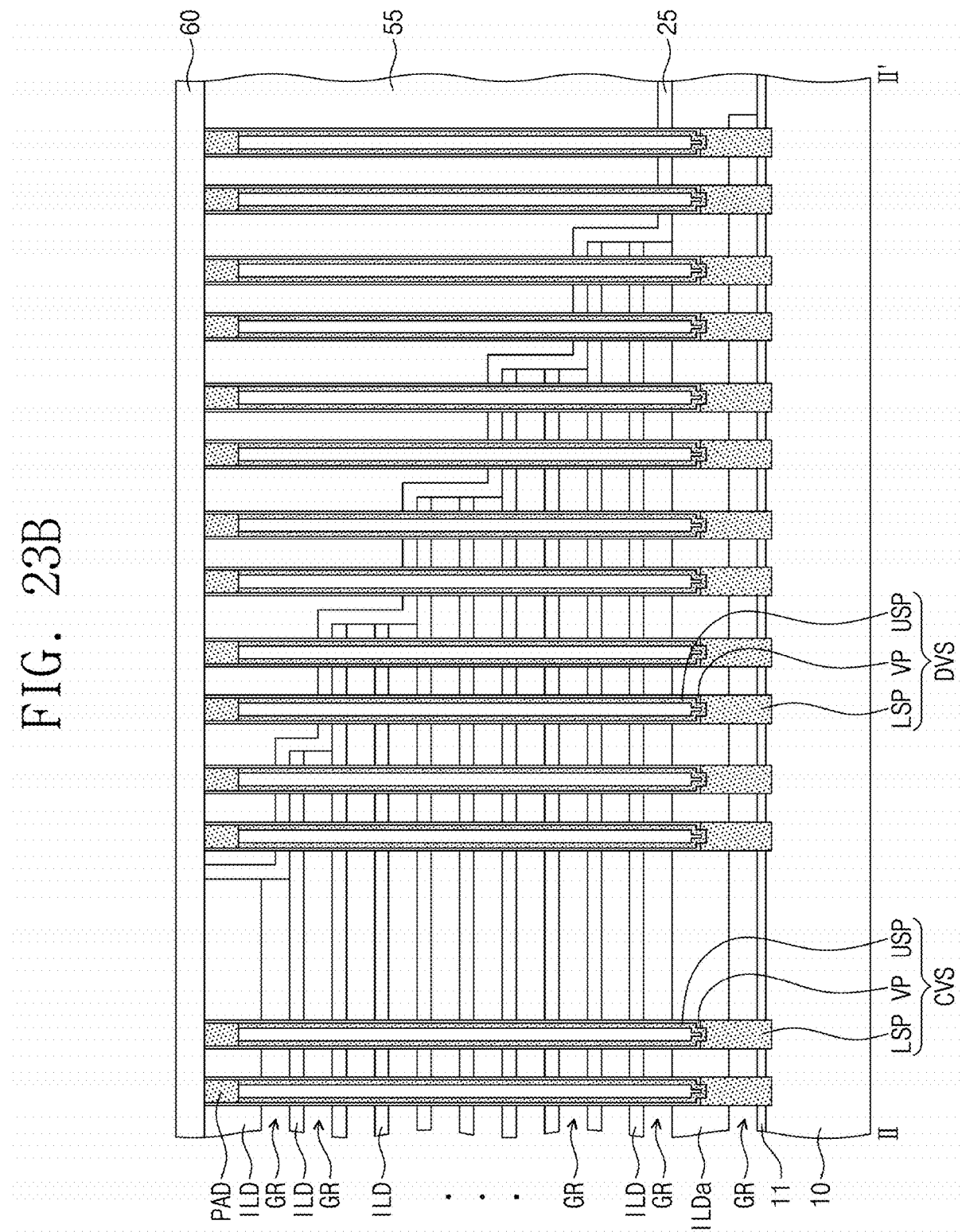
Figure 23C:
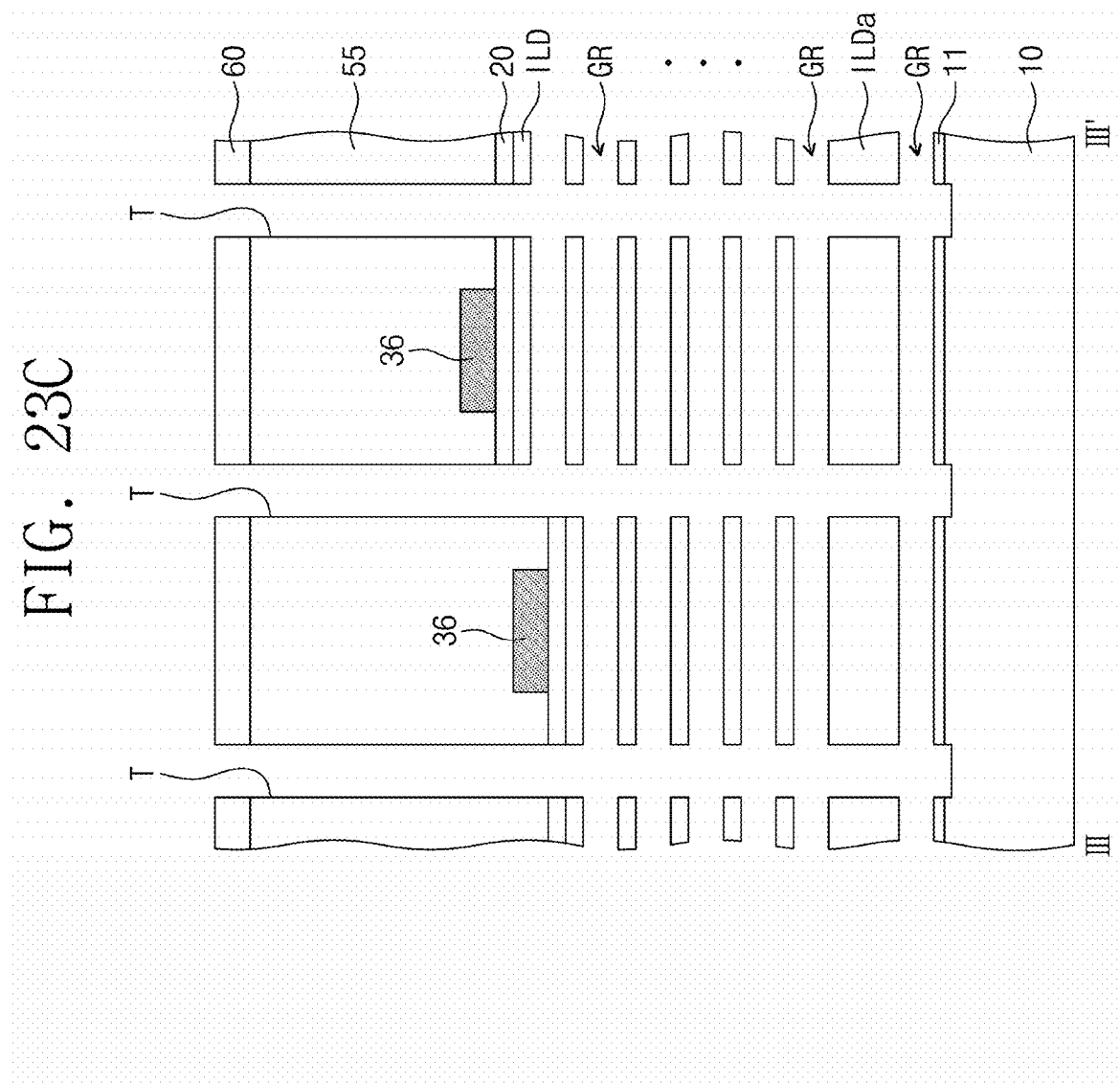
Figure 24A:
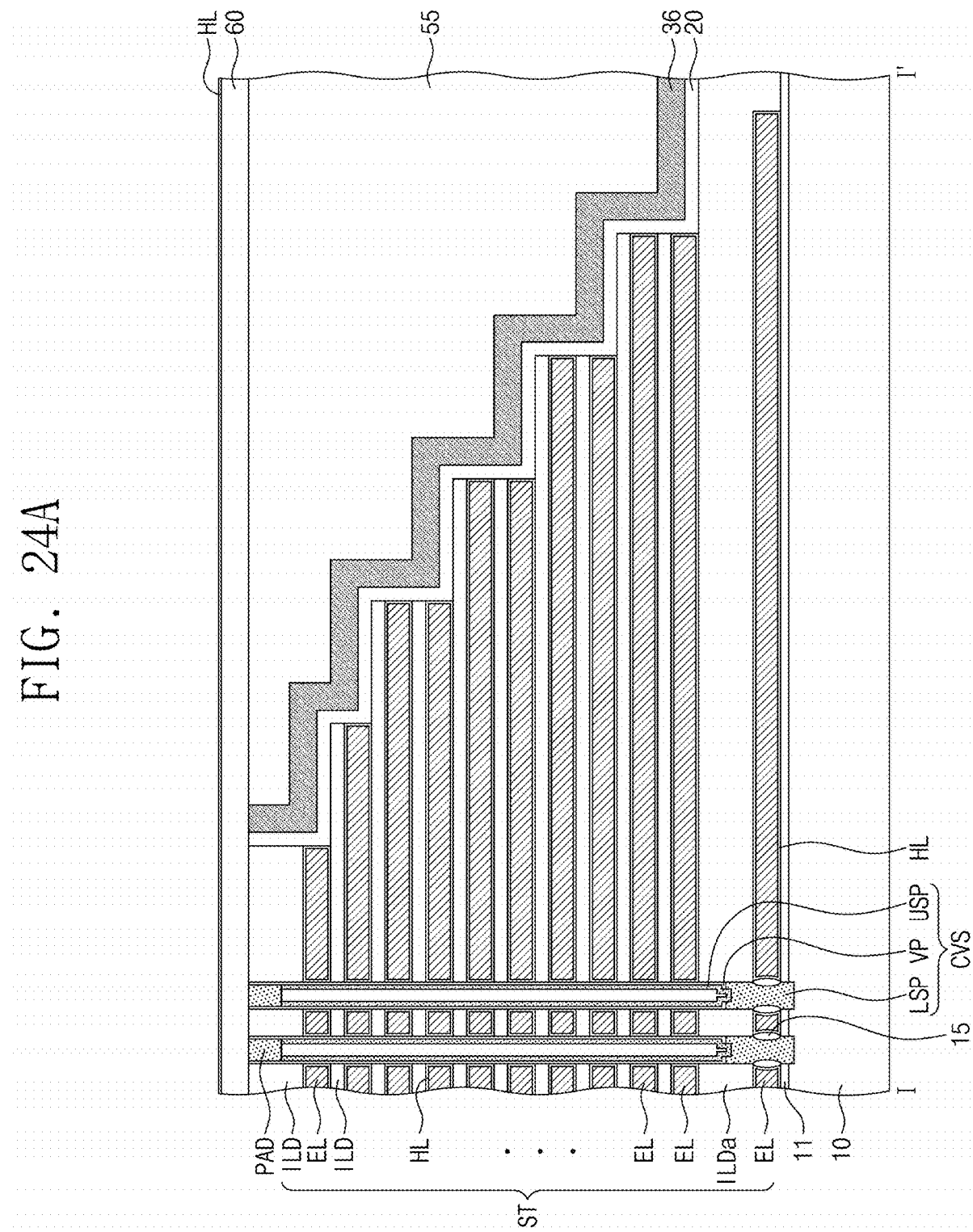
Figure 24B:
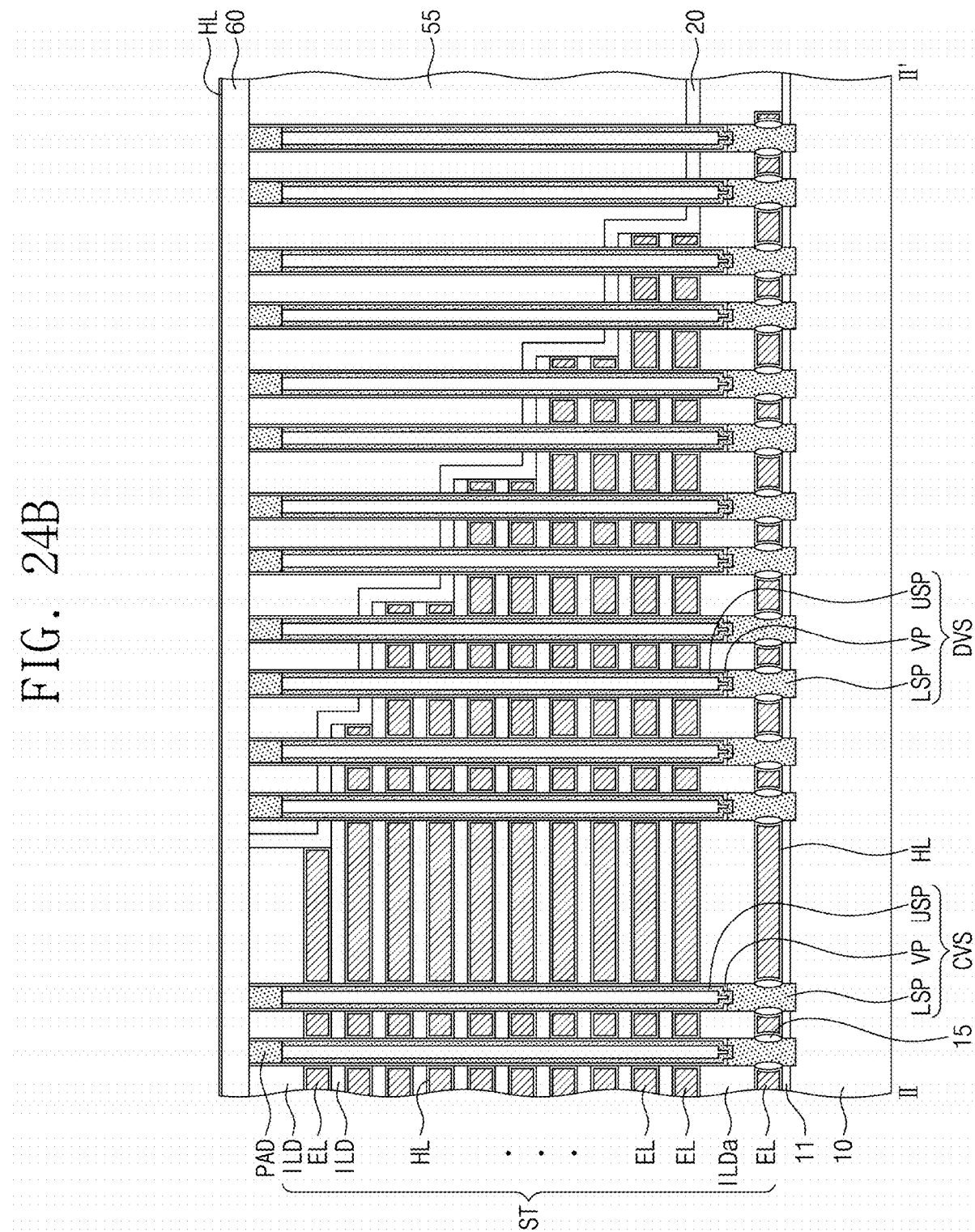
Figure 24C:
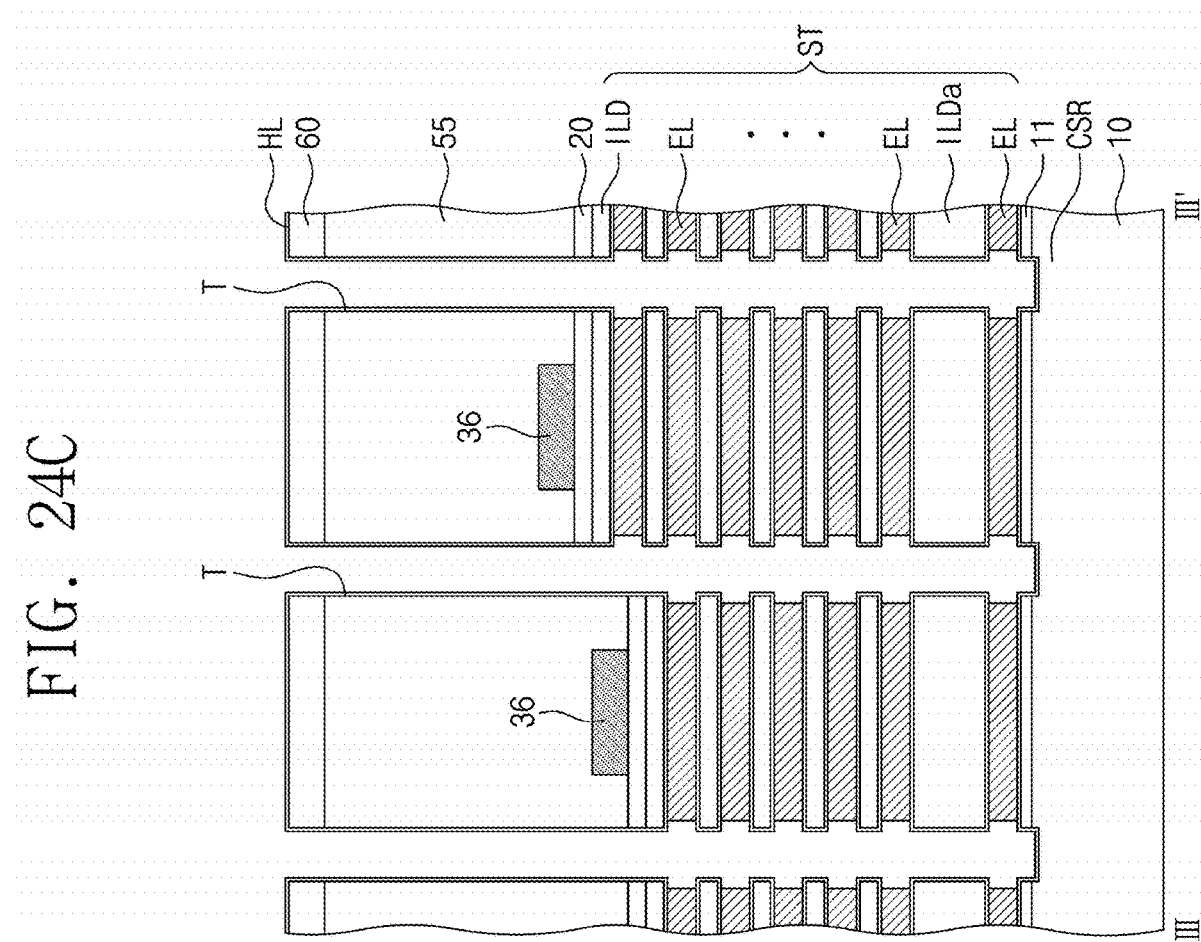
Figure 25A:
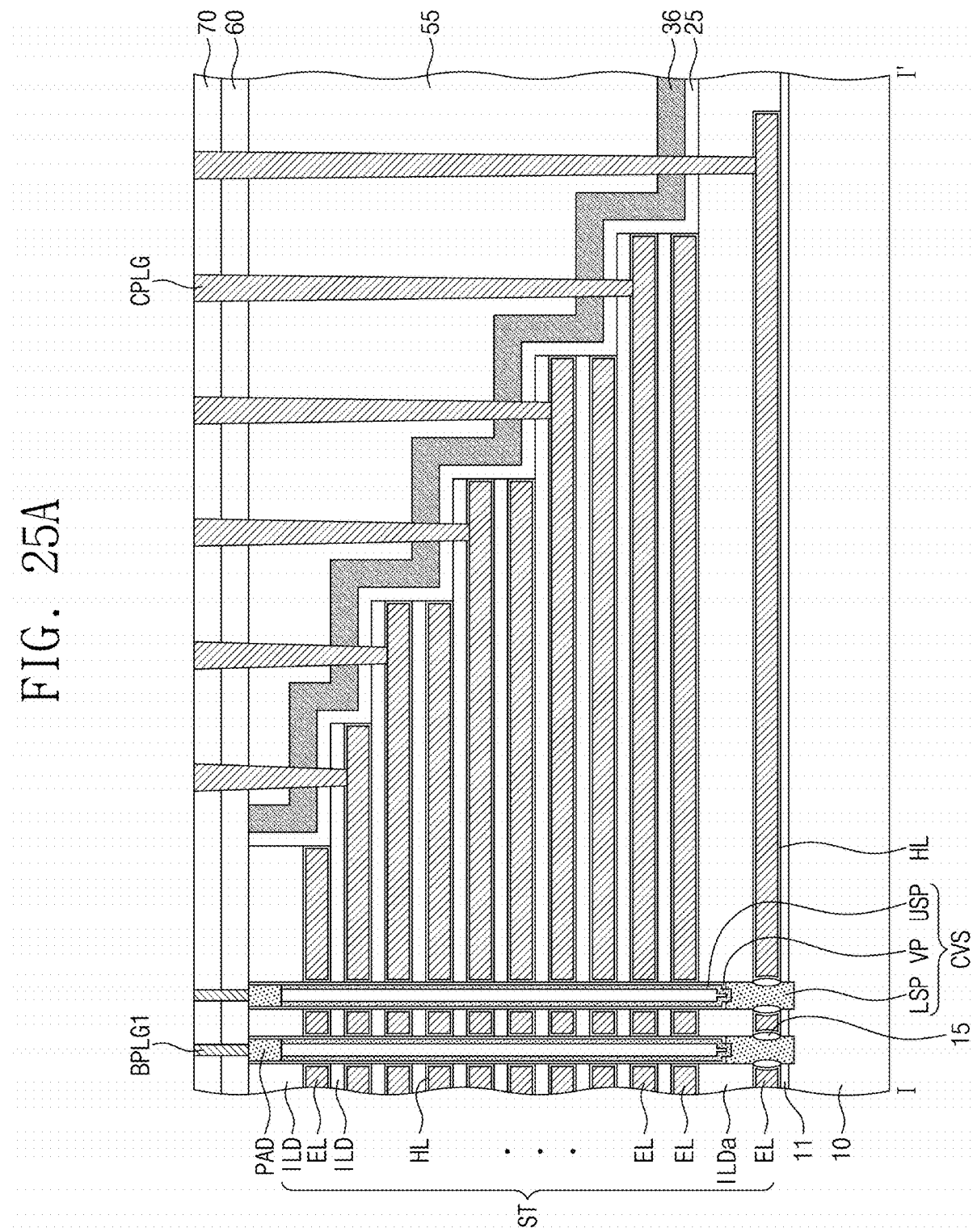
Figure 25B:
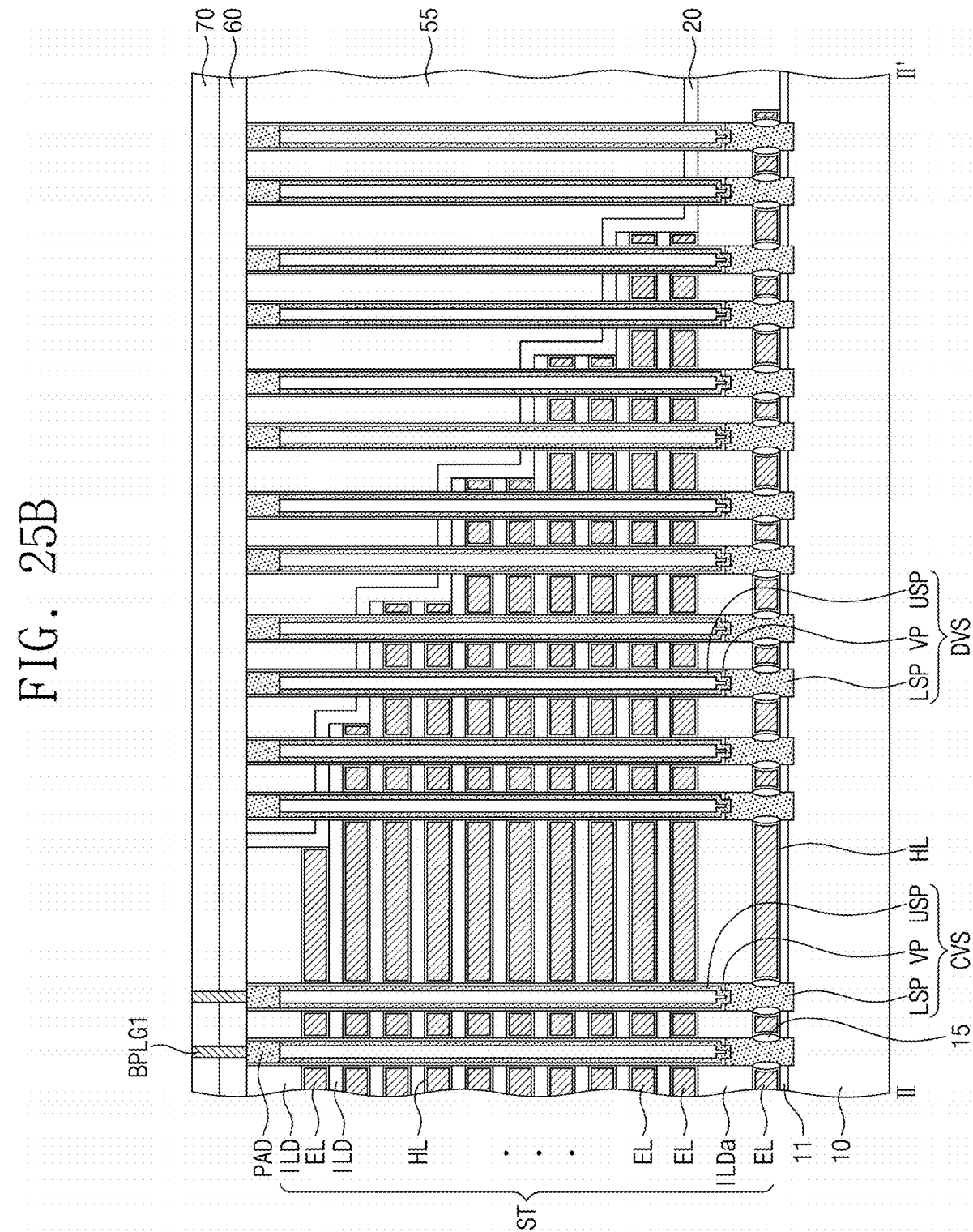
Figure 25C:
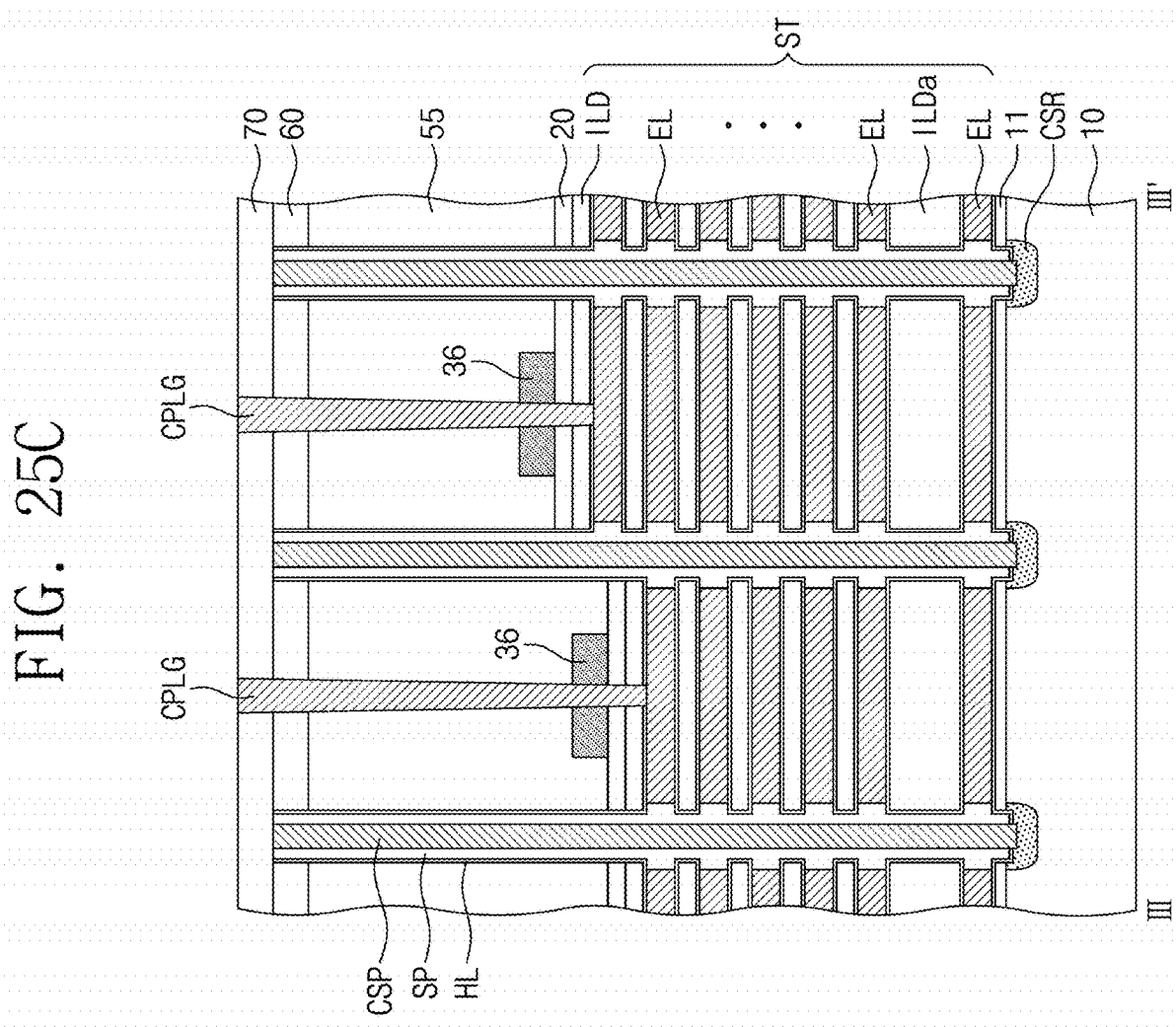

FIGS. 19A and 19B illustrate cross sectional views respectively taken along lines I-I' and II-II' of FIG. 16, showing a three-dimensional semiconductor memory device according to some example embodiments of the present inventive concepts. A detailed description of technical features the same as those of the three-dimensional semiconductor memory device discussed above with reference to FIGS. 6A and 6B may be omitted for brevity of explanation, and a difference thereof will be described.

Referring to FIGS. 16, 19A, and 19B, on the connection region CNR, the etch stop pattern 36 may have a second width W2 less than the first width W1 of the electrode structure ST. The etch stop pattern 36 may successively extend from the connection region CNR toward the peripheral circuit region PCR, completely covering the lower dielectric layer ILDa on the peripheral circuit region PCR. As shown in FIG. 19B, a portion of the planarized buried dielectric layer 55 may contact a portion of the etch stop pattern 36 on the peripheral circuit region PCR.

The etch stop pattern 36 shown in FIGS. 17A, 17B, and 17C may be changed in various shapes, as discussed above with reference to FIGS. 4A, 4B, 5A, 5B, 7A to 9A, and 7B to 9B.

FIGS. 20A to 25A, 20B to 25B, and 20C to 25C illustrate cross-sectional views taken along lines I-I', II-II', and III-III' of FIG. 16, showing a method of fabricating a three-dimensional semiconductor memory device according to some example embodiments of the present inventive concepts.

Referring to FIGS. 1A, 20A, 20B, and 20C, as discussed above with reference to FIGS. 11A and 11B, the mold structure 110 may be formed on the substrate 10, which mold structure 110 has a stepwise structure on the connection region CNR, and then the pad dielectric layer 20 and the etch stop layer 30 may be sequentially formed on the mold structure 110.

On the connection region CNR, mask patterns MP may be formed to cover portions of the etch stop layer 30. The mask patterns MP may have linear shapes extending in parallel along the first direction D1, and may be photoresist patterns.

Referring to FIGS. 1A, 21A, 21B, 21C, and 21D, the mask patterns MP may be used as an etching mask to anisotropically etch the etch stop layer 30 to form etch stop patterns 36 on the stepwise structure of the mold structure 110.

Because a patterning process is used to form the etch stop patterns 36, each of the etch stop patterns 36 may have a rounded corner when viewed in plan. Because the anisotropic etching process is employed to form the etch stop pattern 36, a top surface of the pad dielectric layer 20 may be recessed on opposing sides of the etch stop pattern 36.

After the etch stop patterns 36 are formed, as discussed with reference to FIGS. 11A and 11B, the buried dielectric layer 50 may be formed thick to cover the mold structure 110.

Referring to FIGS. 1A, 22A, 22B, and 22C, as discussed above with reference to FIGS. 12A, 12B, and 12C, the buried dielectric layer 50 may undergo a planarization process to form the planarized buried dielectric layer 55. The etch stop patterns 36 may be completely covered with the planarized buried dielectric layer 55. For example, the planarized buried dielectric layer 55 may fill spaces between the etch stop patterns 36.

After the planarization process, the planarized buried dielectric layer 55 may have a substantially flat top surface on the connection region CNR. During the formation of the planarized buried dielectric layer 55, the etch stop pattern 36 and the pad dielectric layer 20 may be partially removed on the cell array region CAR.

On the cell array region CAR, the cell vertical structures CVS may be formed to penetrate the mold structure 110, and on the connection region CNR, the dummy vertical structures DVS may be formed to penetrate the planarized buried dielectric layer 55, a portion of the etch stop pattern 36, and the mold structure 110.

The first interlayer dielectric layer 60 may be formed on the planarized buried dielectric layer 55, covering top surfaces of the cell and dummy vertical structures CVS and DVS. The first interlayer dielectric layer 60, the planarized buried dielectric layer 55, and the mold structure 110 may be patterned to form line-shaped trenches T. The trenches T may be formed spaced apart in the second direction D2 from the etch stop patterns 36. A distance between the trenches T adjacent in the second direction D2 may be greater than a width of the etch stop pattern 36. The formation of the trenches T may expose sidewalls of the sacrificial layers SL and a portion of the substrate 10, and the etch stop patterns 36 may not be exposed to the trenches T.

Referring to FIGS. 1A, 13A, 13B, and 13C, as discussed above with reference to FIGS. 13A, 13B, and 13C, the sacrificial layers SL exposed to the trenches T may be removed to form the gate regions GR between the dielectric layers ILD vertically adjacent to each other. The gate regions GR may be formed by isotropically etching the sacrificial layers SL, and when the sacrificial layers SL are isotropically etched, the planarized buried dielectric layer 55 may protect the etch stop patterns 36 from the isotropic etching process.

Referring to FIGS. 1A, 24A, 24B, and 24C, as discussed above with reference to FIGS. 13A, 13B, and 13C, the horizontal blocking dielectric layer HBLK and the electrodes EL may be formed in the gate regions GR. The horizontal blocking dielectric layer HBLK may conformally cover inner walls of the gate regions GR, and the electrodes EL may be locally formed in the gate regions GR.

The formation of the electrodes EL may allow the trenches T to expose the horizontal blocking dielectric layer HBLK deposited on sidewalls of the dielectric layers ILD. The electrodes EL may have their sidewalls that are recessed more than the sidewalls of the dielectric layers ILD.

Referring to FIGS. 1A, 25A, 25B, and 25C, the sidewall spacer SP may be formed in the trenches T, covering sidewalls of the electrode structure ST. The sidewall spacer SP may be spaced apart from the etch stop patterns 36.

The common source regions CSR may be formed in the substrate 10, and thereafter the common source plugs CSP may be formed in the trenches T. After the common source plugs CSP are formed, the second interlayer dielectric layer 70 may be formed, and on the connection region CNR, the cell contact plugs CPLG may be formed to connect with corresponding ends of the electrodes CNR. As discussed above, when the cell contact plugs CPLG are formed, the etch stop patterns 36 may reduce or prevent the ends of the electrodes EL from being completely etched.

Thereafter, as discussed with reference to FIGS. 17A, 17B, 17C, and 17D, the subsidiary bit lines SBL may be formed on the cell array region CAR, and the lower connection lines LCL may be formed on the connection region CNR. The third interlayer dielectric layer 80 may be formed on the second interlayer dielectric layer 70, and the bit lines BL and the upper connection lines UCL may be formed on the third interlayer dielectric layer 80.

According to some example embodiments of the present inventive concepts, in a method of fabricating a three-dimensional semiconductor memory device, an etch stop pattern may be formed to conformally cover a stepwise structure of an electrode structure, and thus without depending on an etch selectivity between a planarized buried dielectric layer and electrodes, it may be possible to simultaneously form contact plugs that are correspondingly coupled to the electrodes. In addition, when the contact plugs are simultaneously formed to connect with corresponding electrodes, it may be possible to reduce or prevent desirable connection of vertically adjacent electrodes.

Furthermore, because the etch stop pattern includes a dielectric material, when dummy vertical structures are formed on a connection region so as to penetrate the electrode structure, an etching process may be easily performed to form dummy vertical holes.

Although the present inventive concepts have been described in connection with some example embodiments illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A three-dimensional semiconductor memory device, comprising:
a substrate that includes a cell array region and a connection region;
an electrode structure that includes a plurality of electrodes and a plurality of dielectric layers alternately stacked on the substrate, the electrode structure having a stepwise structure on the connection region; and
an etch stop pattern that covers the stepwise structure of the electrode structure,
wherein the electrode structure and the etch stop pattern extend in a first direction when viewed in plan,
wherein the electrode structure has a first width in a second direction intersecting the first direction, and
wherein the etch stop pattern has a second width in the second direction, the second width being less than the first width.

2. The device of claim 1, wherein the etch stop pattern includes a dielectric material different from a dielectric material of the dielectric layers.

3. The device of claim 1, further comprising:
a plurality of common source plugs that extend in the first direction and penetrate the electrode structure; and
a plurality of sidewall spacers between the common source plugs and the electrode structure,
wherein the etch stop pattern is spaced apart in the second direction from the common source plugs.

4. The device of claim 3, wherein
sidewalls of the electrodes are spaced apart at a first horizontal distance from a sidewall of the common source plugs, and
a sidewall of the etch stop pattern is spaced apart at a second horizontal distance from the sidewall of the common source plugs, the second horizontal distance being greater than the first horizontal distance.

5. The device of claim 3, further comprising a dummy conductive pattern between the etch stop pattern and the sidewall spacers.

6. The device of claim 1, wherein the etch stop pattern has opposing rounded sidewalls.

7. The device of claim 1, further comprising:
a plurality of vertical structures that penetrate the electrode structure;
a horizontal blocking dielectric layer that covers sidewalls of the electrodes adjacent to the vertical structures and top and bottom surfaces of the electrodes; and
a horizontal dielectric layer that includes a material the same as a material of the horizontal blocking dielectric layer and covers a sidewall of the etch stop pattern.

8. The device of claim 1, further comprising a plurality of contact plugs on the connection region, the contact plugs penetrating the etch stop pattern and connect with corresponding ends of the electrodes,
wherein a diameter of each of the contact plugs is less than the second width.

9. The device of claim 1, wherein the etch stop pattern includes:
a lower segment at a first level from a top surface of the substrate; and
an upper segment at a second level from the top surface of the substrate, the second level being higher than the first level,
wherein a width of the upper segment is different from a width of the lower segment.

10. A three-dimensional semiconductor memory device, comprising:
a substrate that includes a cell array region and a connection region;
a plurality of separation structures that extend in a first direction on the substrate and are spaced apart from each other in a second direction;
an electrode structure between the separation structures and includes a plurality of electrodes and a plurality of dielectric layers alternately stacked on the substrate, the electrode structure having a stepwise structure along the first direction on the connection region;
an etch stop pattern that covers the stepwise structure of the electrode structure and includes a dielectric material different from a dielectric material of the dielectric layers; and
a dummy pattern on opposing sides of the etch stop pattern, the dummy pattern covering the stepwise structure of the electrode structure and including a material different from a material of the etch stop pattern.

11. The device of claim 10, wherein, when viewed in plan, the etch stop pattern and the dummy pattern extend along the first direction.

12. The device of claim 10, wherein the dummy pattern includes a conductive material the same as a conductive material of the plurality of electrodes.

13. The device of claim 10, wherein the dummy pattern includes a dielectric material and covers a top surface and opposing sidewalls of the etch stop pattern.

14. The device of claim 10, wherein the separation structures vertically extend on a sidewall of the electrode structure and cover a sidewall of the dummy pattern.

15. The device of claim 10, wherein each of the plurality of separation structures includes:
   a common source plug that extends in the first direction; and
   a sidewall spacer between the common source plug and the electrode structure and between the common source plug and the dummy pattern,
   wherein a first horizontal distance between the common source plug and the etch stop pattern is greater than a second horizontal distance between the common source plug and the plurality of electrodes.

16. The device of claim 10, further comprising a plurality of contact plugs that penetrate the etch stop pattern and connect with corresponding ends of the plurality of electrodes,
   wherein the plurality of contact plugs are horizontally spaced apart from the dummy pattern.

17. The device of claim 10, further comprising a pad dielectric pattern between the etch stop pattern and the electrode structure and between the dummy pattern and the electrode structure,
   wherein the pad dielectric pattern includes a material different from a material of the etch stop pattern.

18. The device of claim 10, further comprising:
   a plurality of vertical structures that penetrate the electrode structure;
   a horizontal blocking dielectric layer that covers first sidewalls of the electrodes adjacent to the vertical structures and top and bottom surfaces of the electrodes; and
   a horizontal dielectric layer that includes a material the same as a material of the horizontal blocking dielectric layer and lies between the etch stop pattern and the dummy pattern.

19. The device of claim 10, further comprising:
   a plurality of vertical structures that penetrate the electrode structure;
   a horizontal blocking dielectric layer that covers first sidewalls of the electrodes adjacent to the vertical structures and top and bottom surfaces of the electrodes; and
   a horizontal dielectric layer that includes a material the same as a material of the horizontal blocking dielectric layer and lies between the separation structures and a sidewall of the dummy pattern.

20. A three-dimensional semiconductor memory device, comprising:
   a substrate that includes a cell array region and a connection region;
   an electrode structure that includes a plurality of electrodes and a plurality of dielectric layers alternately stacked on the substrate, the electrode structure having a stepwise structure on the connection region;
   an etch stop structure that covers the stepwise structure, the etch stop structure including an etch stop pattern including a dielectric material different from a dielectric material of the dielectric layers and a dummy region on opposing sides of the etch stop pattern, the dummy region including a material different from a material of the etch stop pattern;
   a plurality of dummy vertical structures on the connection region and that penetrate the dummy region and the electrode structure; and
   a plurality of contact plugs on the connection region, the contact plugs penetrating the etch stop pattern and connecting with corresponding ends of the plurality of electrodes.

* * * * *